United States Patent [19]

Nakamura et al.

[11] Patent Number: 5,610,859
[45] Date of Patent: Mar. 11, 1997

[54] SEMICONDUCTOR MEMORY DEVICE

[75] Inventors: Hiroshi Nakamura, Kawasaki; Junichi Miyamoto; Yoshihisa Iwata, both of Yokohama; Keniti Imamiya, Kawasaki, all of Japan

[73] Assignee: Kabushiki Kaisha Toshiba, Kawasaki, Japan

[21] Appl. No.: 404,572

[22] Filed: Mar. 15, 1995

[30] Foreign Application Priority Data

Mar. 15, 1994 [JP] Japan ................................. 6-044446
Aug. 19, 1994 [JP] Japan ................................. 6-218030

[51] Int. Cl.$^6$ ................................. G11C 11/34
[52] U.S. Cl. .............. 365/185.22; 365/189.05; 365/189.07
[58] Field of Search ................ 365/189.05, 189.07, 365/185.22, 185.21

[56] References Cited

U.S. PATENT DOCUMENTS

| | | | |
|---|---|---|---|
| 5,172,338 | 12/1992 | Mehrotra et al. | 365/185.03 |
| 5,357,462 | 10/1994 | Tanaka et al. | 365/189.05 |
| 5,418,737 | 5/1995 | Tran | 365/189.05 |

FOREIGN PATENT DOCUMENTS

| | | |
|---|---|---|
| 62-188100 | 8/1987 | Japan . |
| 5-144277 | 6/1993 | Japan . |
| 6-76586 | 3/1994 | Japan . |
| 2029145 | 3/1980 | United Kingdom . |

*Primary Examiner*—A. Zarabian
*Attorney, Agent, or Firm*—Oblon, Spivak, McClelland, Maier & Neustadt, P.C.

[57] ABSTRACT

A semiconductor memory device according to the invention comprises a semiconductor substrate, a memory cell array having memory cells, each of which stores data, formed in matrix on the semiconductor substrate, a plurality of data latch circuits, each of which is arranged a one end of at least one bit line connected to the memory cell array and for latching programming data, control section for judging whether all of a plurality of latched data included in data latch groups constituted by the plurality of data latch circuits are the same as a first data or not and for controlling to change a potential of a plurality of first nodes according to the judging result, where there is one first node corresponding to each data latch circuit group, section for detecting potentials of the plurality of the first nodes corresponding to the plurality of data latch circuit groups, judging whether all data latched by the latch circuits includes in the plurality of latch circuit groups are the same as the first data and for controlling to change a potential of a plurality of second nodes according to the judging result, and section for detecting the potential of the plurality of second nodes and for outputting a judging result whether all of data latched by data latch circuits, which are included in the plurality of the data latch circuit groups, are the same as the first data or not.

8 Claims, 55 Drawing Sheets

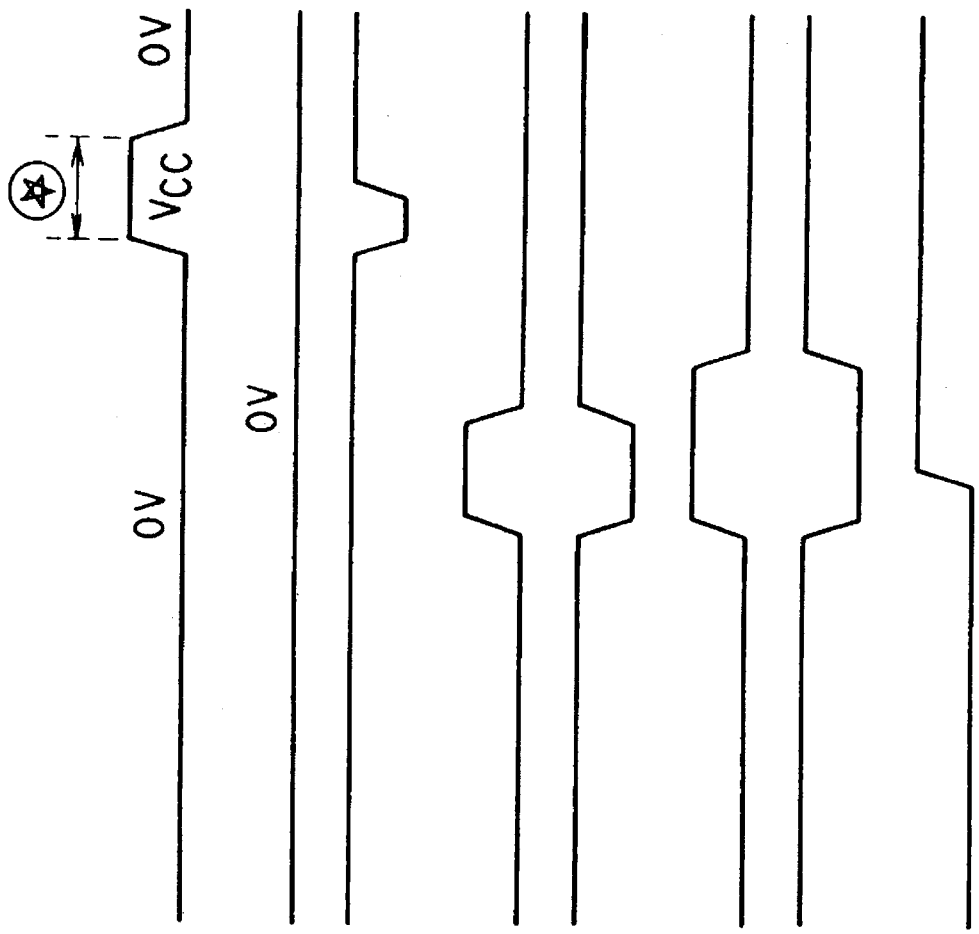

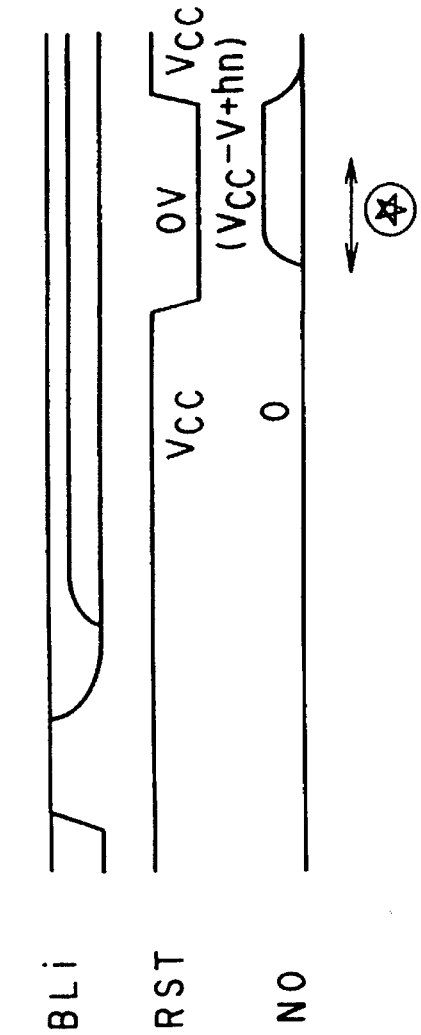
FIG. 1I PRIOR ART  $\phi V$
FIG. 1J PRIOR ART  $\phi P$
FIG. 1K PRIOR ART  $\overline{\phi P}$
FIG. 1L PRIOR ART  $\phi R$
FIG. 1M PRIOR ART  $V_{MB}$
FIG. 1N PRIOR ART  BLi
FIG. 1O PRIOR ART  RST
FIG. 1P PRIOR ART  NO

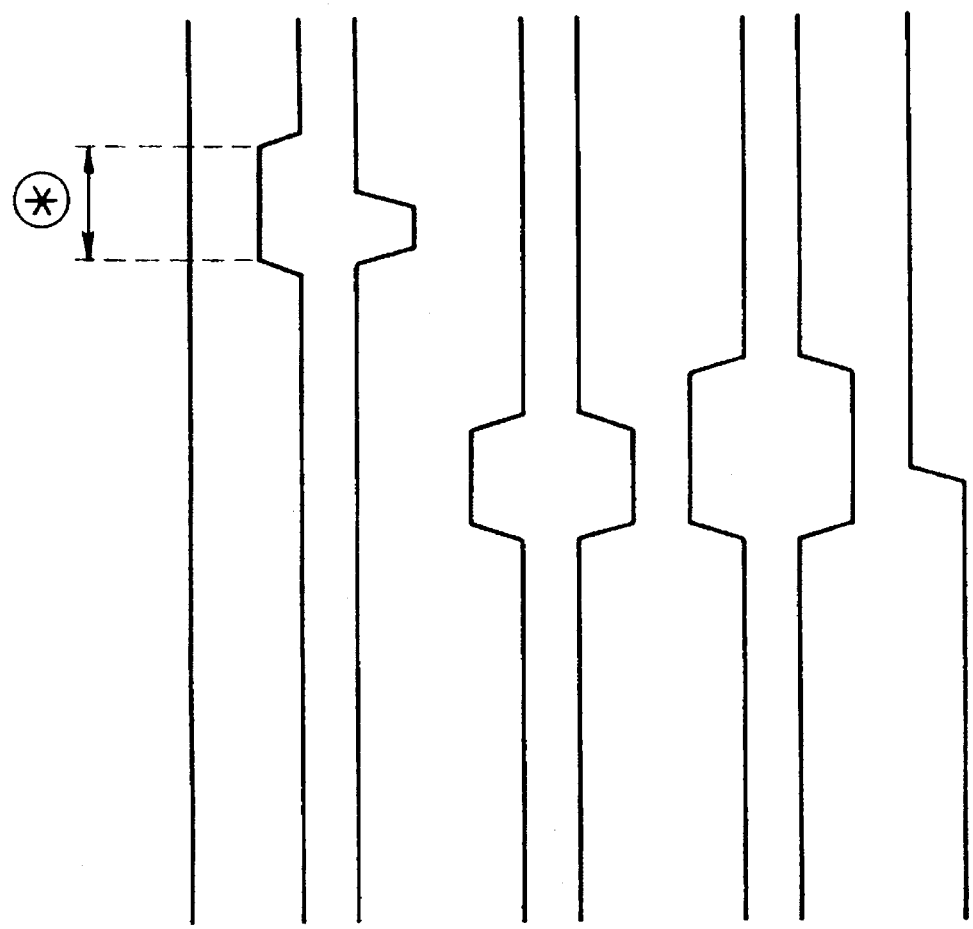

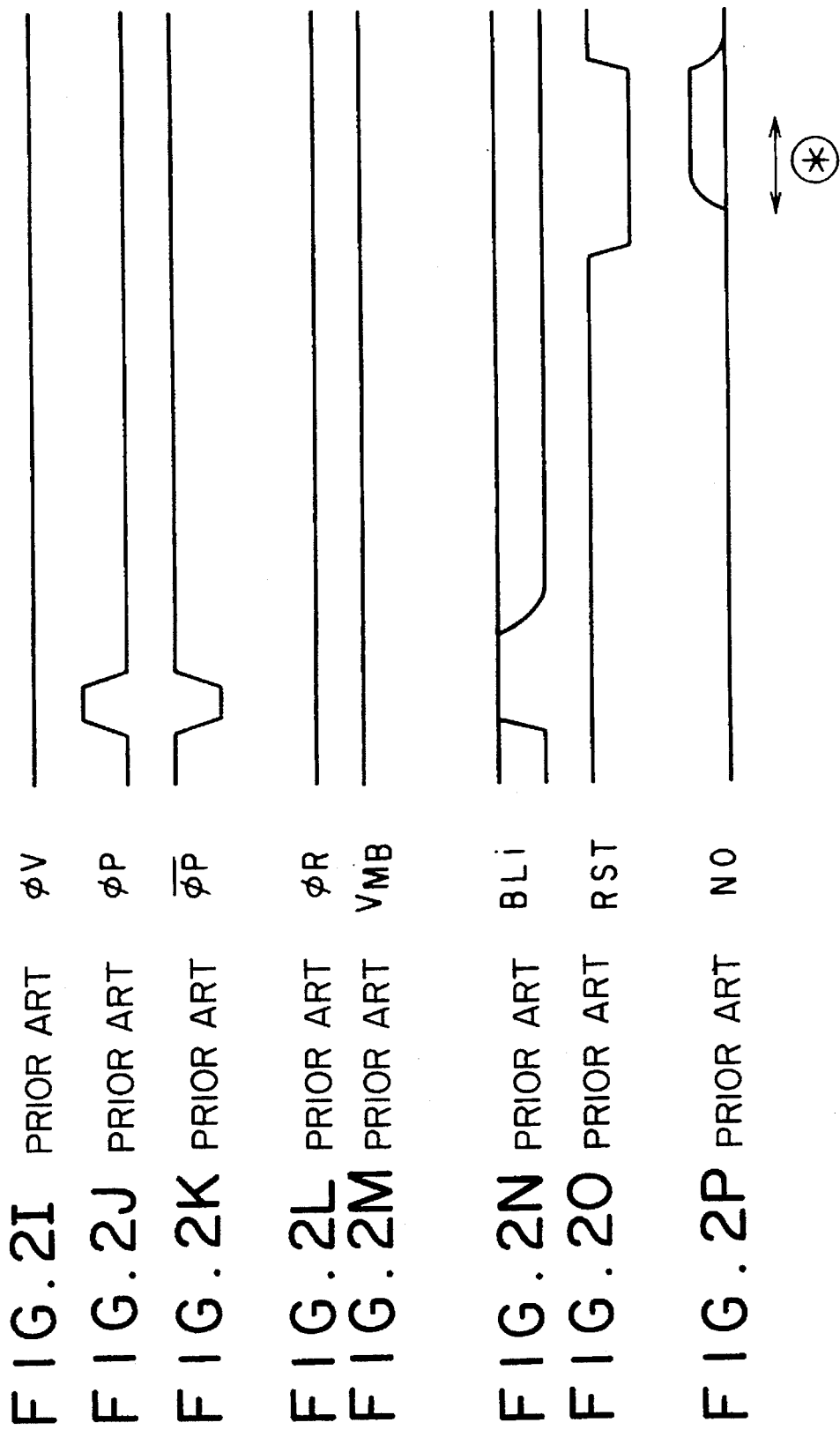

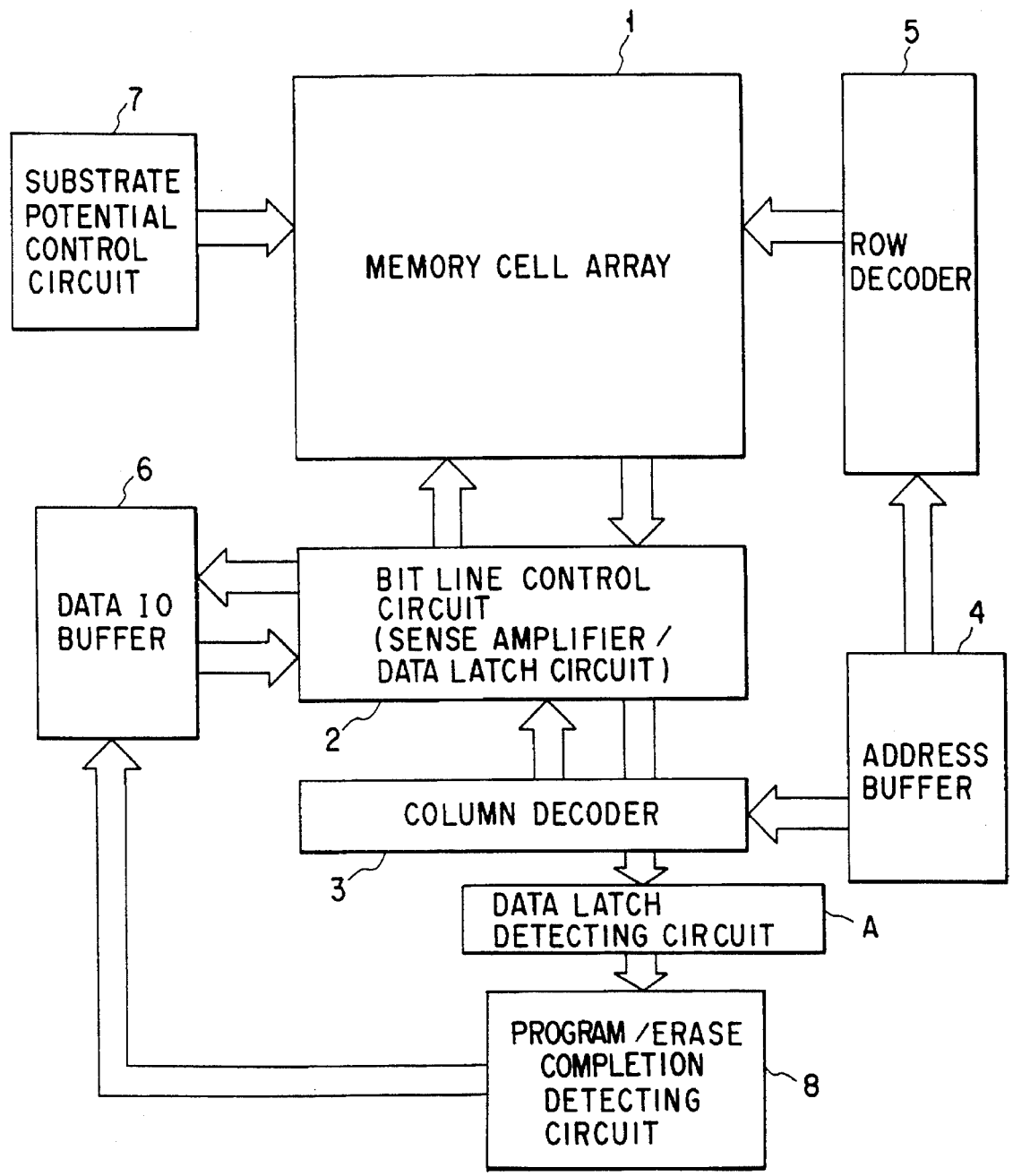
F I G. 6

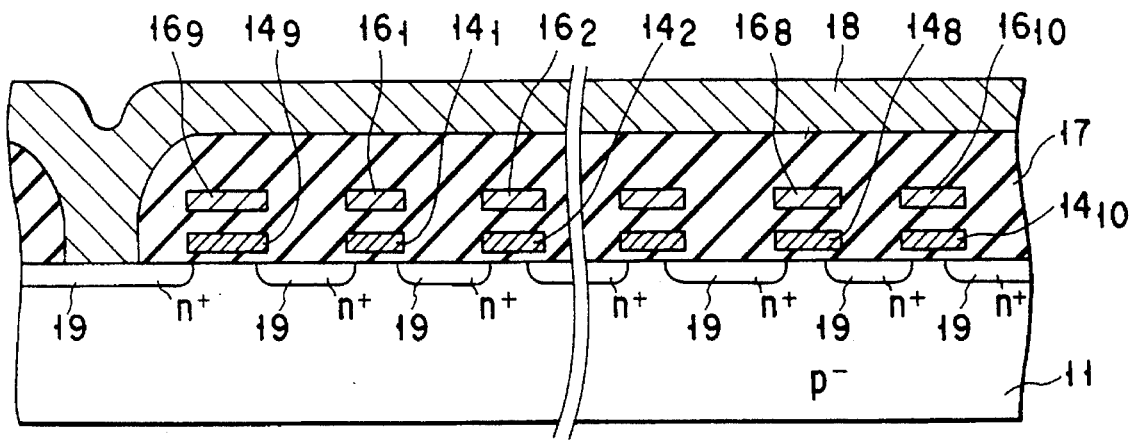
F I G. 8A
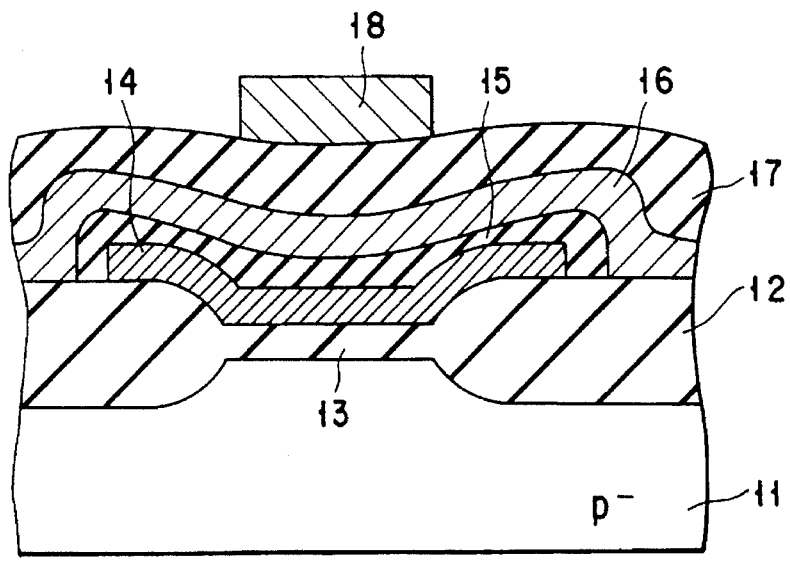
F I G. 8B

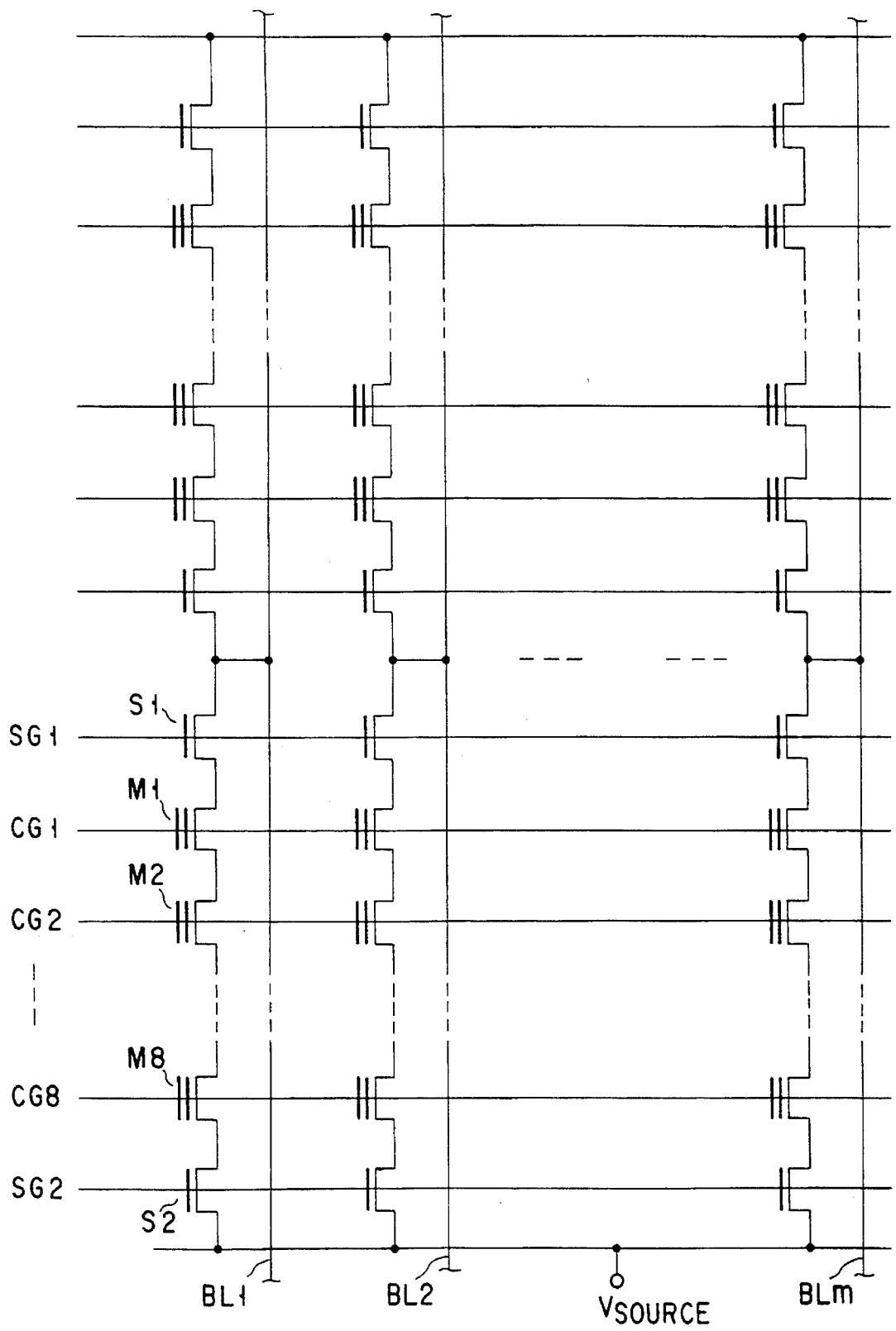
F I G. 9

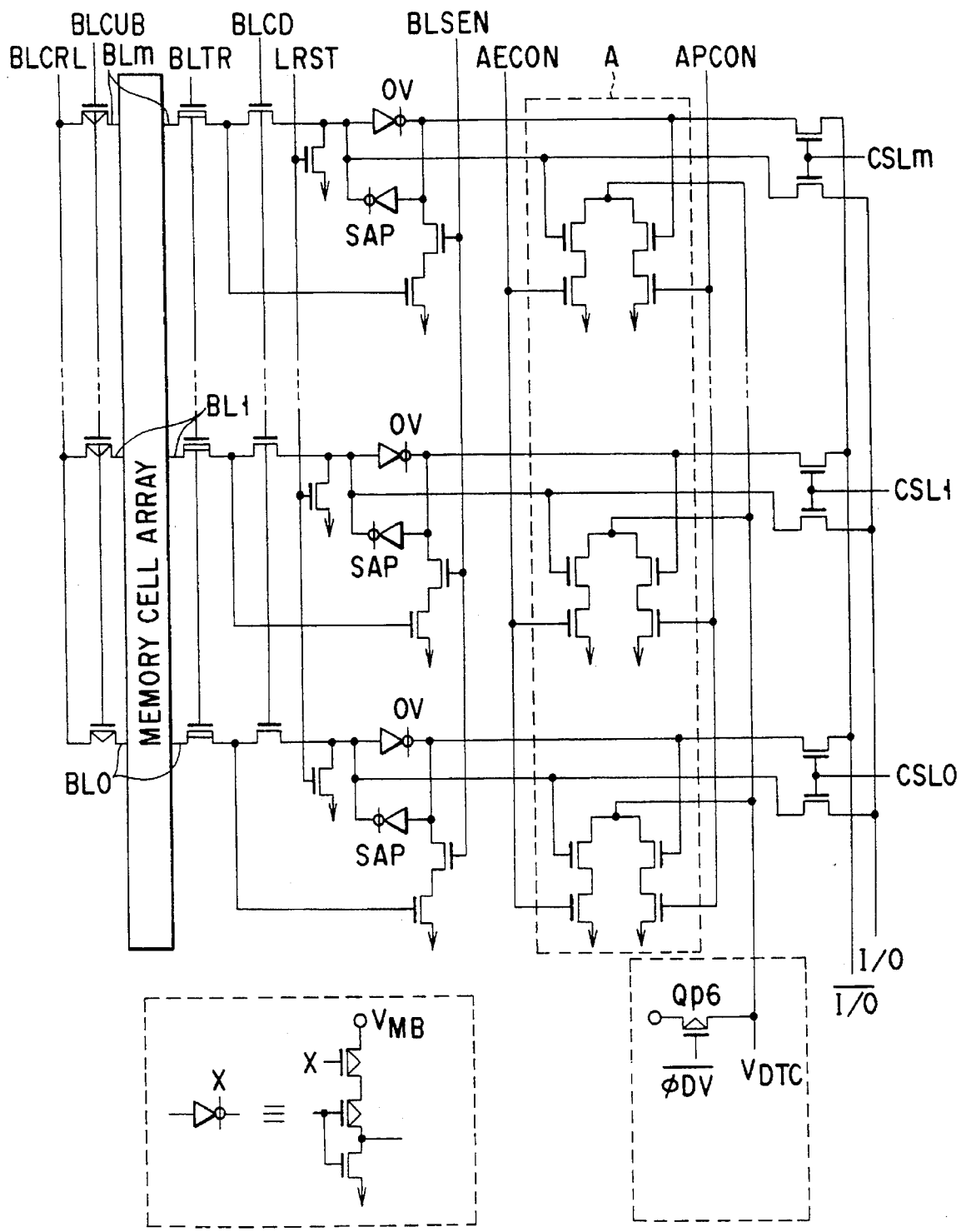
F I G. 15

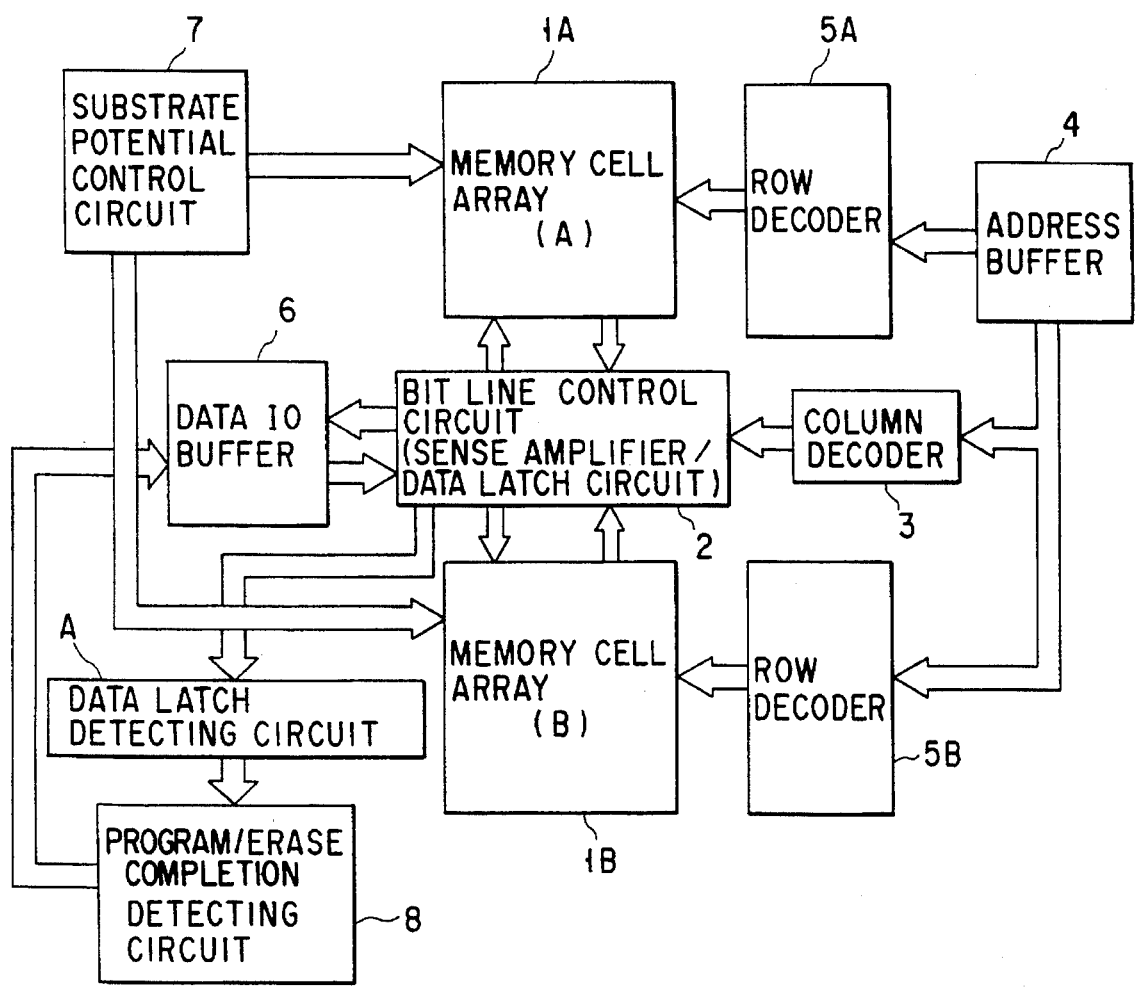
F I G. 18

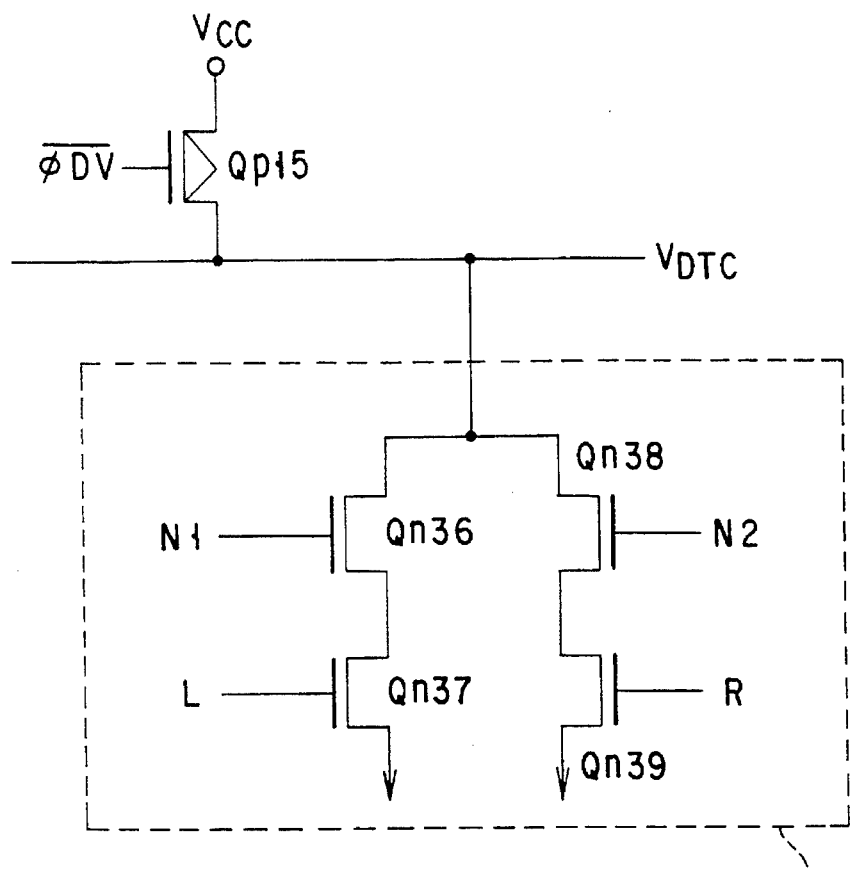
F I G. 20A
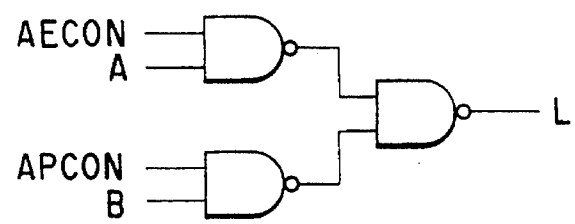
F I G. 20B
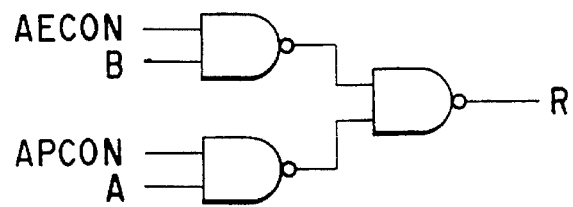
F I G. 20C

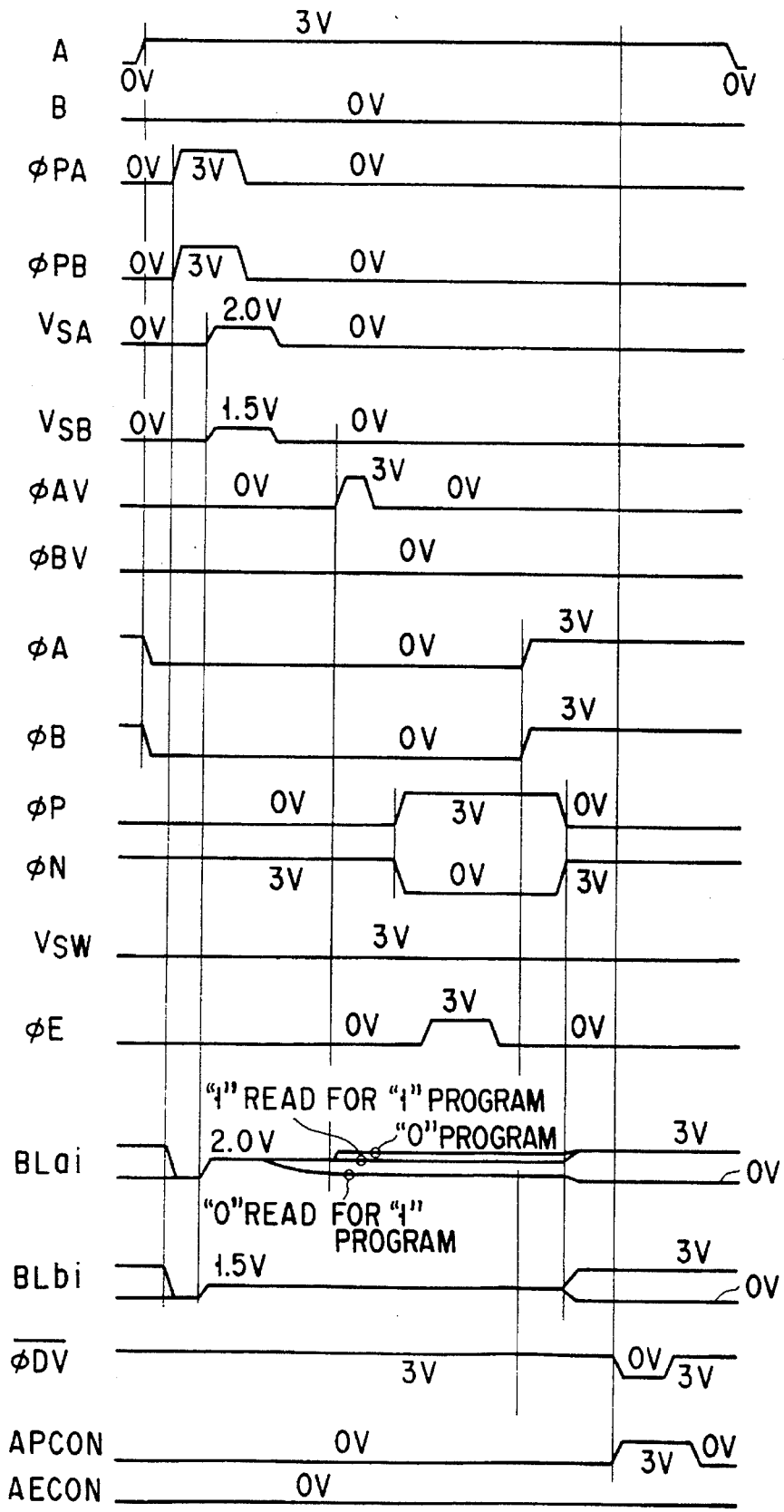
F I G. 21

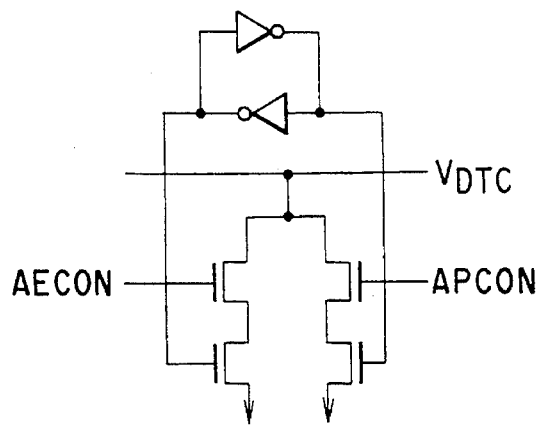
F I G. 23A
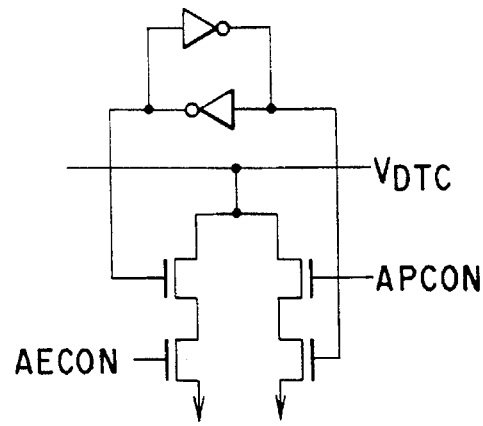
F I G. 23B
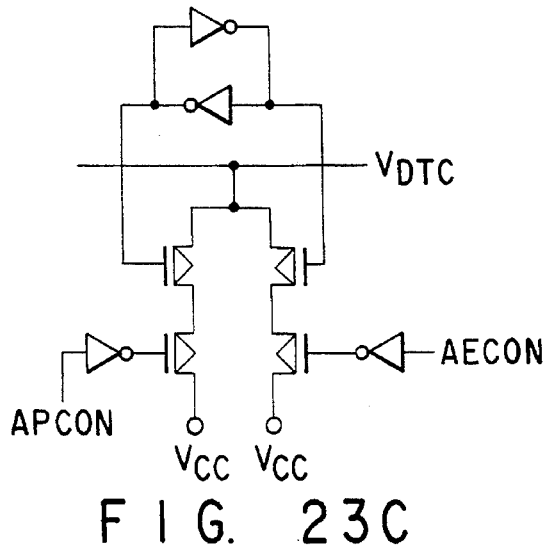
F I G. 23C
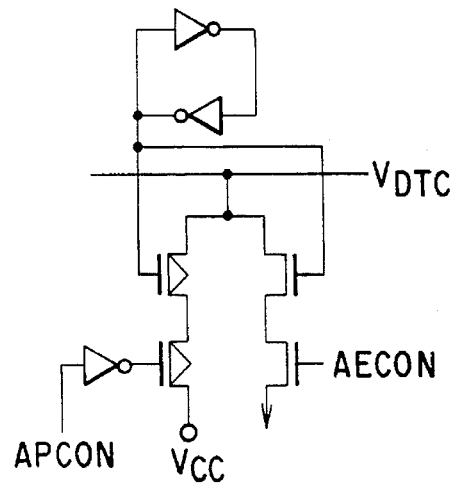
F I G. 23D
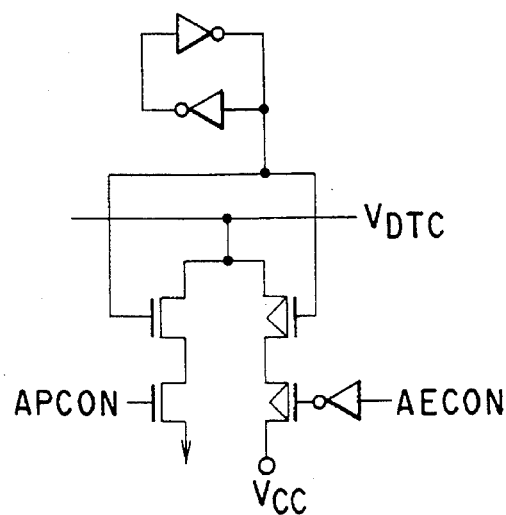
F I G. 23E

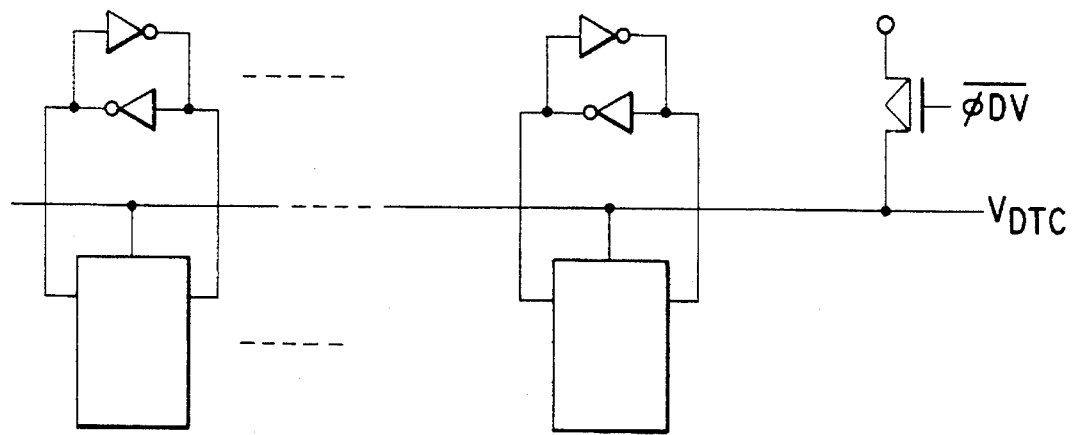
F I G. 24A
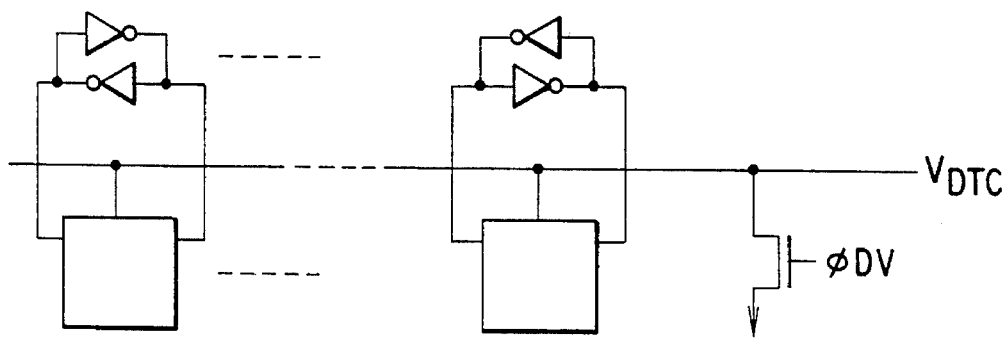
F I G. 24B
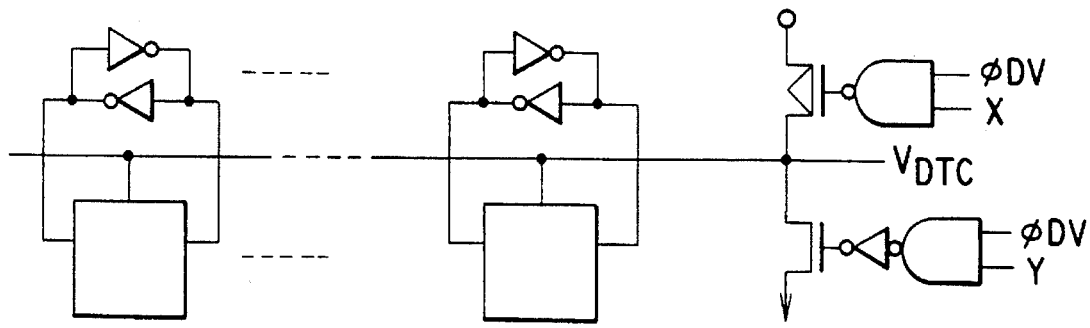
F I G. 24C

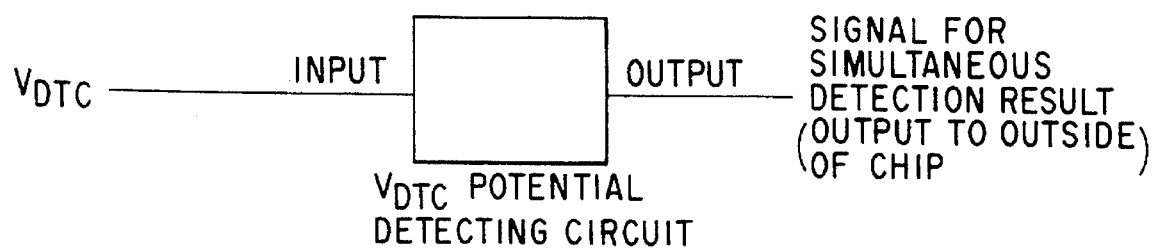
F I G. 25A
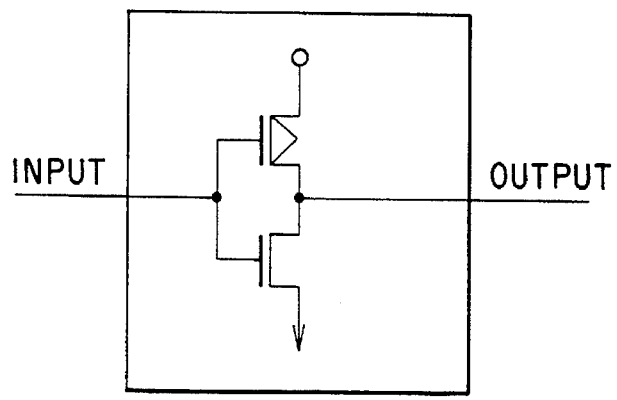
F I G. 25B
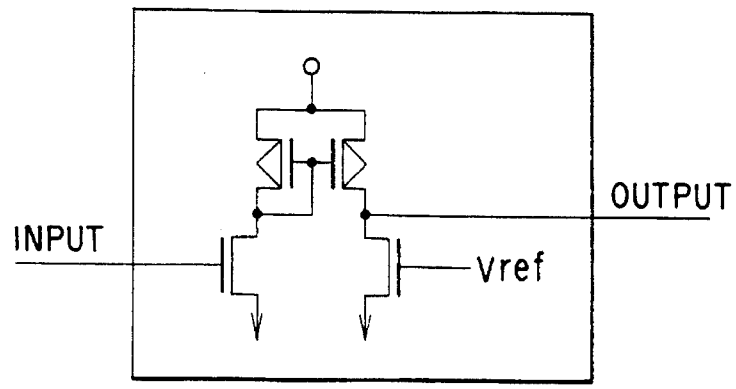
F I G. 25C

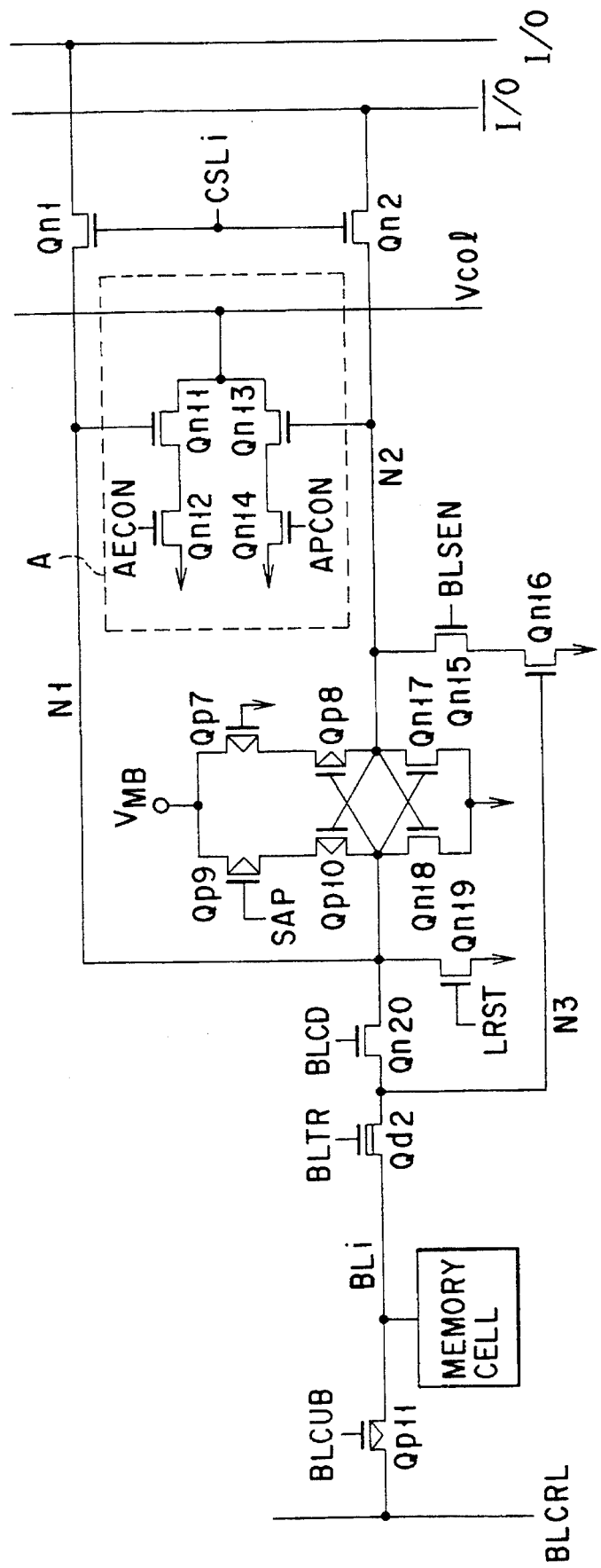
F I G. 27

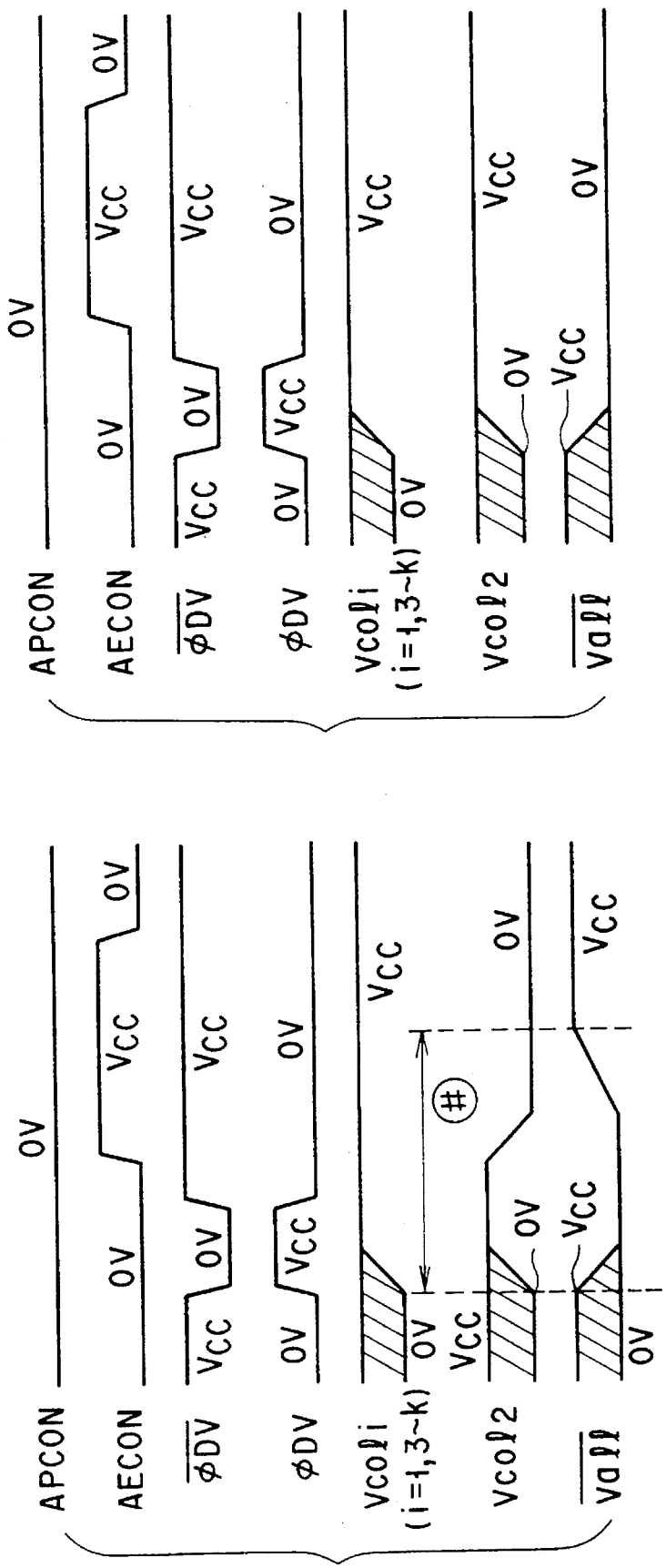

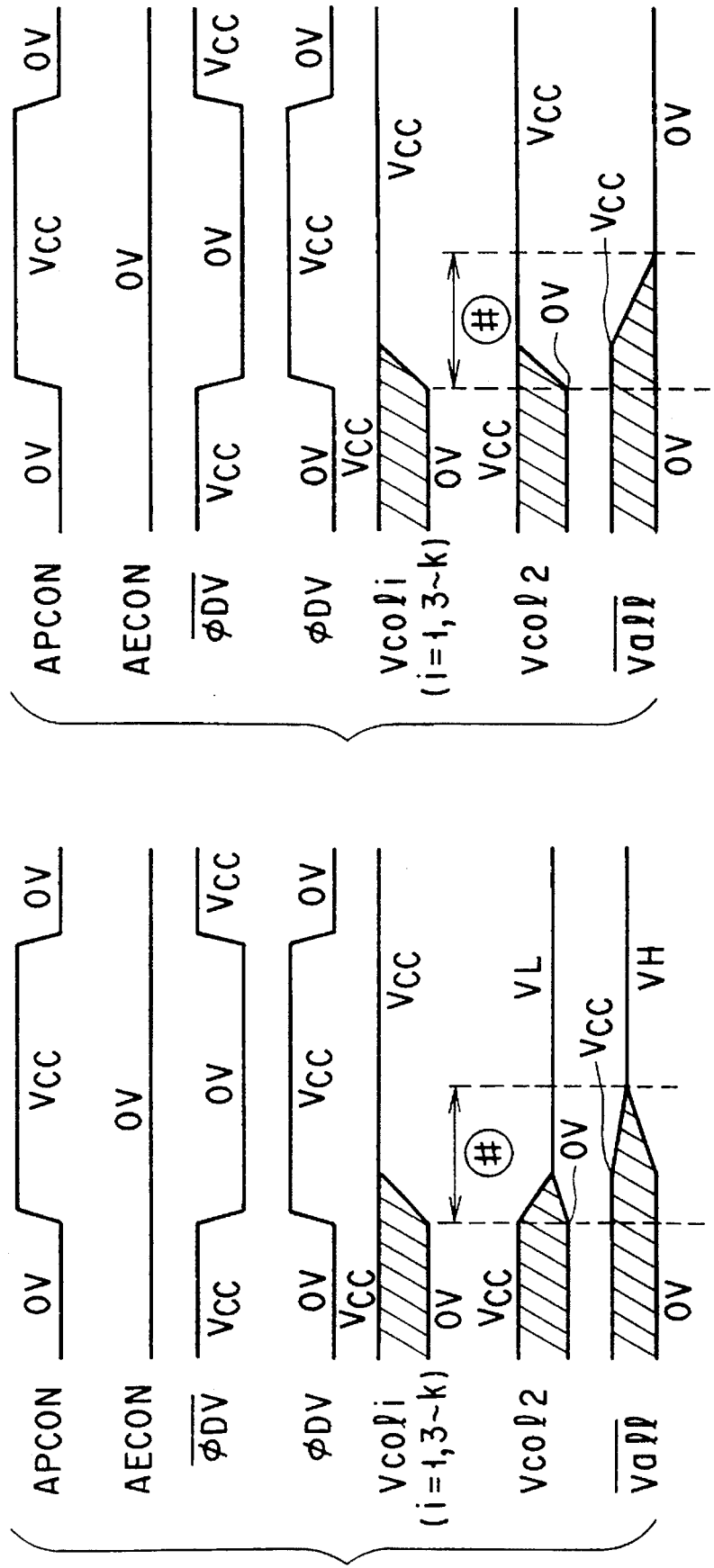
F I G. 33B
F I G. 33A

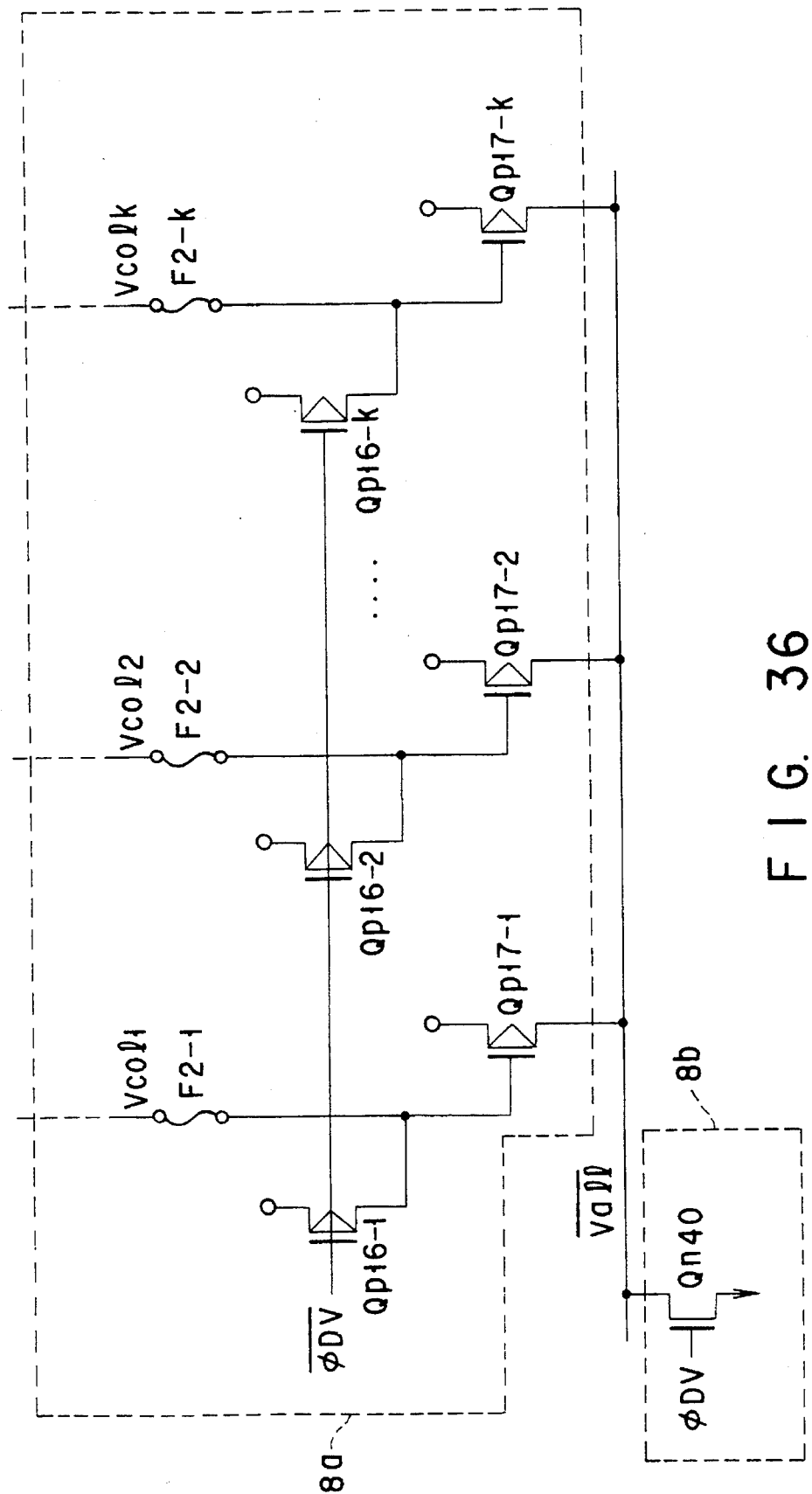
F I G. 36

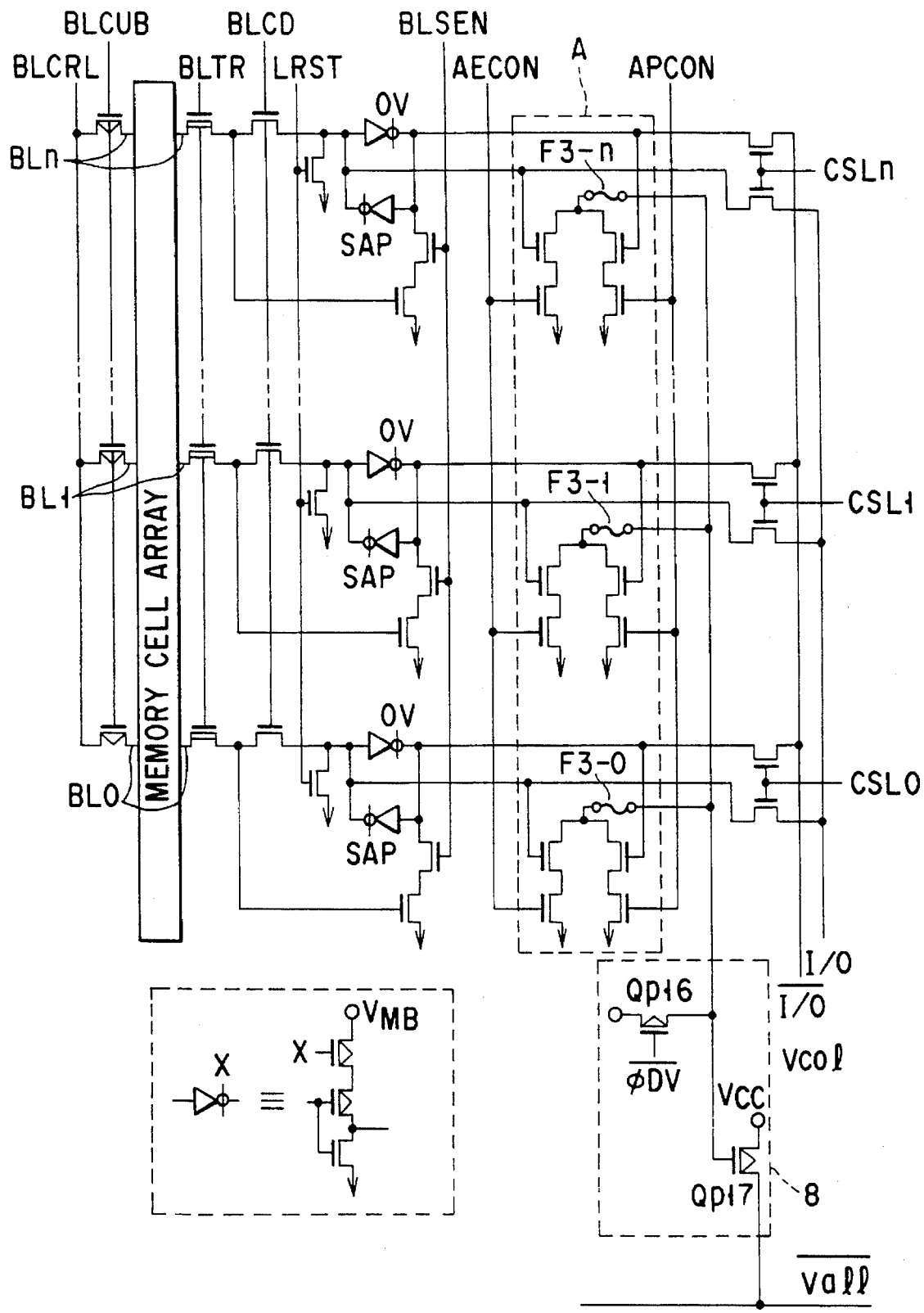
F I G. 37

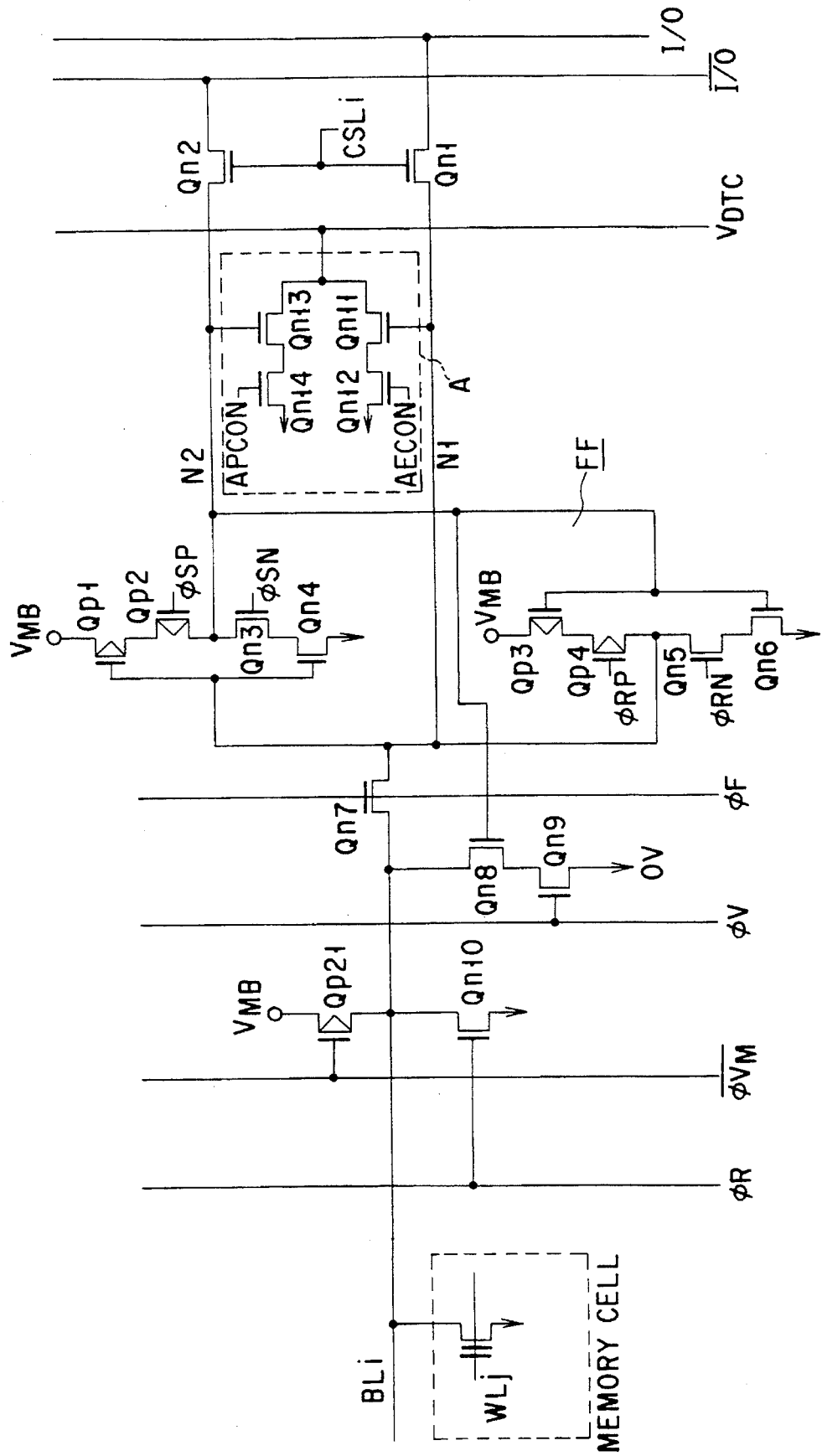
F I G. 41

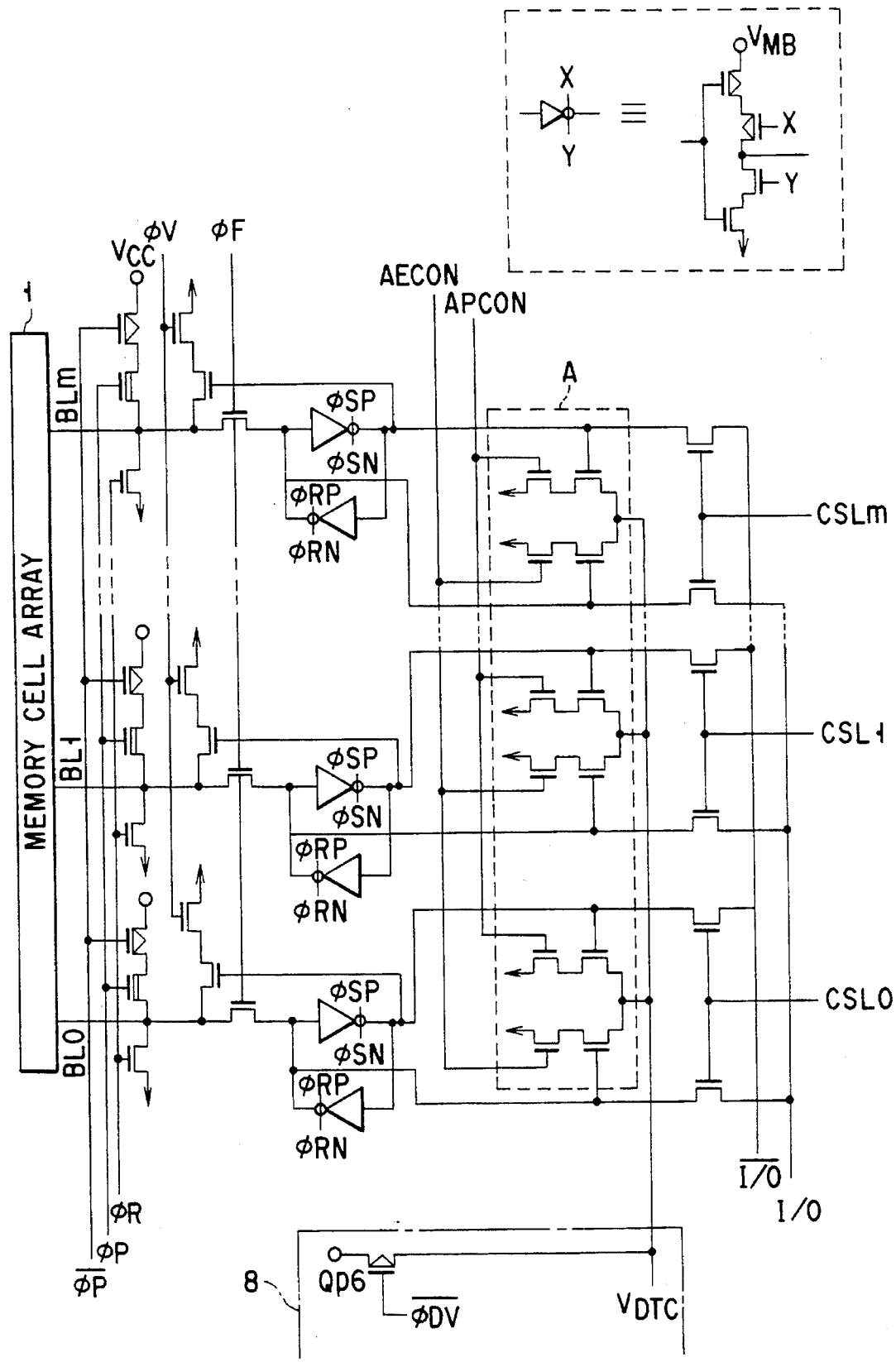
F I G. 42

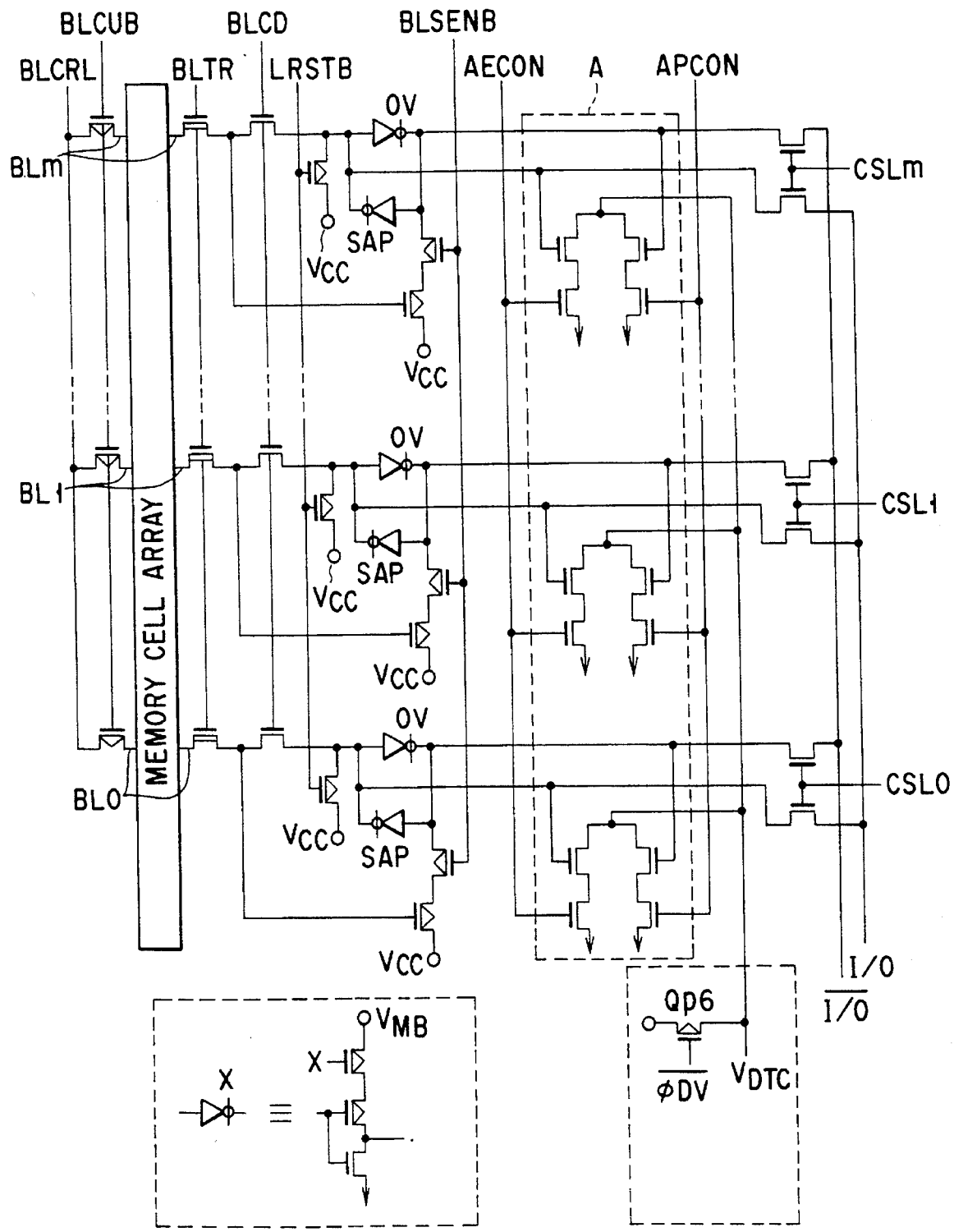
F I G. 46

SEMICONDUCTOR MEMORY DEVICE

BACKGROUND OF THE INVENTION

1. Field of the Invention

The present invention relates to a semiconductor memory device, which is electrically rewritable, for example, including a nonvolatile semiconductor memory having memory cell arrays of NAND cell structure.

2. Description of the Related Art

As one of semiconductor memory devices, a NAND cell type EEPROM capable of integrating to a high degree is known. Structurally, plural memory cells are connected in series by sharing their source and drain between adjacent ones, and they are connected to a bit line as one unit. The memory cell usually has an FETMOS structure laminating a charge storage layer and a control gate. Memory cell arrays are integrated and formed in a p-type substrate or in a p-type well formed in n-type substrate. The drain side of the NAND cell is connected to the bit line through a selective gate, while the source side is connected to the source line (reference potential wiring) through the selective gate. The control gates of the memory cells are connected continuously in a line direction to form a word line.

The operation of NAND cell type EEPROM is as follows.

Data program operation starts sequentially from the memory cell at the remotest position from the bit line. A high potential Vpp (about 20 V) is applied to the control gate of the selected memory cell, an intermediate potential VM (about 10 V) is applied to the control gates and selective gates of the memory cells at the further bit line side, and either 0 V or intermediate potential is applied to the bit line corresponding to the data. When 0 V is applied to the bit line, its potential is transmitted up to the drain of the selected memory cell, and an electron injection occurs from the drain to the floating gate. As a result, the threshold voltage of the selected memory cell is shifted to the positive direction. This state is defined, for example, as data "1". When an intermediate potential is applied to the bit line, electron injection does not occur, and hence the threshold voltage is not changed and remains negative. This state is data "0".

Data erase operation is executed simultaneously on all cells in the NAND cell. That is, all control gates and selective gates are at 0 V, and the bit lines and source lines are in floating state, and in this condition a high potential of 20 V is applied to the p-type wells and n-type substrates. Consequently, electrons of floating gate are released to the p-type well in all memory cells, and the threshold voltage is shifted to the negative.

Data read operation is effected by setting the control gate of the selected memory cell at 0 V and the control gate and selective gates of all other memory cells at source potential VCC, and detecting whether an electric current flows or not in the selected memory cell.

As clear from the description of operation herein, in the NAND cell type EEPROM, in program and read operation, the nonselective memory cells act as transfer gates. From this viewpoint, the threshold voltage of a written memory cell has its own limit. For example, a preferred range of threshold voltage for the memory cell in which "1" is written is about 0.3 to 3.5 V. Considering changes after data program, fluctuations of manufacturing parameters of memory cells, and variations of source potential, the threshold voltage distribution after data programming is demanded to be a smaller range.

In the conventional method of programming data in same conditions in all memory cells by fixing the program potential and program time, however, it is difficult to keep the threshold voltage range after programming "1" within an allowable range. For example, memory cells may vary in characteristics due to fluctuations in manufacturing process. Therefore, reviewing program characteristics, there are easy-to-program memory cells and hard-to-program memory cells. By contrast, a method is proposed to program while verifying by adjusting the program time, so that the threshold voltage of each memory cell may settle within a desired range (Japanese Laid-open Patent No. 5-144277).

The threshold voltage of an erased memory cell must be a negative value. To realize this state securely, a method is known to erase while verifying by adjusting the erase time. Examples of operation timing of such program verify read and erase verify read are shown in FIGS. 1 and 2.

In both timing charts of FIGS. 1 and 2, a circuit shown in FIG. 3 is used as a sense amplifier/data latch circuit and latch data detecting circuit. The circuit in FIG. 3 includes a circuit (enclosed by broken line A) capable of detecting whether program or erase state is sufficient or not, without having to issuing the data of memory cells to outside, after confirming the program or erase state (Japanese Laid-open Patent No. 6-76586).

Points of notice in operation timing charts in FIGS. 1 and 2 are the star-marked section in FIG. 1 and asterisked section in FIG. 2. The operation timing in FIG. 1 is explained in the first place.

After charging all bit lines with VCC, by setting the word lines (control gates) and selective gates to "H", the bit lines connected to the memory cells having "1" data are kept at VCC, while the bit lines connected to the memory cells having "0" data are changed from VCC to 0 V. In succession, the bit lines connected to the memory cell having program data "1" are charged from 0 V to VH (voltage to be judged to be "H" level), and the bit lines are sensed. Sequentially, the signal RST changes from VCC to 0 V, node N0 floats, remaining at potential of 0 V, and APCON is changed from 0 V to VCC. At this time, if node N2 is at "L" level, that is, 0 V, node N0 is kept at 0 V, and hence Qn46 remains OFF.

When node N2 is at "H" level, for example, VCC, node N0 is changed up to (VCC−Vthn). If (VCC−Vthn) <Vthn, Qn46 is turned on, and therefore VDTC in floating state is changed from VCC to 0 V. In this case, when nodes N1 of all data latch circuits are at "H" level and N2 at "L" level, VDTC is kept at VCC. This state corresponds to the program completion state of all selected memory cells, and hence programming is over.

In at least one of all data latch circuits, if node N1 is "L" and N2 is "H", VDTC changes from VCC to 0 V. It shows that programming is insufficient in at least one selected memory cell, and hence programming continues. This is a normal state.

However, if VCC−Vthn<Vthn, Qn46 is always in OFF state, and data in all data latch circuits cannot be detected simultaneously, and the risk of an error is high. The state of VCC−Vthn<Vthn is more likely to occur when the VCC is lower, and it is hard to reduce the source potential in the circuit shown in FIG. 3.

The same holds true in the asterisked section in FIG. 2.

As a method to solve this problem, a method is known to set SIGNALS APCON and AEON at higher voltage than VCC between star-mark and asterisk, but the operation is complicated in this method, and it takes a longer time to generate a voltage higher than VCC, which leads to various problems such as longer operation time and increase in the number of circuits.

As the circuit for program and erase verify read, instead of the circuit in FIG. 3, the circuit in FIG. 4 may be also used. In FIG. 4, there are a node for simultaneous detection VDTCP in program verify read, and a node for simultaneous detection VDTCE in erase verify read, and each is connected with the drain of n-channel transistor Qn47 for receiving nodes N2, N1 at the gate. By using this circuit, VCC is directly entered into the gates of the detecting transistors Qn47, Qn48 as "H" level, and if the VCC is reduced, error does not occur as far as VCC >Vth.

In the circuit in FIG. 4, however, one wire is added (wiring for simultaneous detection is increased from VDTC only to VDTCP and VDTCE), and therefore the pattern area is increased.

On the other hand, in the conventional NAND cell type EEPROM, one sense amplifier/data latch circuit shown in FIG. 3 must be provided for each bit line, and the pattern area of the sense amplifier/data latch circuit increases because the sense amplifier/data latch circuit contains lots of elements. Therefore, as shown in FIG. 5A, a width for about four bit lines is needed on the pattern for one area of the sense amplifier/data latch circuit (S/Ai in FIG. 5A, where in=1, 2, . . . ) to form a pattern diagram of one sense amplifier/data latch circuit+one latch data detecting circuit (A in FIG. 3, corresponding to A of FIG. 4), and therefore the pattern diagram of the sense amplifier/data latch circuit may be stacked up in four layers. And a column decoder is provided beneath it (see FIG. 5A).

In the case of using the circuit structure of FIG. 3, the node of program/erase completion detecting signal is as shown in FIG. 5B. As known from FIG. 5B, since the program/erase completion detected signal node is extended into the pattern of the sense amplifier/data latch circuit, the wiring length of the program/erase completion detected signal node is very long. As a result, the capacity of the program/erase completion detected signal node becomes larger. In the methods shown in FIG. 5A and 5B, the program/erase completion detecting operation is the operation of checking if the VDTC node is discharged or not through the transistor Qn46 after once charging the program/erase completion detected signal node (equivalent to VDTC in FIGS. 5A and 5B) to VCC potential, and when the capacity of the VDTC node is large, the required time for charging and discharging of potential is longer, and a longer time is needed for program/erase completion detecting operation, and finally it takes a long time in program/erase verify read operation.

Of the charging and discharging operation, the charging operation of the VDTC node can be increased in speed by increasing the size of the transistor Qp6 in FIG. 5A, and since only one transistor Qp6 is used in the entire chip, if the size of Qp6 is increased, there is almost no area increase in the entire chip, so that high speed charging operation of the VDTC node may be easily realized. However, as for discharging operation of VDTC node, in order to realize high speed, there is no other way than to increase the size of the transistor Qn46, but since the number of transistors Qn46 is the same as the number of bit lines (usually thousands to tens of thousands, if the size is increased, the pattern area increases significantly, leading to a notable increase in the chip area. Still worse, if there is only one memory cell incomplete in program or erase, the result of program/erase completion detecting result is incomplete, and in a worst case, the VDTC node must be discharged through one transistor Qn46 in the required time of VDTC node discharge.

Therefore, when the VDTC node capacity is large, a longer time is needed for the VDTC node discharge in order to complete the discharge into "L" level within the VDTC node discharge time so as to keep reliability of the program/erase completion detecting operation, which leads to a problem of extension of the time of program/erase completion detecting operation, that is, extension of operation time of program/erase verify read, and when the dimension of the transistor for discharge is increased in order to shorten the VDTC node discharge time, the chip area is significantly increased.

Thus, in the conventional semiconductor memory device such as NAND cell type EEPROM, when the source potential is lowered, a longer time is required for program/erase verify read, and the risk of error is heightened.

Moreover, when detecting if program or erase is sufficient, that is, whether to complete program or erase or not, in all memory cells selected during program or erase verify read operation, the wiring length of the node to be detected (=node for simultaneous detection, corresponding to VDTC node in FIGS. 5A and 5B), is long, and therefore the capacity of the node to be detected becomes larger, and the required time for charging or discharging of the node to be detected is extended, and a longer time is required for program or erase verify read operation. Furthermore, to shorten the required time for charging or discharging of the node to be detected, when the dimension of the transistor responsible for charging or discharging is increased, since the number of transistors is about thousands or tens of thousand, the chip area is increased significantly.

SUMMARY OF THE INVENTION

It is an object of the invention to provide a semiconductor memory device capable of realizing program/erase verify read operation short in required operation time, without complicating the operation or increasing the pattern area, being free from risk of error even at low source potential.

It is another object of the invention to provide a semiconductor memory device capable of realizing high speed program/erase verify read operation, by shortening the required time of program/erase completion detecting operation., without practically increasing the chip area.

To achieve the above objects, the invention is constituted as follows.

According to a first aspect of the invention, a semiconductor memory device is characterized by comprising: a semiconductor substrate; a memory cell array having memory cells, each of which stores data, formed in matrix on the semiconductor substrate; a plurality of data latch circuits, each of which is arranged a one end of at least one bit line connected to the memory cell array and for latching programming data; control means for judging whether all of a plurality of latched data included in data latch groups constituted by the plurality of data latch circuits are the same as a first data or not and for controlling to change a potential of a plurality of first nodes according to the judging result, where there is one first node corresponding to each data latch circuit group; means for detecting potentials of the plurality of the first nodes corresponding to the plurality of data latch circuit groups, judging whether all data latched by the latch circuits includes in the plurality of latch circuit groups are the same as the first data and for controlling to change a potential of a plurality of second nodes according to the judging result; and means for detecting the potential of the plurality of second nodes and for outputting a judging result whether all of data latched by data latch circuits, which are included in the plurality of the data latch circuit groups, are the same as the first data or not.

The semiconductor memory apparatus of the first aspect of the invention applies, after programming or erasing data, a specified verified potential (for example, set in the intermediate potential between the source potential and grounding potential) to the control gate of the memory cell, and evaluates the threshold voltage of the memory cell by a bit line control circuit. If there is any memory cell not reaching the specified threshold voltage, program and erase operation is added only for such memory cell. Afterwards, the threshold voltage is evaluated again. By repeating this operation, when it is confirmed that threshold voltages of all memory cells settle within a desired allowable range, program and erase operation is terminated.

At this time, in the first aspect of the invention, by feeding the output of the data latch circuit directly to one gate of the detecting transistor connected in series, the latch data is detected. Accordingly, supposing the "H" level of the data latch circuit to be VCC, VCC is directly applied to the gate of the transistor gate, instead of VCC–Vth, so that drop of the, threshold voltage may be suppressed.

Therefore, according to the first aspect of the invention, the reliability is high if the source potential is low, and fast program or erase verify read operation is realized.

The semiconductor memory device of the first aspect of the invention employs first and second transistors of same polarity connected in series as the means for judging if the plurality of data latched in a plurality of data latch circuits be all identical or not, feeds one end of the node of the data latch circuit into the gate of the first or second transistor, sets one end of the transistors connected in series at the source or grounding potential, and thereby realizes high speed processing of normal program or erase verified read operation even if the source potential is reduced, while suppressing the increase of circuit area due to increase in the number of wires.

According to a second aspect of the invention, a semiconductor memory device is characterized by comprising: a semiconductor substrate; a memory cell array having memory cells, each of which has a charge storage layer and a control gate laminated on the semiconductor substrate and is electrically reprogrammed by receiving/transmitting charges between the charge storage layer and the semiconductor substrate; bit line receiving/transmitting data from/to the memory cell array; a plurality of data latch circuits, each of which is arranged a one end of at least one bit line connected to the memory cell array and for latching programming data; verify control means for setting a unit program/erase time to a predetermined rage of the memory cell array, for reading data of the memory cells after programming/erasing memory cells, simultaneously, and for reprogramming/re-erasing memory cells of which program/erase are insufficient; means for automatically setting reprogramming data of the data latch circuit for bit according to programming state by preforming a logic operation with respect to read data of memory cells and programming data latched by the data latch circuit at programming verify operation; judging means for detecting one reprogramming data or re-erase data latched by the data latch circuits at one of program verify or erase verify operation, respectively, and for judging whether program/erase operation is completed or not; means for judging whether memory cells, of which program/erase are insufficient, in a memory cell group including the plurality of memory cells exist or not, and for controlling to change a potential of a plurality of first nodes according to the judging result, where there is one first node corresponding to each memory cell group; means for detecting potentials of a plurality of the first nodes corresponding to the plurality of memory cell groups, judging whether memory cells, of which program/erase are insufficient, in a memory cell group including the plurality of memory cells exist or not and for controlling to change a potential of a plurality of second nodes according to the judging result.

The semiconductor memory device of the second aspect of the invention employs a method of dividing the node to be detected. More specifically, as the means for judging if all of (n×k) pieces of data latched in (n×k) data latch circuits be identical or not, there is provided a circuit for Judging if data latched in n data latch circuits be identical or not, detecting if k circuits for issuing judging results of n pieces of data as output signals, and the judging results shown by the output signals are in data matched state in all of k pieces, and producing the result of detection. That is, the conventional nodes to be detected connected with (n×k) pieces of flip-flop are divided into two types, that .is, k nodes to be detected connected with n pieces of flip-flop, and nodes expressing the results of detection of all flip-flops by receiving the detection results of these k nodes to be detected (the conventional nodes to be detected are divided into k+1 pieces), and each node is detected in individual detecting circuits.

Thus, according to the second aspect of the invention, without hardly increasing the chip area, the required time for program/erase completion detecting operation is shortened, and fast program/erase verify read operation is realized.

Therefore, in the semiconductor memory device of the second aspect of the invention, as the means for judging if all of (n×k) pieces of data latched in (n×k) data latch circuits be identical or not, by installing a circuit for judging if data latched in n data latch circuits be identical or not, detecting if k circuits for issuing judging results of n pieces of data as output signals, and the judging results shown by the output signals are in data matched state in all of k pieces, and producing the result of detection, the required time for program/erase completion detecting operation is shortened without practically increasing the chip area, so that the semiconductor memory device featuring high speed program/erase verify read operation may be realized.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 1 is a timing chart showing program verification operation in a first prior art;

FIG. 2 is a timing chart showing erase verification operation in the first prior art;

FIG. 6 is a block diagram showing a schematic construction of NAND cell type EEPROM in a first embodiment and a second embodiment;

FIG. 8A and FIG. 8B are sectional views of 8A-8A and 8B—8B of FIG. 7A and FIG. 7B;

FIG. 9 is an equivalent circuit diagram of a memory cell array in the first embodiment and second embodiment;

FIG. 15 is a diagram showing the connection of bit line control circuit with other circuits in the second embodiment;

FIG. 18 is a block diagram showing a schematic construction of NAND cell type EEPROM in a third embodiment;

FIG. 20A to FIG. 20C are diagram showing the constitution of precharge circuit section of latch data detecting circuit and program/erase completion detecting circuit in the third embodiment;

FIG. 21 is a timing chart showing program verification operation in the third embodiment;

FIG. 23A to FIG. 23E are diagrams showing modified examples of latch data detecting circuit A;

FIG. 24A to FIG. 24C are diagrams showing precharge circuit portions of program/erase completion detected signal, out of the program/erase completion detecting circuit;

FIG. 25A to FIG. 25C are diagram showing detecting circuit portions of program/erase completion detected signal, out of the program/erase completion detecting circuit;

FIG. 27 is a diagram showing a specific constitution of bit line control circuit 2 and latch data detecting circuit A in FIG. 26;

FIG. 28 is a diagram showing connection relation of bit line control circuit 2, latch data detecting circuit A, memory cell array 1, and program/erase completion detecting circuit for a plurality of columns 8a;

FIG. 31A and FIG. 31B are operation timing charts of signal related to erase completion detecting operation during erase verify read;

FIG. 33A and FIG. 33B are operation timing charts in other embodiment of program completion detecting operation during program verify read;

FIG. 36 is a diagram showing a different embodiment in which a fuse is placed in program/erase completion detecting circuit 8 for a plurality of columns;

FIG. 37 is a diagram showing connection of bit line control circuit with other circuits when a fuse is placed in the portion of latch data detecting circuit A in FIG. 27;

FIG. 41 is a diagram showing the constitution of bit line control circuit and latch data detecting circuit in the fifth embodiment;

FIG. 42 is line control circuit with other circuits in the fifth embodiment;

FIG. 46 is a diagram showing the connection of bit line control circuit with other circuits in the sixth embodiment;

DETAILED DESCRIPTION OF THE PREFERRED EMBODIMENTS

Figure 3:
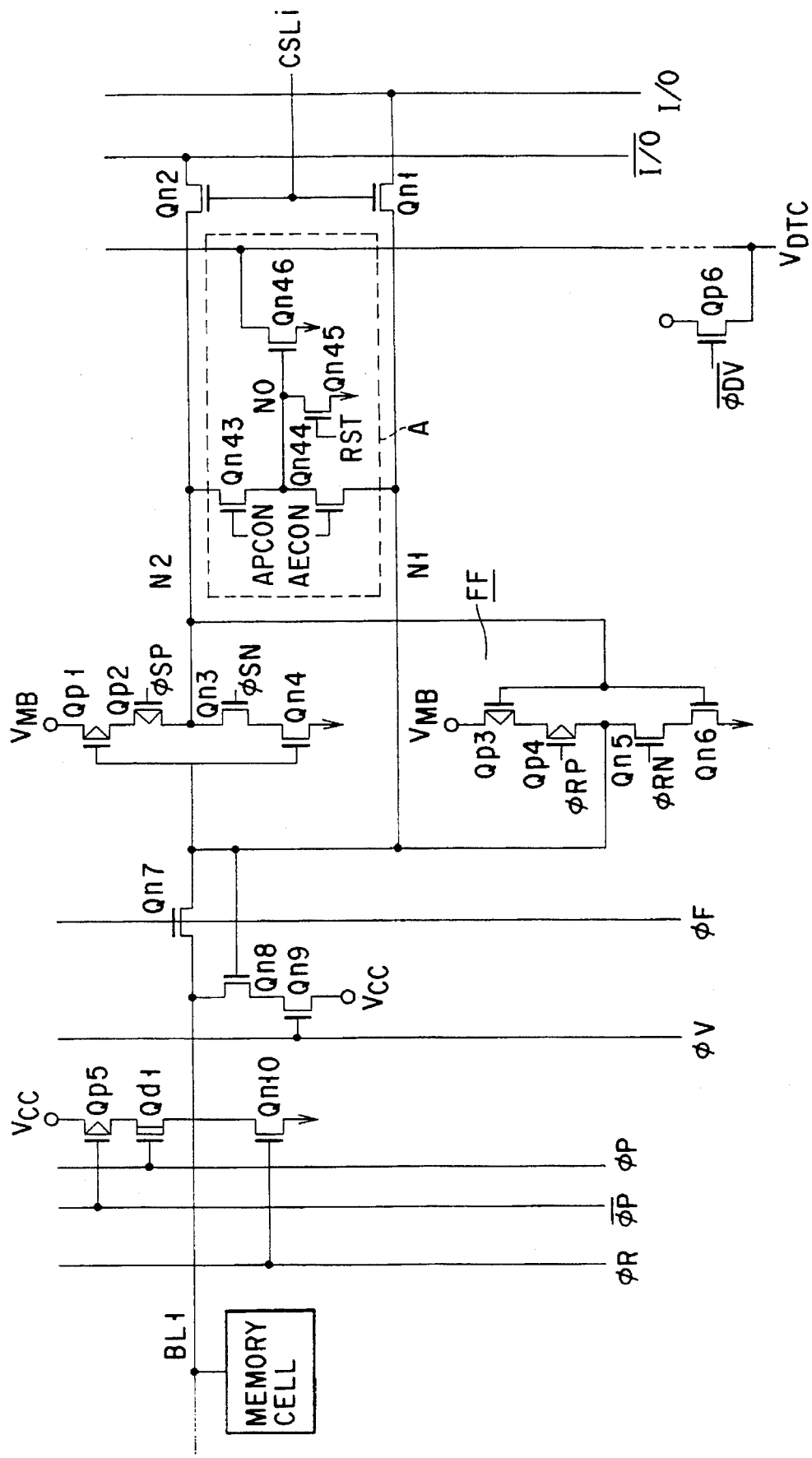
FIG. 3 is a diagram showing the constitution of bit line control circuit and latch data detecting circuit in the first prior art.

Referring now to the drawings, some of the preferred embodiments of the invention are described in detail below.
(First Embodiment)

FIG. 6 is a block diagram showing the constitution of a NAND cell type EEPROM in a first embodiment of the invention. In order to perform data program, read, reprogram, program verify read and erase verify read operations on a memory cell array 1, a bit line control circuit 2 is provided. The bit line control circuit 2 is connected to a data IO buffer 6 and receives as an input the output of a column decoder 3 which receives an address signal from an address buffer 4. To control the control gate and selective gate on the memory cell array 1, a row decoder 5 is provided and a substrate potential control circuit 7 is provided for controlling the potential of the p-type substrate (or p-type well) on which the memory cell array 1 is formed.

A latch data detecting circuit A detects the data latched in the bit line control circuit 2, and a program/erase completion detecting circuit 8 receives this result of detection and issues a program completion signal or erase completion signal. The program completion signal or erase completion signal is sent out from the data IO buffer 6.

The bit line control circuit 2 is mainly composed of CMOS flip-flops and performs latch of data for programming, sense operation for reading the potential of bit line, and sense operation for verify read after program or after erase, and latch of reprogram data.

Figure 7A:
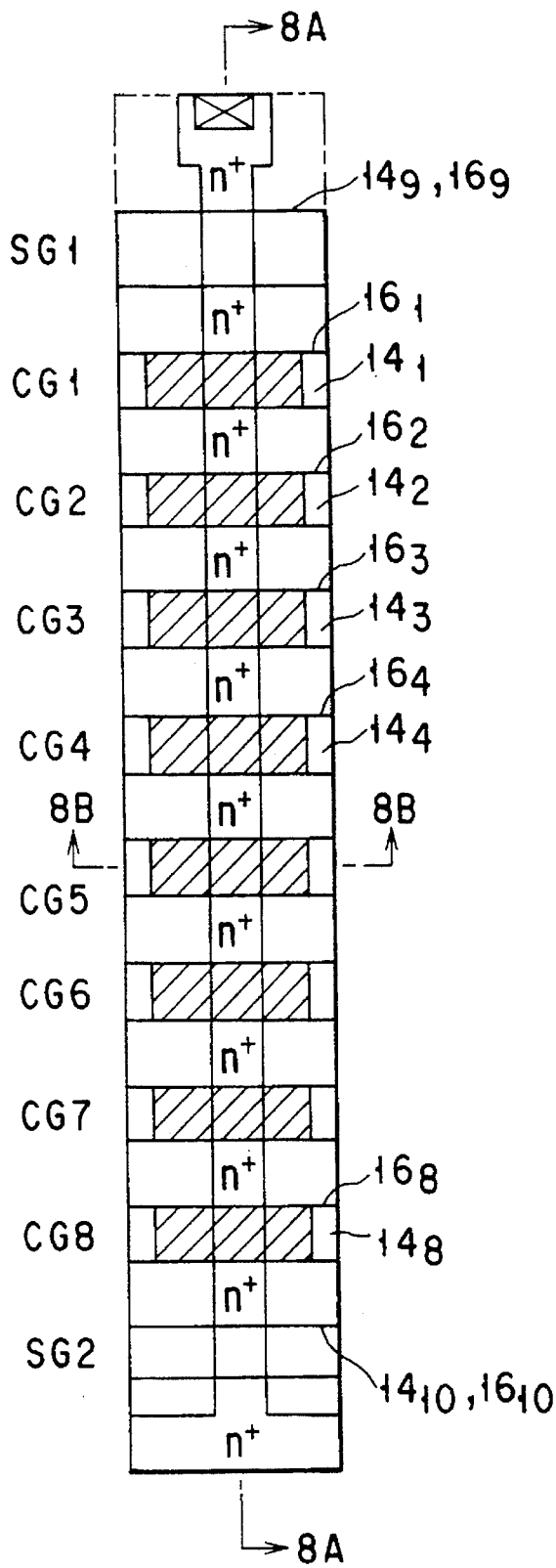
FIG. 7A and FIG. 7B are layout and equivalent circuit diagram of NAND cell in the first embodiment and second embodiment.
Figure 7B:
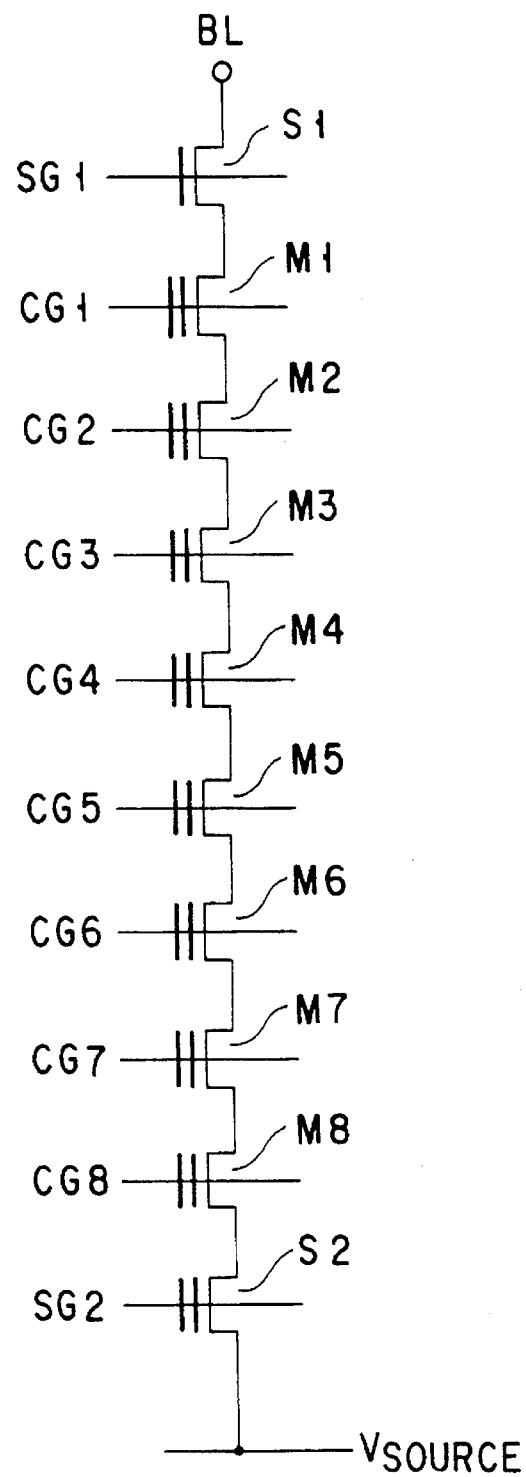

FIG. 7A and FIG. 7B are plan view and equivalent circuit diagram of NAND cell portion of the memory cell array, and FIGS. 8A and 8B are sectional views of 8A—8A and 8B—8B in FIG. 7A, respectively.

In a p-type silicon substrate 11 (or a p-type well) surrounded by an element separation oxide film 12, the memory cell array composed of plural NAND cells is formed. Referring to one NAND cell, in this embodiment, eight memory cells M1 to M8 are connected in series to compose one NAND cell. In the memory cells, floating gates 14 ($14_1$, $14_2$, ..., $14_8$) are formed on the substrate 11 through a gate insulation film 13, and control gates 16 ($16_1$, $16_2$, ..., $16_8$) are formed thereon through an interlayer insulation film 15. The source and drain of these memory cells, that is n-type diffusion layers 19, are connected in a form of sharing between adjacent ones, thereby the memory cells are connected in series.

At the drain side and source side of the NAND cells, selective gates $14_g$, $16_g$, and $14_{10}$, $16_{10}$ formed simultaneously with the control gates are provided respectively. The top of the substrate on which elements are formed is covered with a CVD oxide film 17, and bit lines 18 are disposed thereon. The bit lines 18 contact with the drain side diffusion layer 19 10 at one end of the NAND cell. The control gates 14 of the NAND cell arranged in the line direction are commonly disposed as control gate lines CG1, CG2, ..., CG8. These control gate lines are word lines. The selective gates $14_g$, $16_g$, and $14_{10}$ and $16_{10}$ are also disposed as selective gate lines SG1, SG2 continuously in the line direction.

The gate insulation film 13 between the selective gates $14_g$, $14_{10}$ and substrate 11 may be made thicker than the gate insulation film 13 of the memory cell portions in order to enhance the reliability.

FIG. 9 shows an equivalent circuit of the memory cell array in which such NAND cells are arranged in matrix.

Figure 10:
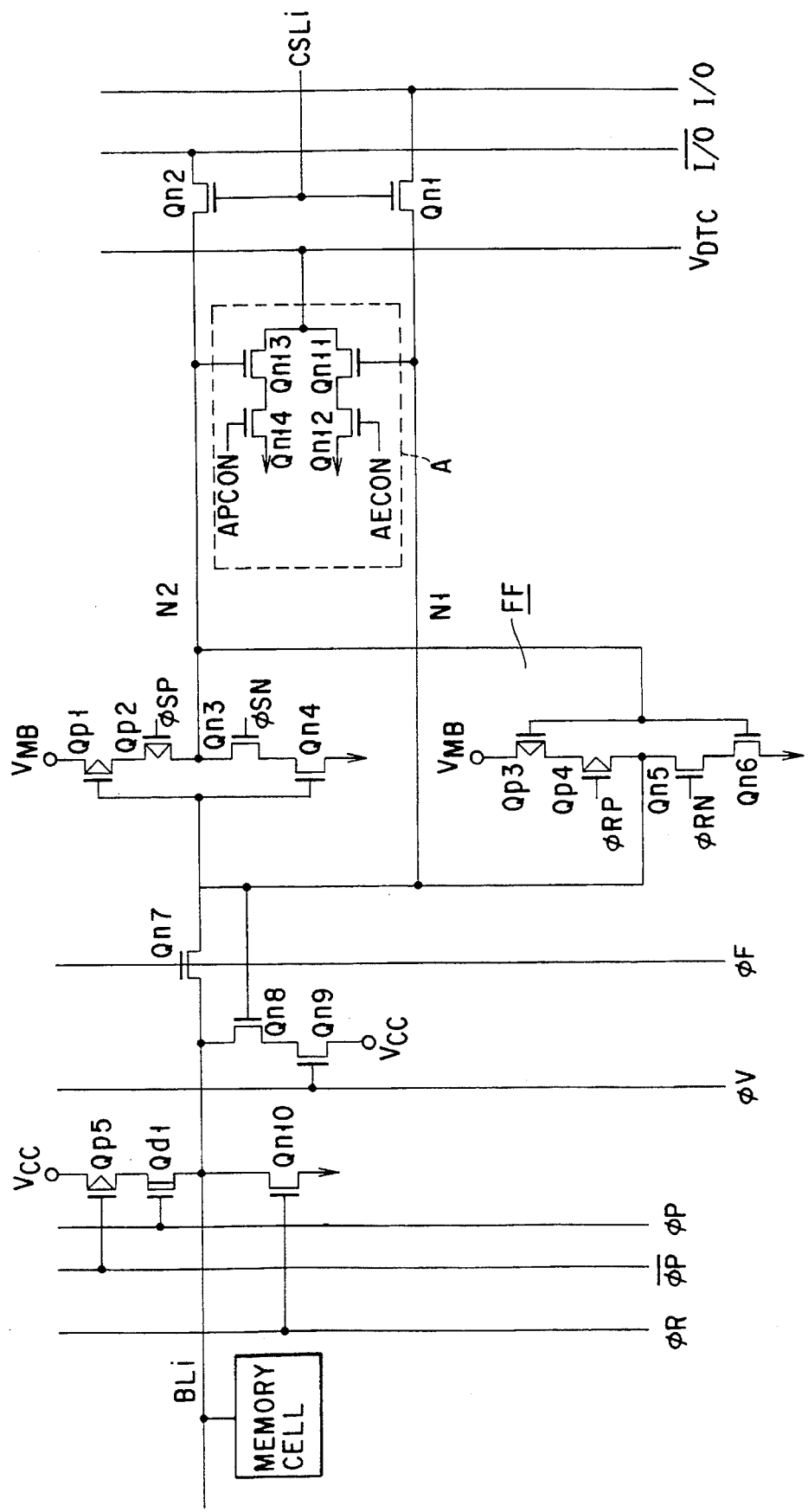
FIG. 10 is a diagram showing the constitution of bit line control circuit and latch data detecting circuit in the first embodiment.

FIG. 10 shows specified circuits of control circuit 2 and latch data detecting circuit A in FIG. 6. The CMOS flip-flop FF for composing the sense amplifier/data latch circuit in the embodiment is composed of a signal synchronous type CMOS inverter comprising a type p-channel MCS transistors Qp1, Qp2 and type n-channel MOS transistors Qn3, Qn4 and a signal synchronous type CMOS inverter comprising E type p-channel MOS transistors Qp3, Qp4 and E type n-channel MOS transistors Qn5, Qn6.

The output node N1 of the CMOS flip-flop FF and bit line BLi are connected through an E type n-channel MOS transistor Qn7 controlled by a signal φF.

Between the bit line BLi and power source VCC, an E type n-channel MOS transistor Qn8 controlled by the output node N1 of the flip-flop FF and an E type n-channel MOS transistor Qn9 controlled by signal φV are connected in series. By these transistors, in program verify read operation, the bit line BLi is charged at VCC–Vth depending on the data of the CMOS flip-flop FF.

An E type p-channel MOS transistor Qp5 and a D type n-channel MOS transistor QD1 form a circuit for precharging the bit line BLi to VCC. The transistor QD1 is provided in order to prevent application of high voltage to the transistor Qp5 at the time of erase or program. An E type n-channel MOS transistor Qn10 is a reset transistor for resetting the bit line BLi to 0 V.

Two nodes of CMOS flip-flop FF are connected to input and output lines IO and/IO through the E type n channel MOS transistors Qn1 and Qn2 which are transfer gates controlled by a column select signal CSLi.

The constitution of the latch data detecting circuit A is described below. An E type n-channel MOS transistor Qn11 controlled by the output node N1 of the CMOS flip-flop FF, and an E type n-channel MOS transistor Qn12 controlled by a signal AECON are connected in series. By these transistors, the program/erase completion detecting signal VDTC is set to "L" level when N1 is at "H" at the time of erase every read operation. Moreover, an E type n-channel CMOS flip-flop, and an a type n-channel MOS transistor Qn14 controlled by a signal APCON are connected in series. By these transistors, the program/erase completion detecting signal VDTC is set to "L" level when N2 is at "H" level at the time of program verify read operation.

Figure 11:
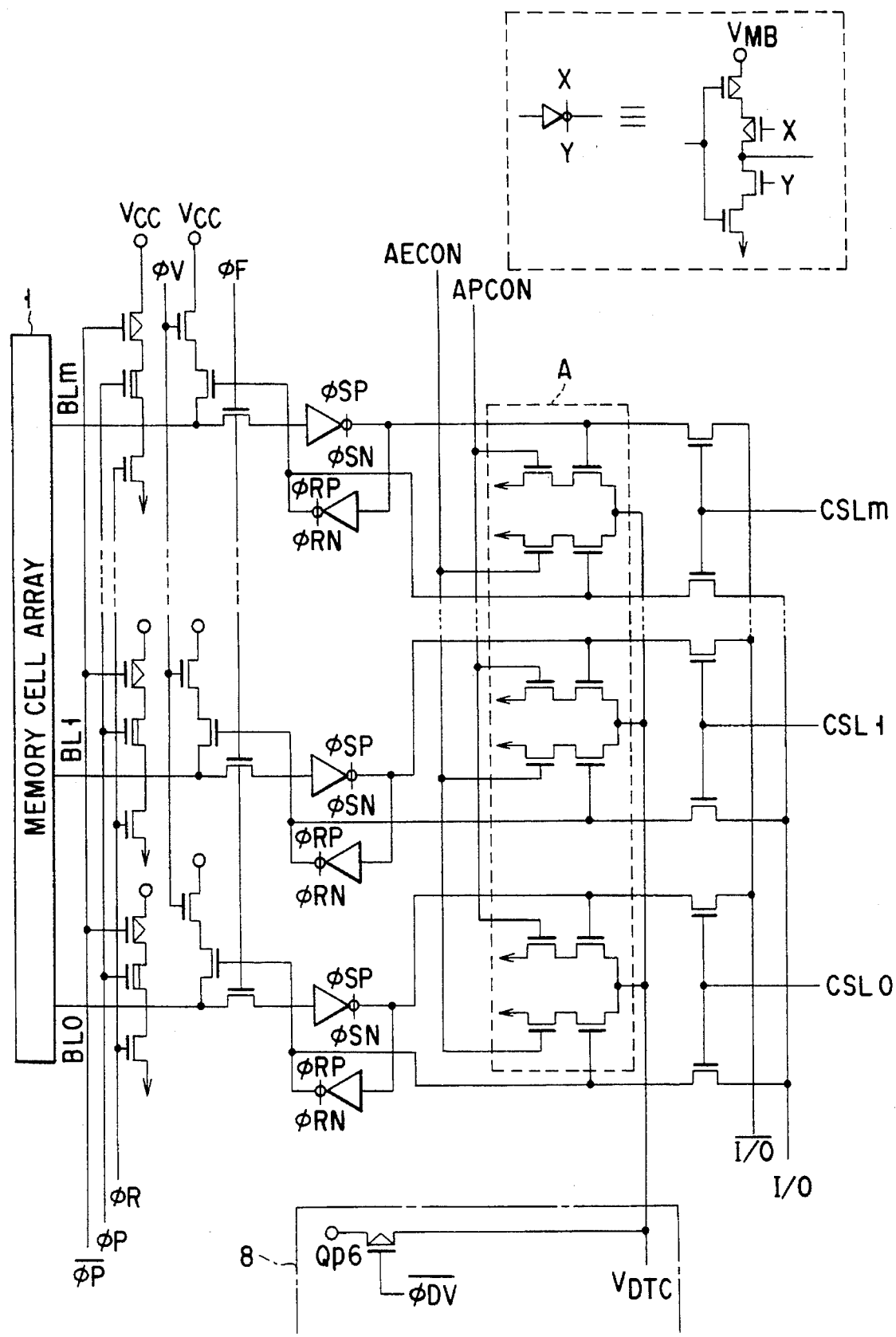
FIG. 11 is a diagram showing the connection of bit line control circuit with other circuits in the first embodiment.

FIG. 11 shows a connection relation a precharge circuit section (corresponding to Qp6) of the bit line control circuit 2, latch data detecting circuit A, memory cell array 1 and program/erase completion detecting circuit 8.

The E type p-channel MOS transistor Qp6 for composing a precharge circuit section of the program/erase completion detecting circuit 8 precharges the program/erase completion detecting signal VDTC to VCC before the program/erase completion detecting operation. As enclosed by broken line in FIG. 11, meanwhile, the flip-flop FF is symbolized for the sake of convenience.

Next is explained the circuit operation in program and program verification operation (program verify read) in the embodiment. In the following explanation, one NAND cell is composed of a series circuit of eight memory cells and it is the same if the number of memory cells in one NAND cell is other than 8 (for example, 4, 16, 32). The program/erase completion detecting circuit 8 further comprises VDTC potential detecting circuits (FIG. 25A to FIG. 25C) in addition to the transistor Qp8.

Before programming, the data in the memory cell provides the p-type substrate (or p-type well) on which the cells are formed with about 20 V (Vpp), and erases the control gates CG1 to CG8 as 0 V. At this time, the threshold voltage of the memory cell is 0 V or less. The erase operation is described in detail below.

Figure 12:
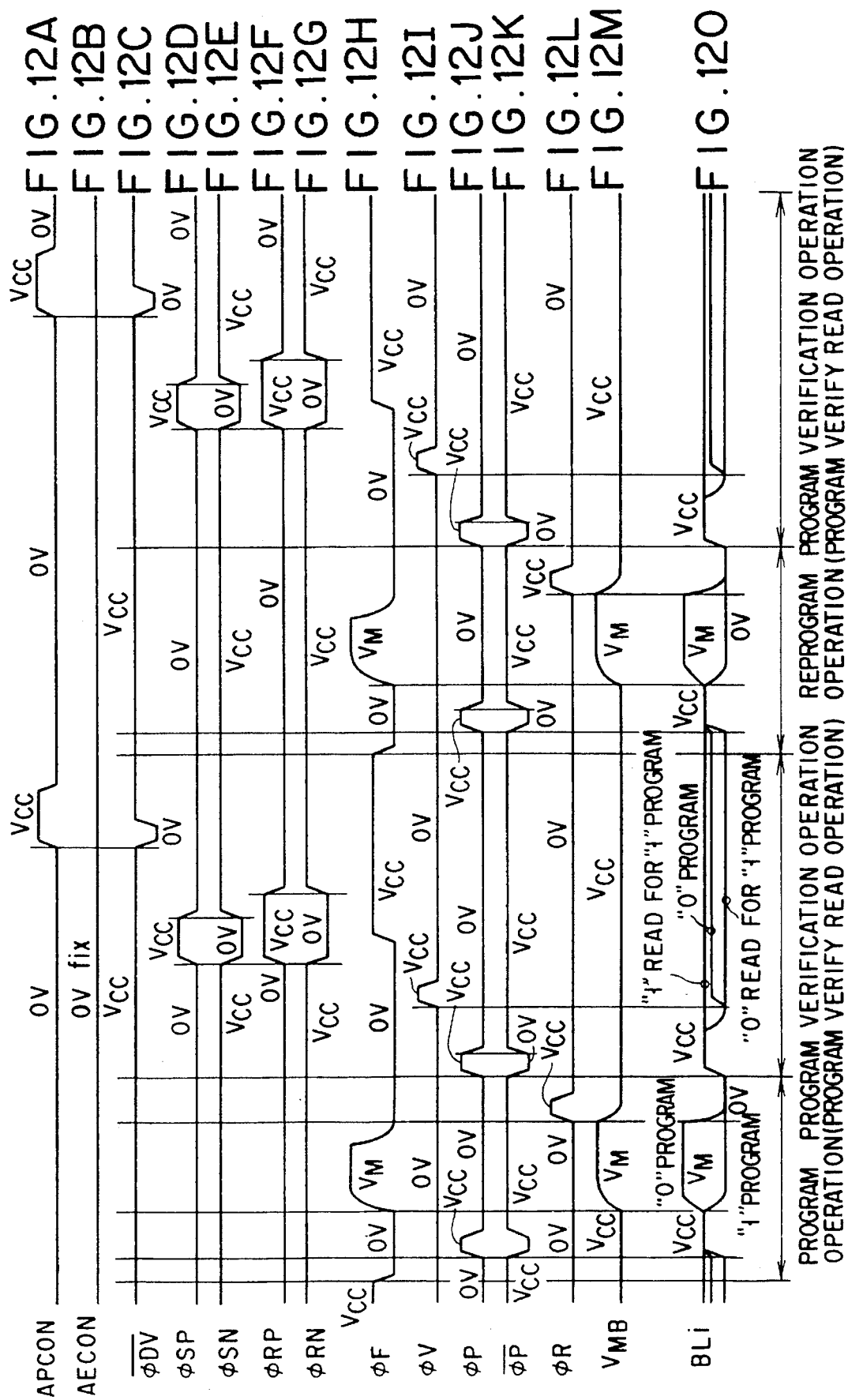
FIG. 12 is a timing chart showing data program/program-verification operation in the first embodiment.

FIG. 12 shows the operation in program/program-verification. After the program data is latched from the input and output lines IO and/IO into the CMOS flip-flop FF, the precharge signal φP becomes "H" and/φP becomes "L", so that the bit line BLi is precharged to VCC. In succession, the voltage VMB and φF change to intermediate potential VM (up to 10 V). By the latched data, the bit line BLi becomes 0 V or VM. In the case of "1" program, it is 0 V, and in the case of "0" program, it is VM. At this time, the selective gate SG1 is VM, SG2 is 0 V, and in the control gate, when CG2 is selected, GC1 is VM, CG2 is high voltage Vpp (up to 20 V), and CG3 to Cg8 are VM. After the selective gates SG1, SG2 and control gates CG3 to CG8 are reset to 0 V, the signal φF becomes "L" and the reset signal φR becomes "H", and the bit line BLi is reset to 0 V. In succession, program verification operation is effected.

In the program verification operation, in the first place, the precharge signal φP becomes "H" and /φP becomes "L", and the bit line BLi is precharged to VCC. Afterwards, the selective gates and control gates are driven by the row decoder 5. After the selective gates SG1, SG2, control gates CG1 to CG8 are reset, the program verify signal φV becomes "H", and VCC–Vth is issued only to the "0" written bit line BLi. Afterwards, φSP, φRP become "H", φSN, φRN become "L", and φF becomes "H".

After the bit line potential is sensed as the signal φSP becomes "L" and φSN becomes "H", the signal φRP becomes "L" and φRN becomes "H", and the reprogram data is latched. At this time, the relation of the program data, memory cell data, and reprogram data is as shown in Table 1.

TABLE 1

| program data | 1100 |
|---|---|
| data of memory cell | 0101 |
| reprogram data | 1000 |

Afterwards, if the program/erase completion detecting signal/φDV becomes "L" or program verify data detecting signal APCON becomes "H" the program/erase completion detecting signal VDTC becomes "H" as far as all reprogram data are "0" (that is, N2 nodes in all data latch circuits are "L" level). If only one data is "1" (that is, if only one N2 node is "H" level) in the flip-flop FF, the VDTC becomes "L". The program/erase verification operation is repeated until VDTC becomes "H". The result of detection is sent out to outside of the chip from the data IO pin or READY/BUSY pin.

The circuit operation in erase and erase verification (erase verify read) operation using the circuits in FIG. 10 and FIG. 11 is explained below.

Figure 13:
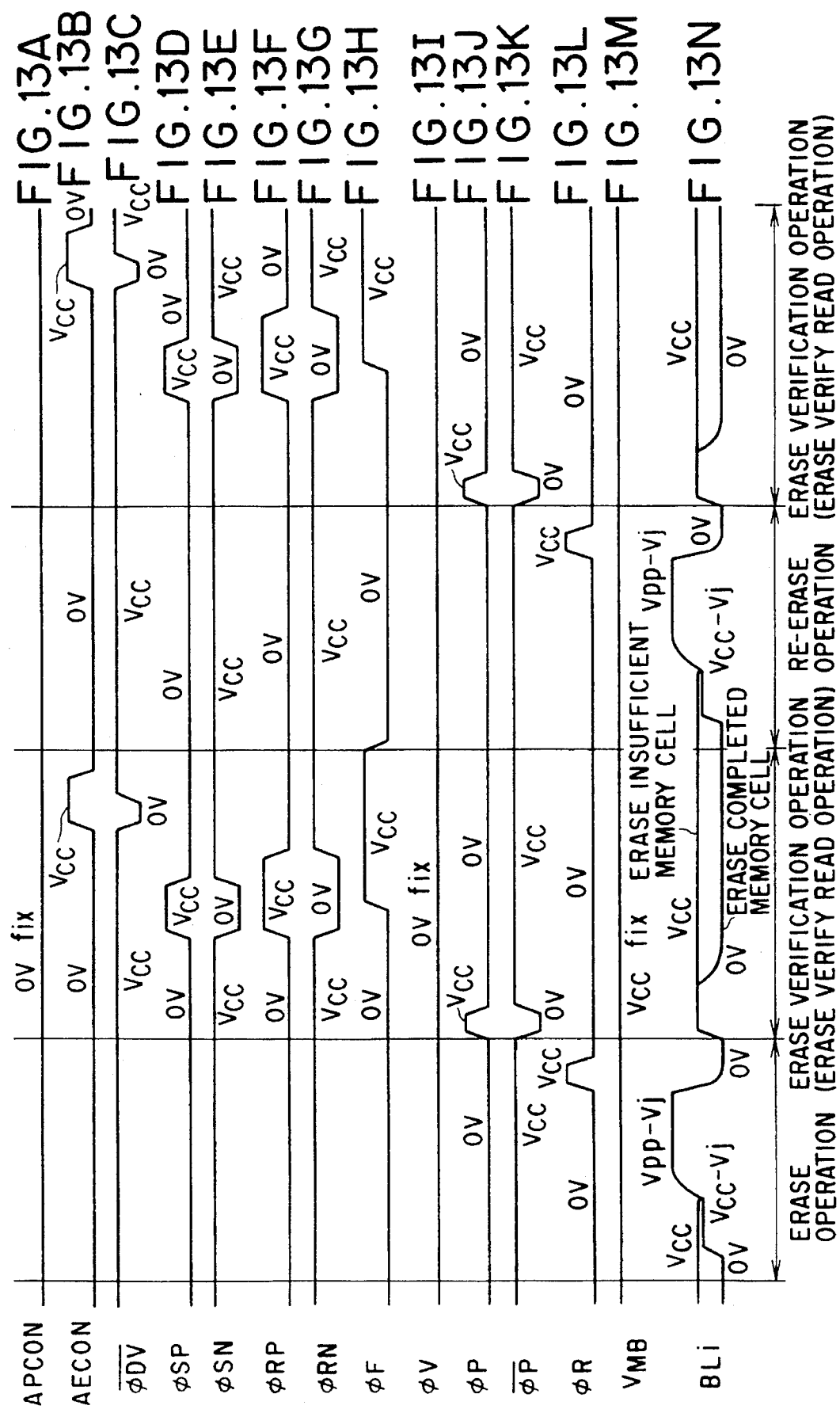
FIG. 13 is a timing chart showing data erase/erase-verification operation in the first embodiment.

FIG. 13 shows the operation in erase/erase-verification. In erase operation, the source lines (Vsource in FIG. 7 and FIG. 9) in all selective gates, control gates in non-selected blocks, p-type well or p-type substrate in which memory cells are composed, and memory cells are changed from 0 V to VCC. At this time, if the bit lines are at a higher voltage than (VCC–Vj) (where VJ is the potential drop when the pn-junction composed of p-type well and n+ is in forward bias), they are kept at the same voltage, and if the bit lines are lower than (VCC–Vj), a pn-junction forward bias current flows from p-type well to n+, so that the bit lines are charged at (VCC–Vj) (see FIG. 8A).

Successively, when the source lines in all selective gates, control gates in non-selected blocks, p-type well or p-type substrate in which memory cells are composed and memory cells are changed from VCC to Vpp (where Vpp is a higher voltage than VCC up to 20 V), the bit lines are changed from (VCC–Vj) to (Vpp–Vj). After this state is kept for a while, the source lines in all selective gates, control gates in non-selected blocks, p-type well or p-type substrate in which memory cells are composed and memory cells are changed from Vpp to 0 V, and the bit line reset signal φR is changed from 0 V to VCC, so that the bit line BLi is reset to 0 V. In succession, erase verification operation starts.

In erase verification operation, first the precharge signal φP becomes "H",/φP becomes "L", and the bit line BLi is precharged to VCC. Then the selective gates and control gates are driven by the row decoder 5. After the selective gates SG1, SG2, and control gates CG1 to CG8 are reset, φSP and φRP become "H", φSN and φRN become "L", and φF becomes "H". After the bit line potential is sensed, the signal φSP becomes "L" and φSN becomes "H", the signal φRP becomes "L" and φRN becomes "H", and the read data is latched.

Afterwards, the program/erase completion detecting signal/φDV becomes "L" and the erase verify data detecting signal AECON becomes "H", and when N1 nodes in all data latch circuits are "L" level, the program/erase completion detecting signal VDTC becomes "H". If any one N1 node is "H" in the data latch circuit, the VDTC is "L". The erase and erase verification operations are repeated until the VDTC becomes "H". The result of detection is sent out from the data IO pin or READY/BUSY pin.

Potentials of bit line BLi, selective gates SG1, SG2 in the selected blocks, and control gates CG1 to CG8 in the selected blocks in erase program, read, program verification and erase verification operations in the embodiment are shown in Table 2. Herein, CG2 is selected. Table 2 refers to an example of VCC=3 V.

TABLE 2

| | | program | | | program | erase |
|---|---|---|---|---|---|---|
| | erase | "0" | "1" | read | verify | verify |
| BLi | floating | 10V | 0V | 3V | 3V | 3V |
| SG1 | 20V | 10V | 10V | 3V | 3V | 3V |
| CG1 | 0V | 10V | 10V | 3V | 3V | 0V |
| CG2 | 0V | 20V | 20V | 0V | 0.5V | 0V |
| CG3 | 0V | 10V | 10V | 3V | 3V | 0V |
| CG4 | 0V | 10V | 10V | 3V | 3V | 0V |
| CG5 | 0V | 10V | 10V | 3V | 3V | 0V |
| CG6 | 0V | 10V | 10V | 3V | 3V | 0V |
| CG7 | 0V | 10V | 10V | 3V | 3V | 0V |
| CG8 | 0V | 10V | 10V | 3V | 3V | 0V |
| SG2 | 20V | 0V | 0V | 3V | 3V | 3V |
| SL | 20V | 0V | 0V | 0V | 0V | 0V |
| SB | 20V | 0V | 0V | 0V | 0V | 0V |

Where, BLi is a bit line, SG1 and SG2 are selective gates, CG1 to CG8 are control gates, SL is a source line and SB is p-well or substrate (this reference symbol is the same as the following tables).

In the embodiment as described above, after programming data, a specified verify potential (for example, a potential set in the intermediate potential, which corresponds to 0.5 V shown in Table 2, between the source potential and grounding potential) is applied to the control gate of the memory cell, and the threshold voltage of the memory cell is evaluated by the bit line control circuit 2. If there is any memory cell not reaching the specified threshold voltage, program operation is added only for that memory cell, and later the threshold voltage is evaluated again. By repeating this operation, after confirming that the threshold voltages in all memory cells settle within the desired allowable range, the program operation is completed. That is, by repeating data program gradually while checking the degree of progress, the threshold voltage distribution of the memory cell array finally completed in data program can be narrowed.

In the embodiment, by directly connecting the node N1 of the CMOS flip-flop FF, to the gate of the detecting transistor Qn11, and the node N2 to the gate of the detecting transistor Qn13, data latch is detected by Qn11, Qn13. Accordingly, as compared with the constitution in FIG. 3, VCC is applied instead of VCC–Vth, to the gate of the detecting transistor as "H" level potential, so that the voltage drop of the threshold voltage can be suppressed. Therefore, if the source potential is low, the reliability is high, and high speed program/erase verify read operation is realized.

(Second Embodiment)

Figure 14:
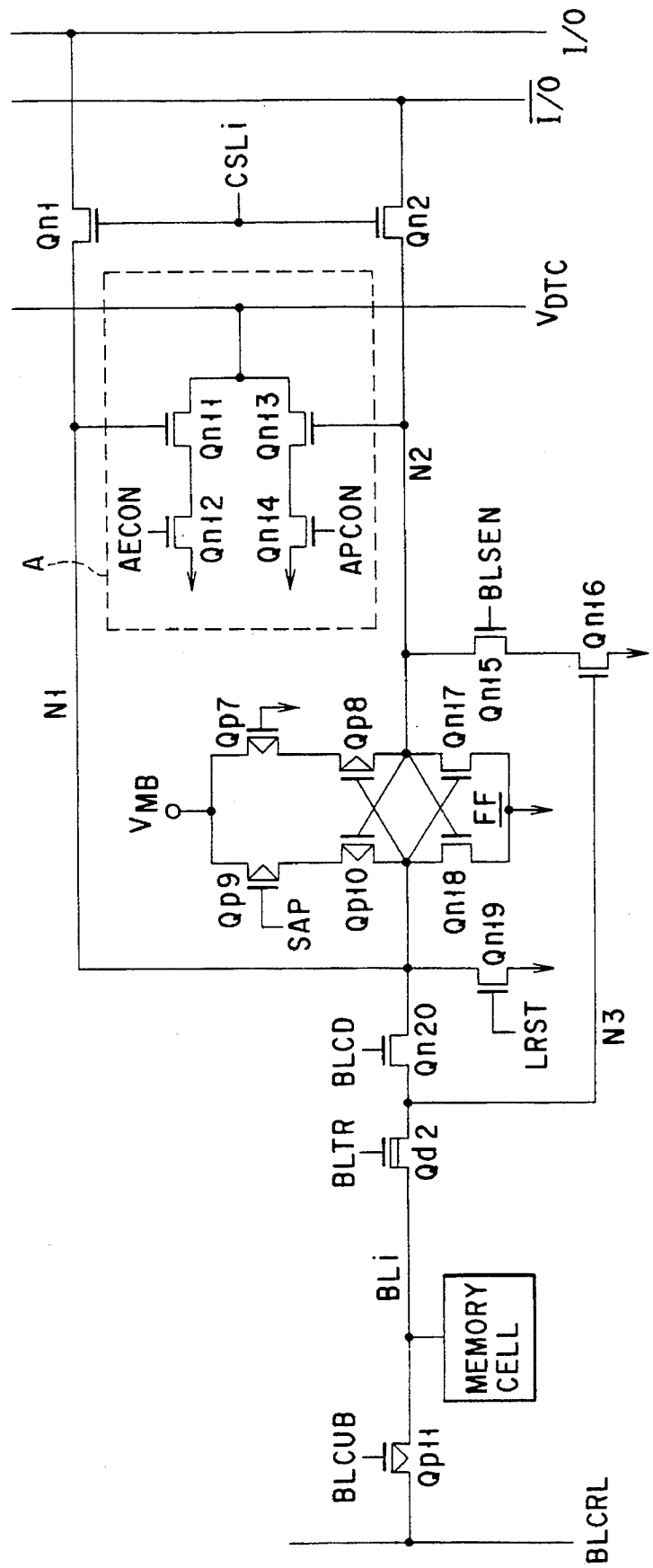
FIG. 14 is a diagram showing the constitution of bit line control circuit and latch data detecting circuit in the second embodiment.

FIG. 14 shows the constitution of bit line control circuit and latch data detecting circuit of a NAND cell type EEPROM in a second embodiment of the invention. The basic constitution of the EEPROM is the same as in FIG. 6.

The CMOS flip-flop FF for composing a sense amplifier/data latch circuit in the embodiment is composed of a signal synchronous CMOS inverter comprising E type p-channel CMOS transistors Qp7, Qp8 and an E type n-channel MOS transistor Qn17 and a signal synchronous CMOS inverter comprising E type p-channel MOS transistors Qp9, Qp10 and an E type n-channel MOS transistor Qn18.

The output node N1 of the CMOS flip-flop FF and the bit line BLi are connected through an E type n-channel MOS transistor Qn20 controlled by signal BLCD, and a D type n-channel MOS transistor Qd2 controlled by signal BLTR.

Between the output node N2 of the CMOS flip-flop FF and Vss (0 V potential), the E type n-channel MOS transistor controlled by the node N3 at which the transistors Qn20 and Qd2 are connected, and the E type are connected in series. By these transistors, the memory cell data of "0" or "1" is read out by the voltage of the bit line in normal read, program verify read, and erase verify read operation. Between the output node N1 of the CMOS flip-flop FF and Vss (0 V potential), the E type n-channel MOS transistor Qn19 controlled by signal LRST is connected, and when signal LRST becomes "H" level, the latch data of the flip-flop FF is reset, that is, the node N1 is set to "L" level.

The E type p-channel MOS transistor Qp11 controls to precharge the bit line to VCC, VM or Vpp. The transistor Qd2 is intended to prevent application of high voltage to the transistor Qn1 in erase operation. Two nodes of the CMOS flip-flop FF are connected to input and output lines IO and /IO through E type n-channel MO, transistors Qn1, Qn2 which are transfer gates controlled by the column selecting signal SCLi.

The constitution of the latch data detecting circuit A is described below.

The E type n-channel MOS transistor Qn11 controlled by the output node N1 of the CMOS flip-flop FF and the E type n-channel MOS transistor Qn12 controlled by signal AECON are connected in series. By these transistors, the program/erase completion detecting signal VDTC is set to "L" level when the N1 is at "H" level in erase verify read Qn13 controlled by the output node N2 of the CMOS flip-flop, and the E type n-channel MOS transistor Qn14 controlled by signal APCON are connected in series. By these transistors, the program/erase completion detecting signal VDTC is set to "L" level when the N2 is at "H" level in program verify read operation.

FIG. 15 shows a connection relation of a precharge circuit section (corresponding to Qp6) of the bit line control circuit 2, latch data detecting circuit A, memory cell array 1 and program/erase completion detecting circuit 8.

The E type p-channel MOS transistor for composing the precharge circuit section of the program/erase completion detecting circuit 8 precharges the program/erase completion detecting signal VDTC to VCC before the program/erase completion detecting operation. As enclosed by broken line in FIG. 15. meanwhile, the flip-flop FF is symbolized for the sake of convenience. The circuit operation in program and program verification (program verify read) operation in the embodiment is described below. In the following explanation, one NAND cell is constituted in a series circuit of eight memory cells. The program/erase completion detecting circuit 8 includes the VDTC potential detecting circuit (FIGS. 25A to 25C) in addition to the transistor Qp6.

Before programming, the data in the memory cell provides the p-type substrate (or p-type well) in which the cell is formed with about 20 V (Vpp), and erases the control gates CG1 to CG8 as 0 V. At this time, the threshold voltage of the memory cell is 0 V or less. The erase operation is described below.

Figure 16:
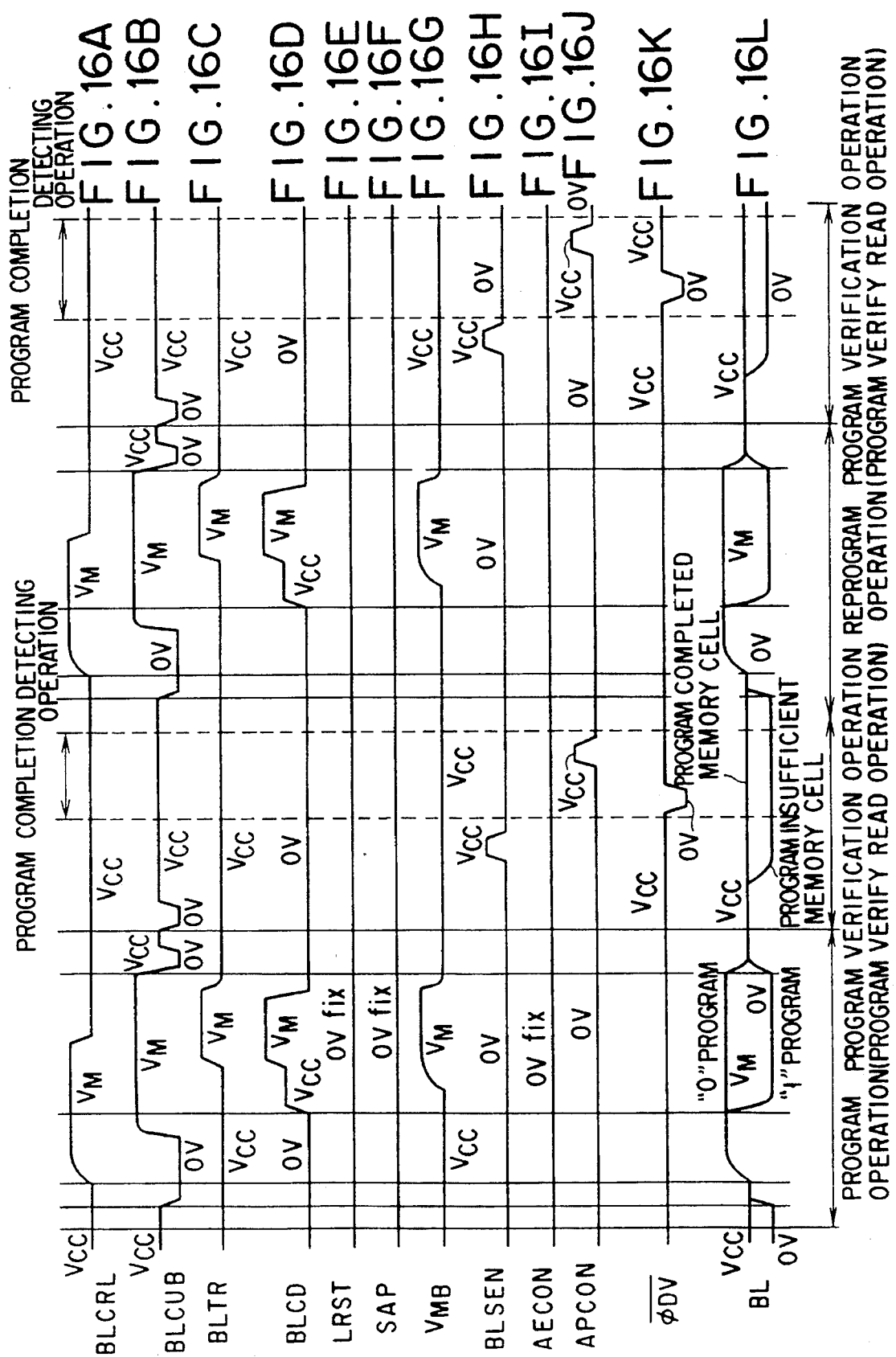
FIG. 16 is a timing chart showing data program/program-verification operation in the second embodiment.

FIG. 16 shows the program/program-verification operation. After the written data is latched in the CMOS flip-flop FF from the input and output lines IO and /IO, the precharge signal BLCUB becomes "L", and the bit line BLi is precharged at VCC. In succession, the precharge voltage BLCRL is changed from VCC to VM, and the bit line BLi is changed from VCC to VM, too, and the precharge signal BLCUB becomes VM, and thereby the transistor Qp11 is turned off.

Consequently, the signal BLCD becomes VCC, and the bit line is kept at VM by the latched data or becomes 0 V. In the case of "1" program, it is 0 V, and in the case of "0" program, it is VM. Then VMB becomes VM, and signal BLTR and signal BLCD also become VM. The selective gate SG1 is VM and SG2 is 0 V, and when the control gate CS2 is selected. CG1 is VM and CG2 is high voltage Vpp (up to 20 V), and CG3 to CG8 are VM, and this state is maintained for a while.

After the selective gates SG1, SG2, and control gates CG1 to CG8 are reset to 0 V, the signal BLCD becomes "L" and the signal BLCUB becomes "L". At this time, since the BLCRL is at VCC potential, the bit line BLi is VCC. It is now followed by program verification operation.

In program verification operation, first the precharge signal BLCUB becomes "L" and the bit line BLi is precharged to VCC. By the row decoder 5, afterwards, the selective gates and control gates are driven. After the selective gates SG1, SG2 and control gates CG1 to CG8 are reset, the bit line potential detecting signal BLSEN becomes "H". At this time, data is invariable regardless of the voltage of the bit line, and the node N1 remains at "H". In the flip-flop FF, on the other hand, in which the node N1 of the latch is "L" before program verification operation, the node N1 is kept at "L" if the voltage of the bit line is higher than the threshold voltage of the transistor Qn16, and if the voltage of the bit line is higher than the threshold voltage of the transistor Qn16, the transistor Qn16 is turned on, and the node N1 is changed from "L" to "H" (because the node N2 is changed from "H" to "L").

In this way, reprogram data is read out and latched in the flip-flop FF. At this time, the relation of program data, memory cell data, and reprogram data is as shown in Table 1.

Afterwards, the program/erase completion detecting signal/$\phi$DV becomes "L" and the VDTC node is precharged to VCC, and then the program/erase completion detecting signal $\phi$DV returns to "H", and in succession the program verify data detecting signal APCON becomes "H". At this time, if all reprogram data are "0" (that is, N2 nodes in all flip-flops FF are at "L" level), the program/erase completion detecting signal VDTC becomes "H". If any one data is "1" (that is, if any one N2 node is at "H" level) in the flip-flop FF, the VDTC is "L". The program, program verification operations are repeated until VDTC becomes "H". The result of detection is sent out from the data IO pin or READY/BUSY pin.

Next is explained the circuit operation in erase and erase verification (erase verify read) operation using the circuits in FIG. 14 and FIG. 15.

Figure 17:
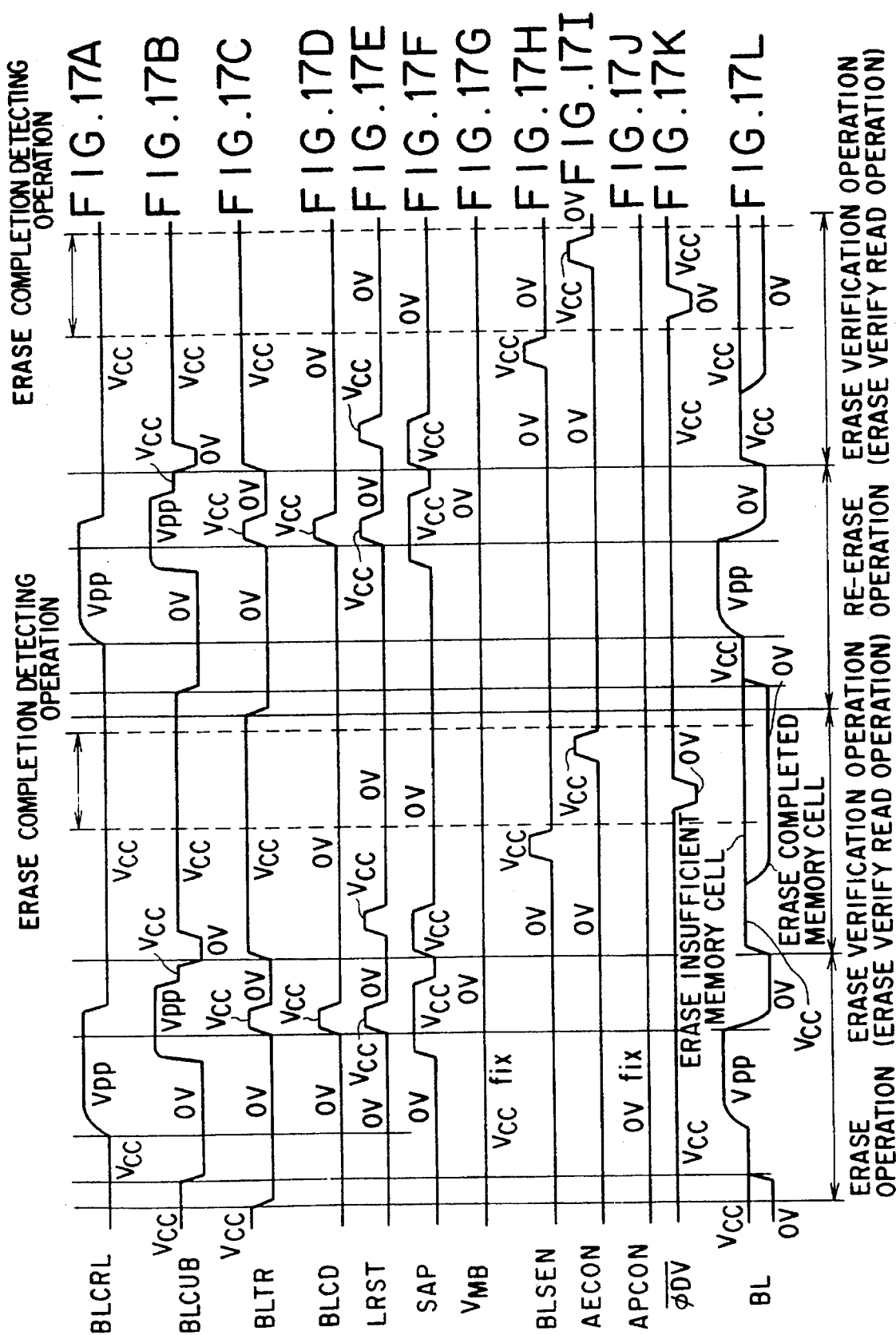
FIG. 17 is a timing chart showing data erase/erase-verification operation in the second embodiment.
Figure 19:
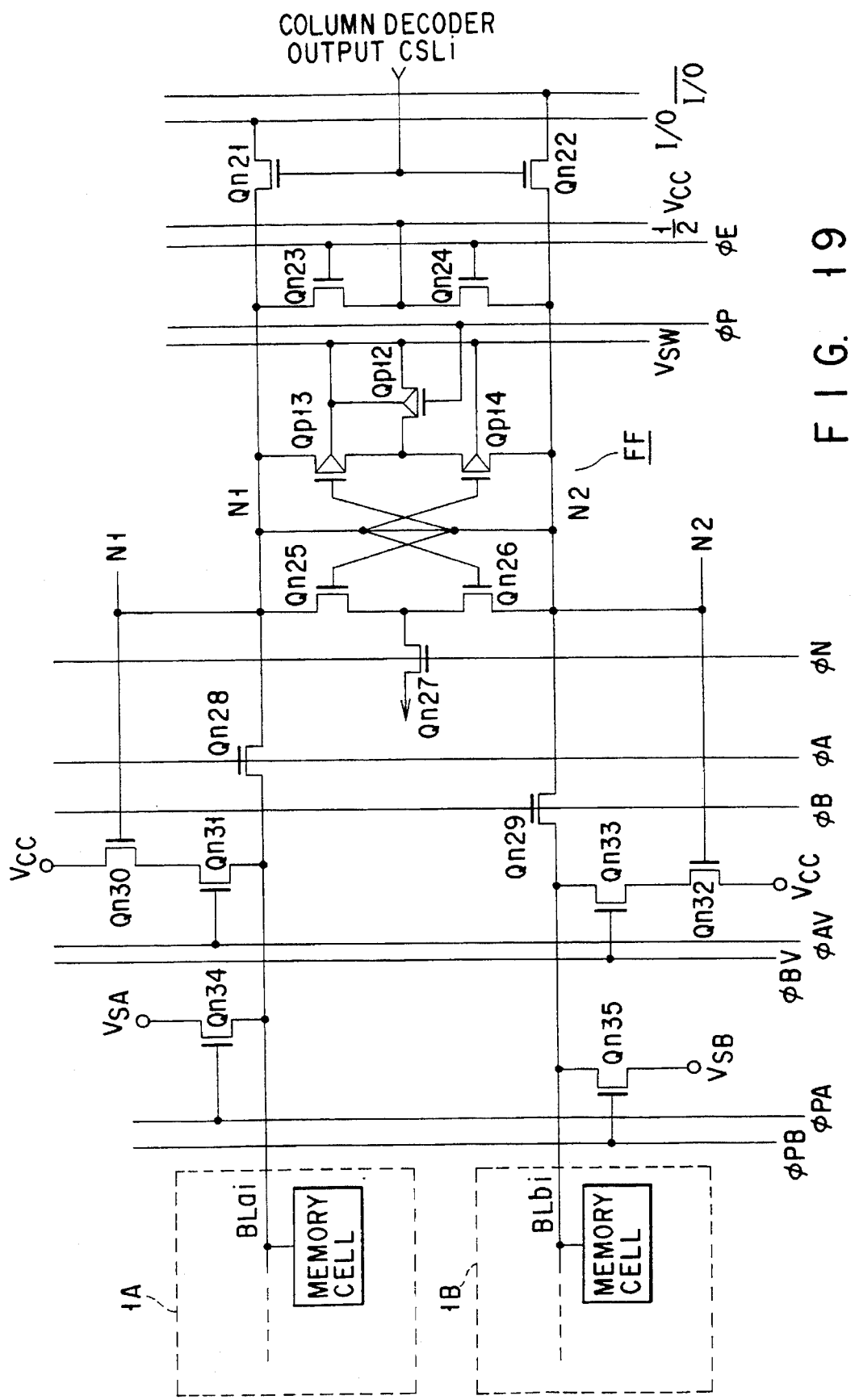
FIG. 19 is a diagram showing the constitution of a bit line control circuit in the third embodiment.
Figure 22:
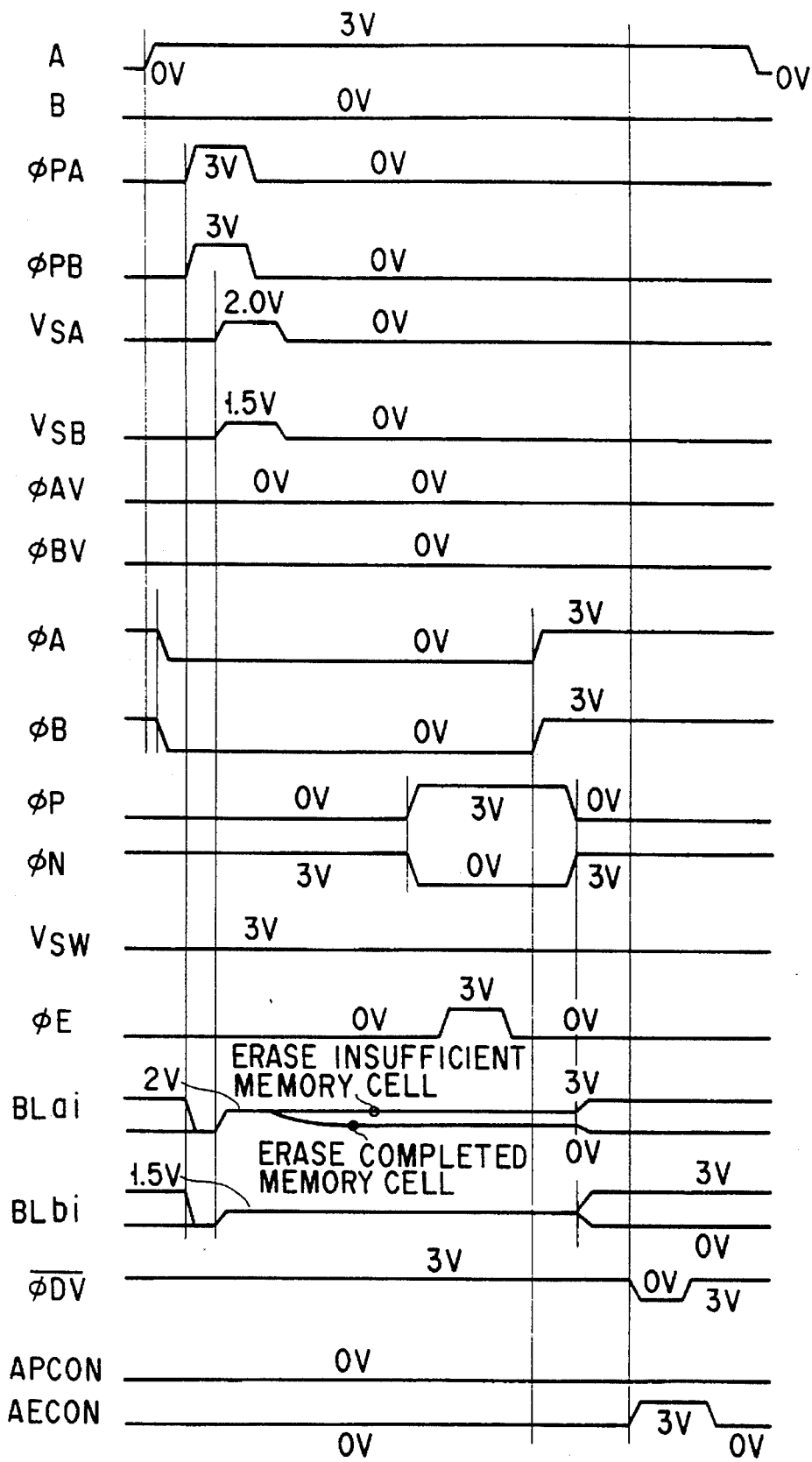
FIG. 22 is a timing chart showing erase verification operation in the third embodiment.

FIG. 17 shows the operation in erase/erase-verification. In erase operation, first the signal BLTR becomes "L". The source lines (Vsource in FIGS. 7 and 9) in all selective gates, control gates in non-selected blocks, p-type well or p-type substrate in which memory cells are formed, and memory cells are changed from 0 V to VCC. At this time, since the precharge signal BLCUB becomes "L", and the bit line is also charged to the BLCRL potential, that is, VCC.

Consequently, the source lines in all selective gates, control gates in non-selected blocks, p-type well or p-type substrate in which memory cells are formed, and memory cells are changed from VCC to Vpp (Vpp is a higher voltage than VC, being up to 20 V). At the same time, the BLCRL is also changed from VCC to Vpp, and the bit line is also charged to change from VCC to Vpp.

After this state is maintained for a while, the source lines in all selective gates, control gates in non-selected blocks, p-type well or p-type substrate in which memory cells are formed, and memory cells are changed from Vpp to 0 V.

The precharge signal BLCUH is changed from 0 V to Vpp, and application of Vpp potential to the bit line is stopped. The signal SAP is set to VCC to turn off the transistor QP9, and the signals BLTR, BLCD, LRST are set to VCC potential, and the bit line BLi is reset to 0 V. It is then followed by erase verification operation.

In erase verification operation, first, the precharge signal BLCUB is changed to "L" and the bit line BLi is precharged at VCC. The signal SAP is set to VCC, and the transistor QP9 is turned off, and the signal LRST is set to VCC and the nodes N1 of all flip-flops FF are reset to "L" level. Then, by the row decoder 5, the selective gates and control gates are driven.

After the selective gates SG1, SG2 and control gates CG1 to CG8 are reset, the bit line potential detecting signal BLSEN becomes "H". Before the signal BLSEN becomes "H", since nodes N1 of all latches are "L", the node N1 is changed from "L" to "H" when the voltage of the bit line is higher than the threshold voltage of the transistor Qn16 and if the voltage of the bit line is lower than the threshold voltage of the transistor Qn16, the node N1 is kept at "L". In this way, the data in the memory cells in the selected blocks are read out into the flip-flop FF, and are latched.

Later the program/erase completion detecting signal/$\phi$DV becomes "L" and the VDTC node is precharged to VCC, and the program/erase completion detecting signal/$\phi$DV returns to "H" and the erase verify data detecting signal AECON becomes "H". At this time, if all reprogram data are "0", that is, if N1 nodes in all flip-flops FF are at "L" level, the program/erase completion detecting signal VDTC becomes "H". If any one data is "1", that is, if any one N1 node is at "H" level in the flip-flop FF, the VDTC is "L". The erase and erase verification operations are repeated until the VDTC becomes "H". The result of detection is sent out from the data IO pin or READY/BUSY pin.

The potentials of the bit line BLi, selective gates SG1, SG2 in selected blocks, and control gates CG1 to CG8 verification and erase verification operations in the embodiment are shown in Table 2. Herein, the case of selecting CG2 is shown. Table 2 refers to an example of VCC=3 V. Thus, also in the case of the circuit configuration as in FIGS. 14 and 15, the voltage of the parts in Table 2 (except for bit line BLi in erase operation) is the same as in the circuit configuration in FIGS. 10, 11.

(Third Embodiment)

FIG. 18 is a block diagram showing a schematic constitution of a NAND cell type EEPROM in a third embodiment of the invention. The basic constitution is the same as in FIG. 6 except that the cell array 1 is divided into two blocks 1A, 1B, and the bit line control circuit 2 is provided commonly for these cell blocks 1A, 1B.

FIG. 19 and FIGS. 20A to 20C show the constitution of the bit line control circuit 2, latch data detecting circuit A, and a precharge section (corresponding to Qp15) of program/erase completion detecting circuit 8.

A flip-flop FF is composed of E type n-channel MOS transistors Qn25, Qn26, and E type p-channel MOS transistors Qp13, Qp14. The E type n-channel MOS transistors Qn23, Qn24 are equalizing transistors of the flip-flop FF, p-channel MOS transistor Qp12 are activating transistors for the flip-flop FF, E type n-channel MOS transistors Qn28, Qn29 are connecting transistors of two nodes N1, N2 of the flip-flop FF and bit lines BLai (i=0, 1, 2, ...) and BLBi (i=0, 1, 2, ...) in the cell array blocks 1A, 1B, E type n-channel MOS transistors Qn30 to Qn33 are transistors for charging bit lines to (VCC–Vth) depending on the data, and Qn34, Qn35 are bit line precharge resetting transistors.

Moreover, an E type n-channel MOS transistor Qn36 controlled by the output node N1 of the flip-flop FF, and an E type n-channel MOS transistor Qn37 controlled by signal L are connected in series. By these transistors, the program/erase completion detecting signal VDTC is set to "L" level when N1 is at "H" level in program verify read operation or erase verify read operation. Furthermore, an E type n-channel MOS transistor Qn38 controlled by the output node N2 of the CMOS flip-flop, and an E type n-channel MOS transistor Qn39 controlled by signal R are connected in series. By these transistors, the program/erase completion detecting signal VDTC is set to "L" level when the N2 is at "H" level in program verify read operation or erase verify read operation.

An E type p-channel MOS transistor Qp15 forming a precharge circuit section of the program/erase completion detecting signal 8 issues a program/erase completion detecting signal VDTC. The program/erase completion detecting circuit 8 also includes a VDTC potential detecting circuit (FIGS. 25A to 25C), aside from, the transistor Qp15.

In thus constituted EEPROM, the program operation and verification operation are described while referring to FIG. 21.

Herein it is supposed that the bit line BLai of the memory cell array 1A is selected. Same as in the foregoing embodiments, instead of 0 V, 0.5 V, for example, is applied to the selected control gate. First the bit line BLai selection signal A becomes "H". In succession, the bit line BLai is precharged to 2 V, and BLbi to 1.5 V, and then the precharge signals φFA and φPB become "L" level, and the bit lines BLai, BLbi are set in floating state. The control gates and selective gates are selected by the row decoder 5, and SG1, SG2, CG1, CG3 to CG8 become VCC, while CG2 becomes, for example, 0.5 V. In ordinary read operation, if the threshold voltage of the memory cell is 0 V or more, it is read as "1", but in program verify read operation, it is not read as "1" unless it is 0.5 V or more.

Afterwards, if after programming "0", the bit line BLai is charged to VCC–Vth by program verify signal φAV. Herein, the voltage level of precharge conducted by program verify signal is not particularly specified as far as more than the precharge voltage of the selected bit line. After the equalizing signal φB is set to VCC and the CMOS flip-flop FF is reset, φA and φB become "H" level, and nodes N1, N2 are connected with bit lines BLai, BLbi, and φP becomes "L" level and φN becomes "H" level, and the data of the bit line BLai is read out.

The read data is latched, and becomes next reprogram data. At this time, the reprogram data is converted from the data in the memory cell in program verify read operation by the previous program data. This data conversion is the same as in the preceding embodiment in Table 1. detecting signal APCON becomes "H", and, same as in the preceding embodiments when program is completed, VDTC becomes "H", and program operation is completed. At this time, the result of detection is sent out from the data IO pin or READY/BUSY pin.

Also by verify read/reprogram operation in the embodiment, same as in the foregoing embodiments, unnecessary rise of threshold voltage in the "1" written memory cell can be suppressed. The erase operation and verification operation of the EφPROM constituted as shown in FIG. 19 and FIGS. 20A to 20C in the case of program operation and verification operation, it is supposed that the bit line BLai of the memory cell array 1A is selected.

First, the bit line BLai selection signal A becomes "H". In succession, the bit line BLai is precharged to 2 V, and BLbi to 1.5 V, and then the precharge signals φPA and φPA become "L" level, and the bit lines BLai, BLbi are set in floating state. The control gates and selective gates are selected by the row decoder 5, and SG1, SG2 are set to VCC, and CG1 to CG8 are set to 0 V.

After the equalizing signal φE is set to VCC and the CMOS flip-flop is reset, φA and φB become "H", and the nodes N1, N2 are respectively connected to bit lines BLai, BLbi, and φP becomes "L" level and φN becomes "H" level, and the data of the bit line BLai is read out. The read data is latched in the flip-flop FF. Consequently, /φDV becomes "L" and the erase verify data detection signal AECON becomes "H", and same as in the preceding embodiment, when erase is completed, the VDTC becomes "H", and the erase operation is completed. At this time, the result of detection is sent out from the data IO pin or READY/BUSY pin.

Instead of BLai, when BLki is selected, the operation is the same except that signals A and B, φPA and φPB, VSA and VSB, φAV and φBV, CA and φB, BLai and BLbi are exchanged respectively. The potential of the control gates CG1 to CG8 and selective gates SG1 and SG2 in erase, program, read (ordinary read), program verify read, and erase verify read operations in this embodiment are as shown in Table 3. In Table 3, the potential relation is shown in the conditions in which the control gate CG2 is selected, the bit line BLai is selected, and VC=3 V.

TABLE 3

|  | erase | program "0" | program "1" | read | program verify | erase verify |
|---|---|---|---|---|---|---|
| BLai | floating | 10V | 0V | 2V | 2V | 2V |
| BLbi | floating | 0V | 0V | 1.5V | 1.5V | 1.5V |
| SG1 | 20V | 10V | 10V | 3V | 3V | 3V |
| CG1 | 0V | 10V | 10V | 3V | 3V | 0V |
| CG2 | 0V | 20V | 20V | 0V | 0.5V | 0V |
| CG3 | 0V | 10V | 10V | 3V | 3V | 0V |
| CG4 | 0V | 10V | 10V | 3V | 3V | 0V |
| CG5 | 0V | 10V | 10V | 3V | 3V | 0V |
| CG6 | 0V | 10V | 10V | 3V | 3V | 0V |
| CG7 | 0V | 10V | 10V | 3V | 3V | 0V |
| CG8 | 0V | 10V | 10V | 3V | 3V | 0V |
| SG2 | 20V | 0V | 0V | 3V | 3V | 3V |
| SL | 20V | 0V | 0V | 0V | 0V | 0V |
| SB | 20V | 0V | 0V | 0V | 0V | 0V |

FIGS. 23A to 23E show a different embodiment of latch circuit and latch data detecting circuit (part A in FIGS. 10, 14, 20). This is an embodiment of charging the node of VDTC to 3 V or VCC through transistors. In FIGS. 23C to 23E, the signals APCON and AECON are fed into an inverter, and the output node of the inverter is fed into the gate of the p-channel transistors but this inverter is not required to be present in the bit line control circuit or latch data detecting circuits and the output signal of the inverter may be fed into the bit line control circuit from outside the bit line control circuit or latch data detecting circuit.

FIGS. 24A to 24C show the circuit constitution of the portion for precharging the VDTC node (part of the program/erase completion detecting circuit 8). FIG. 24A is the precharging portion circuit construction when FIGS. 23A and 24B are used, FIG. 24B is when FIG. 23C is used, and FIG. 24C is when FIGS. 23D and 23E are used.

FIGS. 25A to 25C are briefly described. Completion of program or erase operation is judged by the result of simultaneous detecting operation of the latch data. In this case, the result of simultaneous detecting operation is judged depending on whether the VDTC potential is "H" or "L" level. This judgment is made by the VDTC potential detecting circuit in FIG. 25A. This VDTC potential detecting circuit forms part of the program/erase completion detecting circuit 8, and constitutes the program/erase completion detecting circuit 8 together with the precharge circuit of VDTC node in FIGS. 24A to 24C.

FIGS. 25B and 25C show embodiments of VDTC potential detecting circuit. In FIG. 25B, the circuit threshold voltage of the inverter becomes the potential of the boundary of "H" and "L" levels, while Vref is in FIG. 25C. The output of the VETC detecting circuit for expressing the simultaneous detecting operation result is issued to the outside of the chip directly or through other circuit.

The advantages of using the embodiments described so far are explained below. The characteristic portion in the circuit in FIG. 3 (the portion largely different from the operation in FIGS. 12 and 13) is the star-marked section in FIG. 1 or asterisked section in FIG. 2. That is, it is the simultaneous detecting operation of latch data in program/erase verify read operation.

In the circuit in FIG. 3, at the time of simultaneously detecting operation, since the node N0 is charged through the n-channel transistor Qn40 or Qn41, the "L" level voltage is 0 V and "H" level voltage is (VCC–Vthn) (where Vthn is the threshold voltage of Qn40 or Qn41). Therefore, in order that this circuit may operate normally, it is the required condition that the transistor Qn43 is in OFF state when the gate voltage is 0 V, and in ON state when the gate voltage is (VCC–Vthn).

However, as the source potential is decreased further, the value of (VCC–Vthn) tends to be lower, and the value of (VCC–Vthn) may be lower than the threshold voltage of the transistor Qn43 and the risk of malfunction of simultaneous detecting operation is higher, and hence the use of the circuit in FIG. 3 is an obstacle for decrease of source potential.

Figure 4:
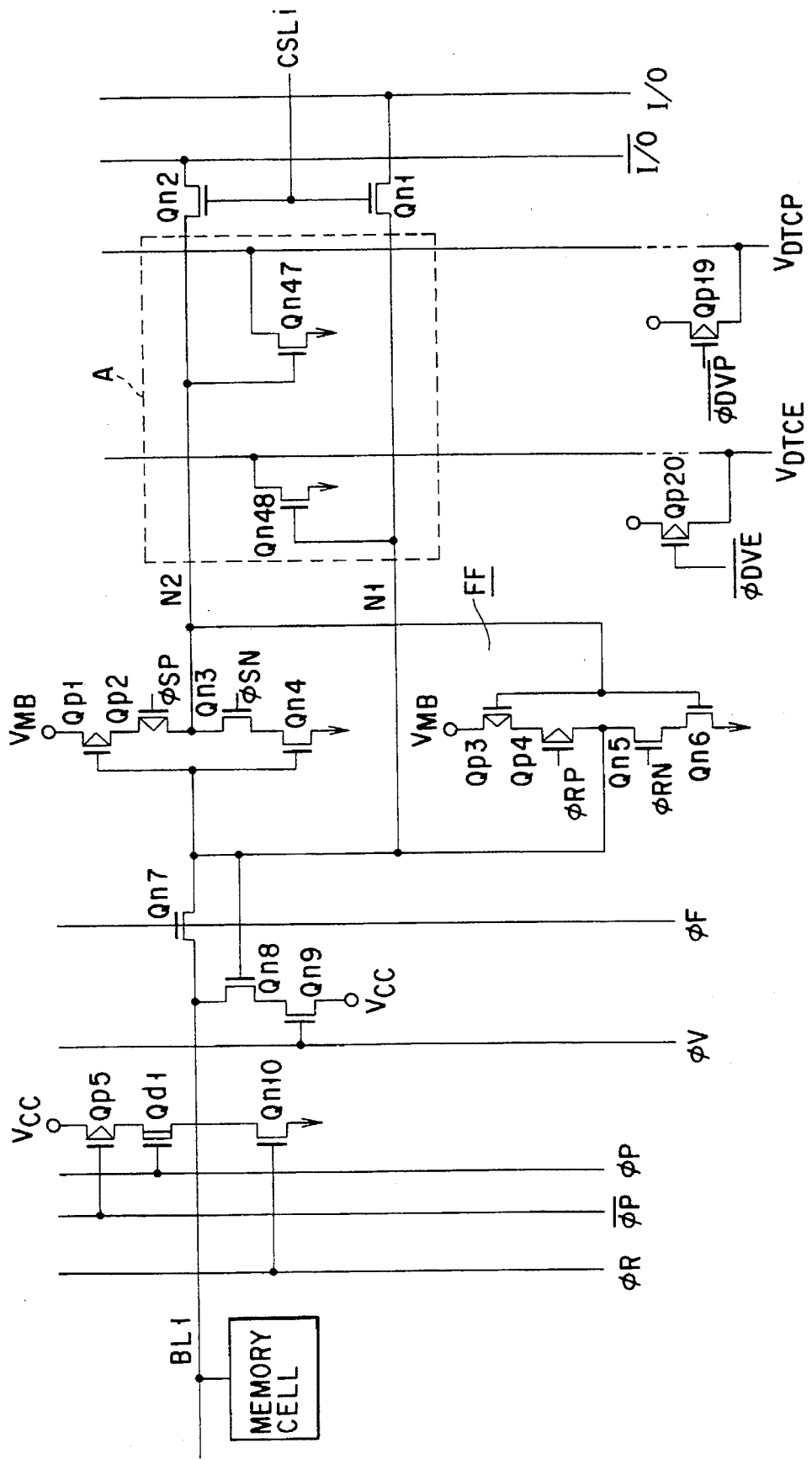
FIG. 4 is a diagram showing the constitution of bit line control circuit and latch data detecting circuit in a second prior art.

When using the circuit in FIG. 4, either node 1 or 2, that is, VCC or 0 V is fed in the gate of the detecting transistor, normal operation is maintained if the decrease of source potential is advanced, but two nodes are required for simultaneous detection instead of one in the prior art, one more wire is needed in the pattern, which is likely to lead to increase in the pattern area (as for the problems of the prior art, see the description of the prior art).

However, instead of the part A in FIG. 3, when the circuit shown in FIGS. 10, 11, 14, 15, 20 or 23 is used, the voltage of node N1 or node N2 is directly fed to the gate or the detecting transistor, and therefore VCC or 0 V is fed to the gate of the transistor. Moreover, when the detecting transistor is of n-channel, it is connected to the 0 V power source, and when it is of p-channel, it is connected to the VCC power source, and therefore the detecting node VDTC is either voltage of VCC or 0 V. In this case, if the decrease of source potential is advanced, the simultaneous detecting operation of the circuit can maintain normal operation as far as VCC does not become lower than the threshold voltage of each transistor.

Therefore, by using the circuit of the invention, if the decrease of source potential is advanced, highly reliable simultaneous detecting operation is realized in program/erase verify read operation, and the source potential can be decreased in simultaneous detecting operation without increasing the pattern area due to increase in the number of wires.

(Fourth Embodiment)

In the first to third embodiments, even if the source potential is low, program/erase verify read operation is realized without risk of error or without complicating the operation or increasing the pattern area. When such techniques are employed, however, the problems mentioned above are present.

Figure 5A:
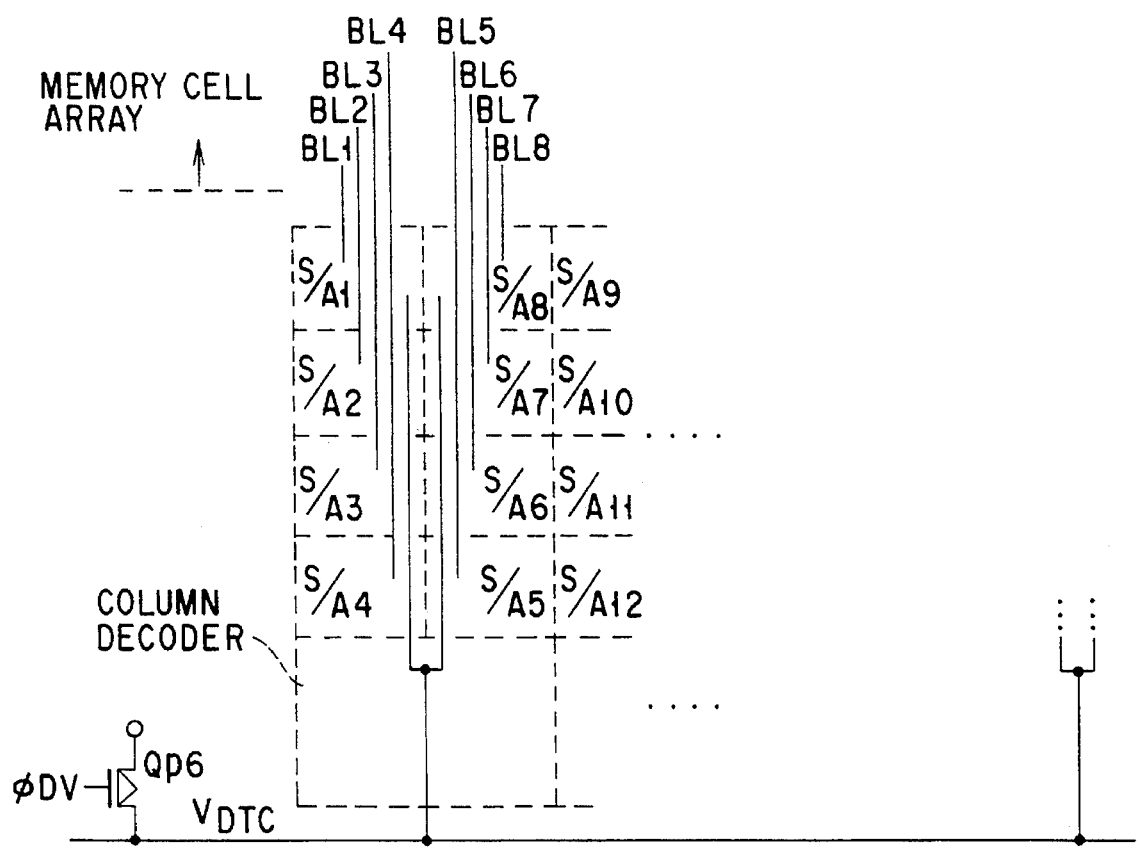
FIG. 5A and FIG. 5B are circuit pattern and wiring layout schematic diagrams around a sense amplifier/data latch circuit employing the prior art.
Figure 5B:
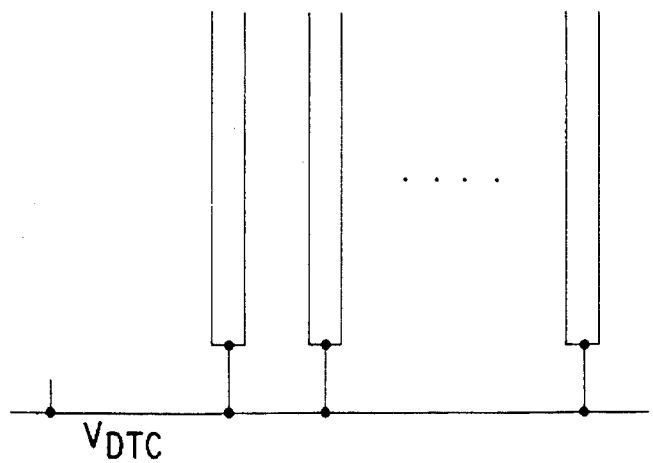

In the NAND cell type EEPROM, one sense amplifier/data latch circuit shown in FIGS. 14 and so on must be provided for one bit line and since the sense amplifier/data latch circuit contains many elements, the pattern area is increased. Therefore, as shown in FIG. 5A, in order to create the pattern diagram of the sense amplifier/data latch circuit on the pattern, the width for the pitch of about four bit lines is needed, and therefore the pattern diagram of the sense amplifier/data latch circuit may be stacked up in four layers. In this case, the nodes of program/erase completion detecting signal are as shown in FIG. 5B. As known from FIG. 5B, since the program/erase completion detecting signal node is extended into the pattern of the sense amplifier/data latch circuit, the wiring length of the program/erase completion detecting signal node is very long, and hence the capacity of the program/erase completion detecting signal node increases.

The circuit in FIG. 14 is explained. In the method shown in FIG. 5A and FIG. 5B, the program/erase completion detecting operation is to charge the program/erase completion detected signal node VDTC once to VCC potential, and check if the VDTC node is discharged or not through the series circuit of transistors Qn11, Qn12 or the series circuit of transistors Qn13, Qn14. When the capacity of the VDTC node is large, the time required for charging or discharging of potential is longer, and hence a longer time is required for program/erase completion detecting operation, which finally extends the required time of program/erase verify read operation. Of the charging and discharging operation, as for charging operation of the VDTC node, high speed operation is enabled by increasing the size of the transistor Qp6 in FIG. 5A and FIG. 5B, and since only one transistor Qp6 is required in entire chip, if the size of the Qp6 is increased, the area of the entire chip is hardly increased, so that high speed charging operation of the VDTC node may be realized easily.

However, as for the discharging operation of VDTC node, to realize high speed operation, there is no other way than to increase the size of the transistors Qn11 to Qn14, but the transistors Qn11 to Qn14 are as many as the number of bit lines (usually thousands to tens of thousand), and when the size is increased, the pattern area increases significantly, which leads to a large increase in chip area. Still more, if there is only one memory cell insufficient in program or erase, the result of detection of program/erase completion is incomplete, and, in a worst case, the VDTC must be discharged to the node through the series circuit of transistors Qn11, Qn12, or the series circuit of transistors Qn13, Qn14, within the required time of VDTC node discharge.

Therefore, when the VDTC node capacity is large, in order to maintain the reliability of program/erase completion detecting operation, a longer VDTC node discharge time is needed in order to complete the discharge into "L" level within the specified VDTC node discharge time, if discharging the VDTC node through one circuit of series circuit of transistors Qn11, Qn12 and series circuit of Qn13, Qn14. It means a longer time in program/erase completion detecting operation, that is, program/erase verify read operation. Moreover, when the size of the discharge transistor is increased in order to shorten the VDTC node discharge time, the chip area as increased significantly.

Accordingly, in the following embodiment, it is intended to shorten the required time of program/erase completion detecting operation, and realize high speed program/erase verify read operation without practically increasing the chip area.

Figure 26:
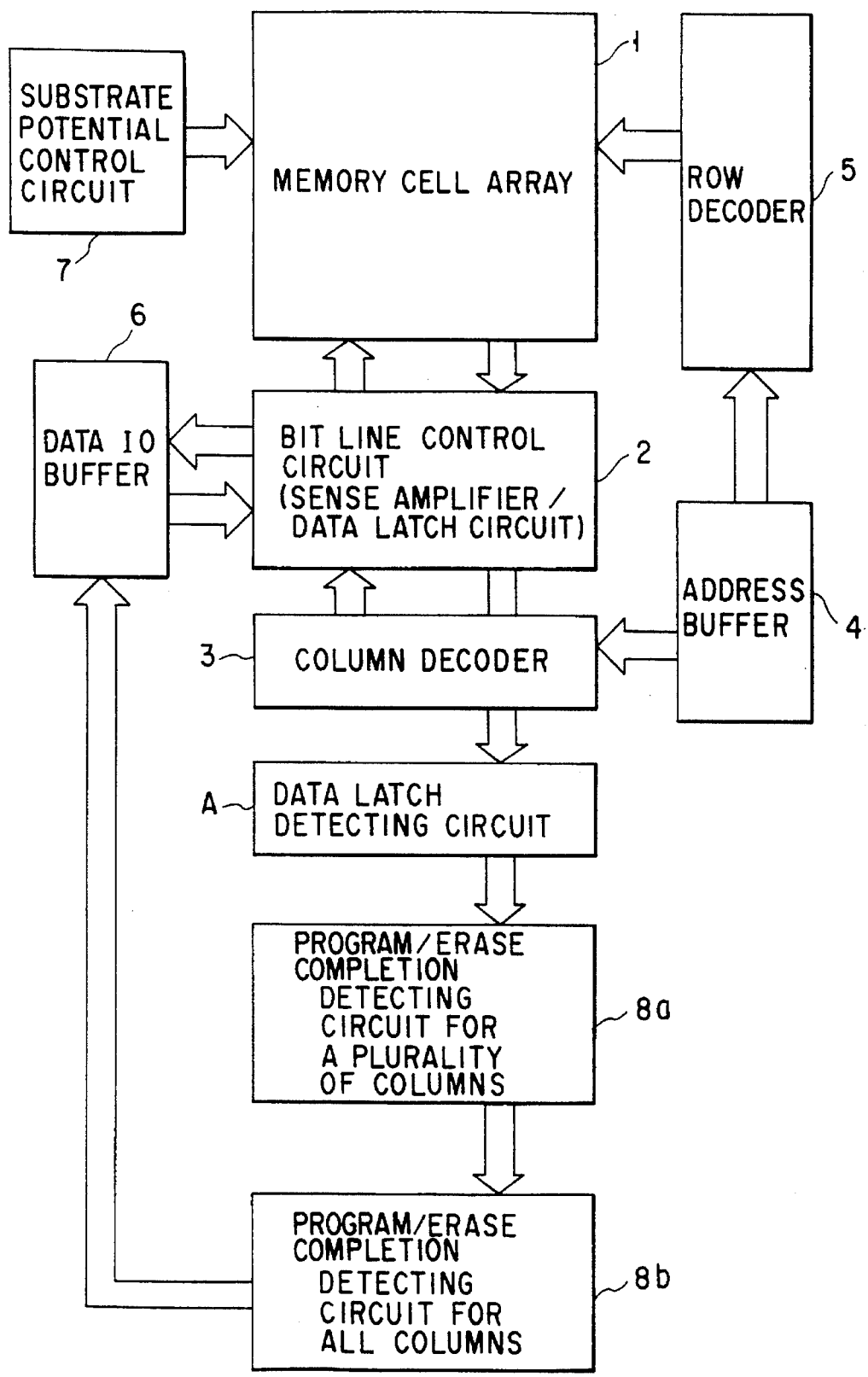
FIG. 26 is a block diagram, showing the constitution of NAND cell type EEPROM system in a fourth embodiment.

FIG. 26 is a block diagram showing a NAND cell type EEPROM system configuration in a fourth embodiment of the invention.

In order to perform data program, read, reprogram, program verify read and erase verify read operations on a memory cell array 1, a bit line control circuit 2 is provided. The bit line control circuit 2 is connected to a data IO buffer 6 and receives, as an input, the output of a column decoder 3 which receives an address signal from an address buffer 4. To control the control gates and selective gates on the memory cell array 1, a row decoder 5 is provided, and a substrate potential control circuit 7 is provided for controlling the potential of the p-type substrate (or p-type well) on which the memory cell array 1 is formed.

A latch data detecting circuit A detects the data latched in the bit line control circuit 2. A program/erase completion detecting circuit for a plurality of columns 8a receives this result of detection from plural latch data detecting circuits and issues a program completion signal for a plurality of columns or erase completion signal for a plurality of columns. A program/erase completion detecting circuit for all columns 8b receives a program completion signal for a plurality of columns or erase completion signal for a plurality of columns of two or more, detects, and issues a program completion signal for all columns or erase completion signal for all columns. The program completion signal for all columns or erase completion signal for all columns is sent out from the data IO buffer 6.

The bit line control circuit 2 is mainly composed of CMOS flip-flop, and performs latch of data for programming, sense operation for reading the potential of bit line, sense operation for verify read after program or after erase, and latch of reprogram data.

The constitution of one NAND cell portion of the memory cell array is the same as in FIGS. 7A, 7B, 8A, and 8B, and the equivalent circuit of the memory cell array arranging such NAND cells in matrix is the same as in FIG. 9.

FIG. 27 shows a specific constitution of the bit line control circuit 2 and latch data detecting circuit A in FIG. 26. This constitution is basically same as in FIG. 14, and what differs from FIG. 14 is only that the program/erase completion detecting signal VDTC in FIG. 14 is replaced by a program/erase completion detecting signal for a plurality of columns Vcol in FIG. 27.

Figure 28:
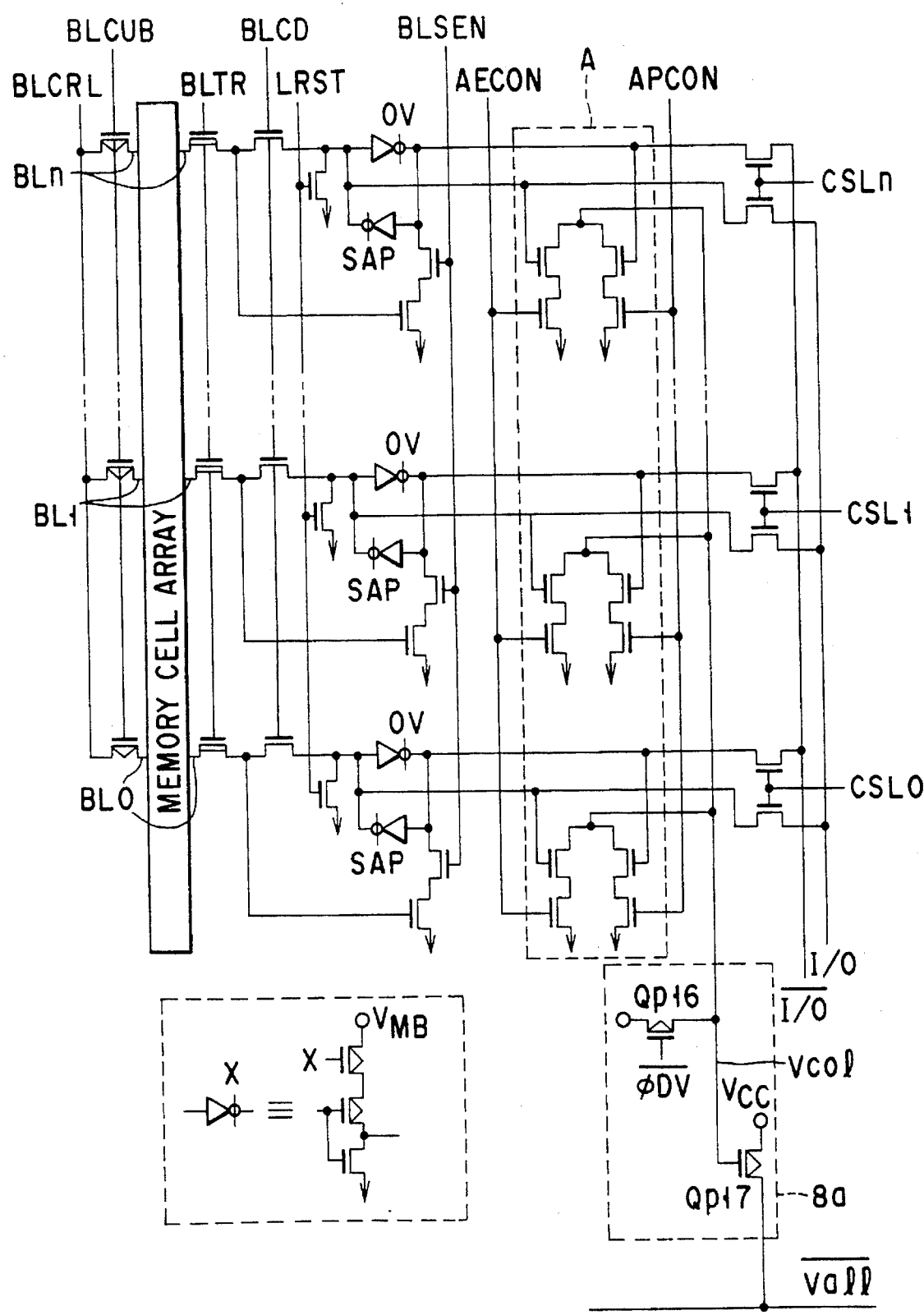

FIG. 28 shows the relation of the bit line control circuit 2, latch data detecting circuit A, memory cell array A, and program/erase completion detecting circuit for a plurality of columns 8a.

The program/erase completion detecting circuit for a plurality of columns 8a is composed of an E type p-channel MOS transistor Qp16, and an E type p-channel MOS transistor Qp17. The Qp16 precharges the program/erase completion detecting signal for a plurality of columns Vcol before program/erase completion detecting operation. The Qp17 receives the program/erase completion detected signal for a plurality of columns Vcol, detects the potential level of the signal Vcol, judges if the program or erase of plurality of columns is terminated or not and sends the result of judgment to program/erase completion detecting signal for all columns/Vall. As enclosed by broken line in FIG. 28, the flip-flop FF is symbolized for the sake of convenience. In FIG. 28, the program/erase completion detected signal for a plurality of columns Vcol is connected with n flip-flops. That is, the circuit comprises n pieces of reprogram data (number of detecting columns) detected in one program/erase completion detecting circuit for a plurality of columns 8a.

Figure 29:
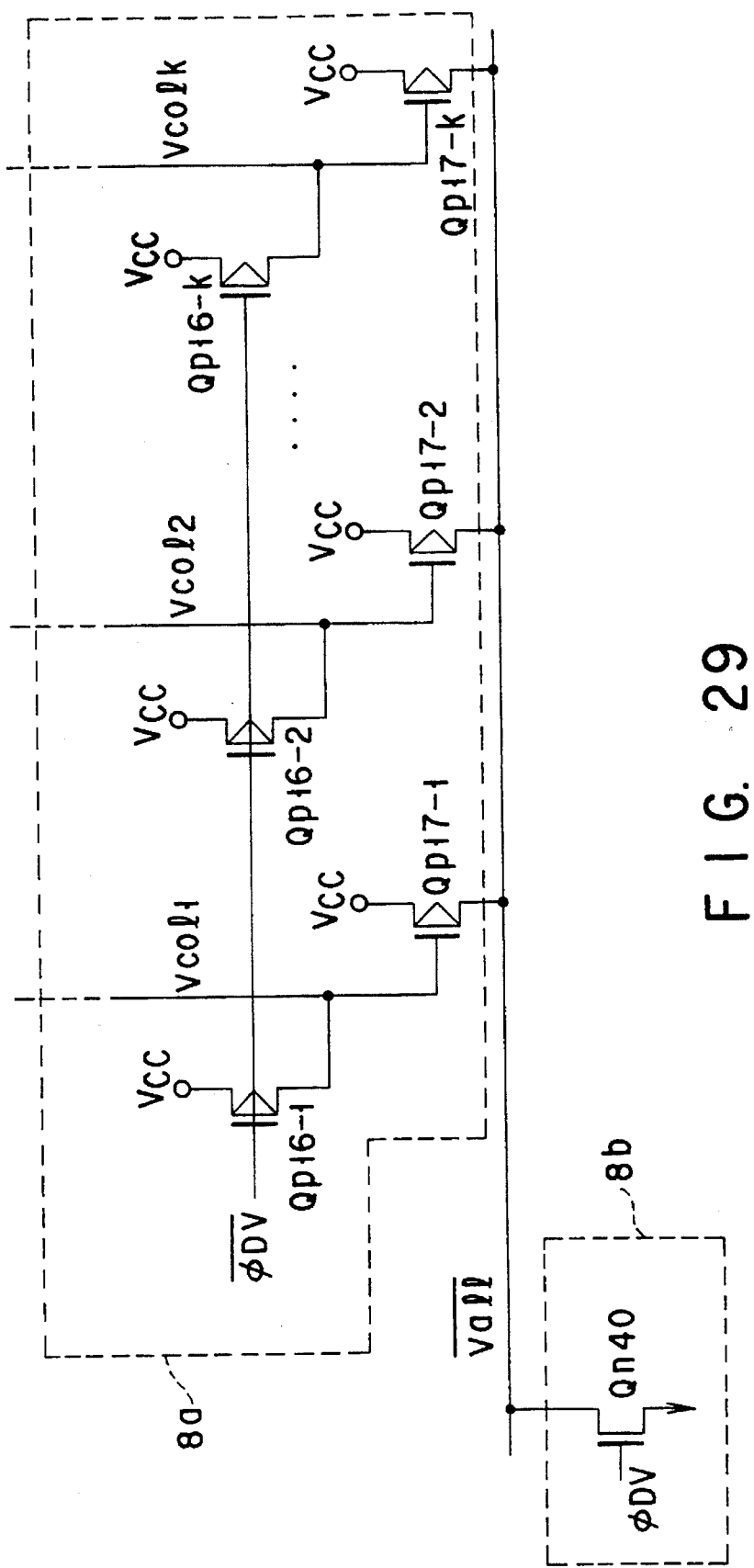
FIG. 29 is a diagram showing connection relation of part of program/erase completion detecting circuit for a plurality of columns 8a, and a part 8b of program/erase completion detecting circuit for all columns.

FIG. 29 shows a partial connection relation of the program/erase completion detecting circuit for a plurality of columns 8a and program/erase completion detecting circuit for all columns 8b. However, reference numeral 8a (the upper part of the portion enclosed by broken line) in FIG. 29 refers to the area corresponding to the program/erase completion detecting circuit for a plurality of columns 8a, and reference numeral 8b (the lower part of the portion enclosed by broken line) in FIG. 29 refers to the area corresponding to part of the program/erase completion detecting circuit for all columns 8b.

Part of the program/erase completion detecting circuit for all columns 8b is composed of an E type n-channel MOS transistor Qn40, and reset, the program/erase completion detecting signal for all columns/Vall before program/erase completion detecting operation. The program/erase completion detecting circuit for all columns 8b includes, aside from the transistor Qn40, a /Vall potential detecting circuit (the same one in FIGS. 25A to 25C in the first to third embodiments may be used as the Vall potential detecting circuit shown in FIGS. 39A to 39C). In FIG. 29, the program/erase completion detecting signal for all columns /Vall is connected with k pieces of Vcoli (i=1 to k) through transistor. That is, by the corresponding program/erase Vcoli, the flip-flops FF and bit lines are divided into k groups, or (n×k)=number of bit lines (number of flip-flops FF).

The circuit operation of program verification (program verify read) in this embodiment is explained below.

Figures 30A, 30B:
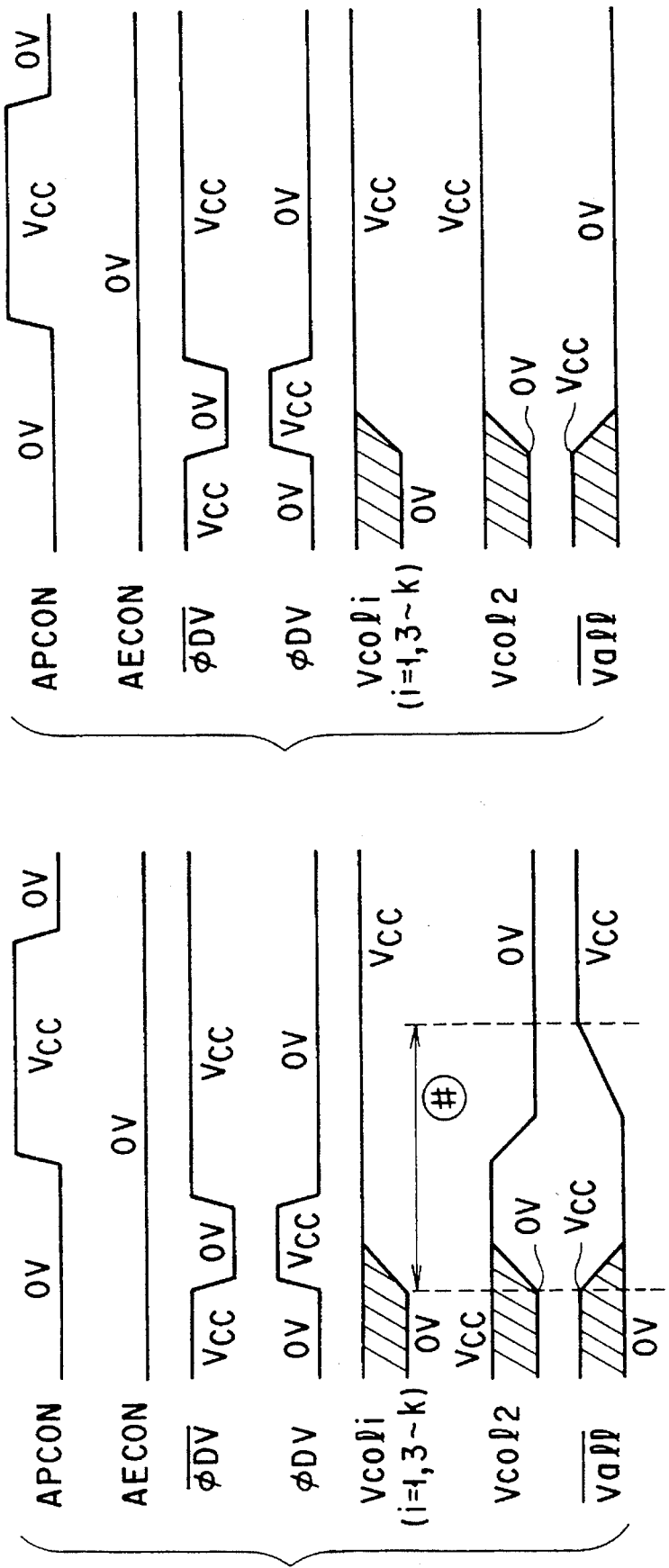
FIG. 30A and FIG. 30B are operation timing charts of signal related to program completion detecting operation during program verify read.

The operation of the signals in FIGS. 27 and 28 in program and program verify read operations refers to FIG. 16 (however, as for the signals shown in FIGS. 30A and 30B. priority reference is made to the operation timing in FIGS. 30A and 30B), and the following description relates only to the signals responsible for program completion detecting operation (the operation about change of signal /φDV or signal APCON in FIG. 16). FIG. 30A and FIG. 30B show operation timing charts of program completion detecting operation during program verify read operation.

Before program completion, the program/erase completion detecting signal for a plurality of columns Vcoli (i=1 to k) and program/erase completion detecting signal for all columns/Vall are at the potential level in a range of 0 V to VCC. The program/erase completion detecting signal for a plurality of columns/φDV becomes "L" to precharge the Vcoli (i=1 to k) node to VCC, and the program/erase completion detected signal for a plurality of columns /φDV returns to "H", and Vcoli is set in floating state, being kept at VCC potential.

The program/erase completion detecting signal for all column, φDV becomes "H" to precharge the/Vall node to 0 V and the program/erase completion detected signal for all columns φDV returns to "L", and the Vall is set in floating state, being kept at 0 V potential. In succession, the program verify data detecting signal APCON becomes "H". At this time, all n pieces of reprogram data, in the bit line control circuit, to which Vcoli is connected (=data at the time of program verify read operation: see FIG. 16) are "0", that is, if the N2 nodes of n flip-flops FF are at "L" level, the program/erase completion detecting signal for a plurality of columns Vcoli becomes "H". Furthermore, when N2 nodes of all flip-flops FF are at "L" level, that is, when all of pieces of Vcoli are at "H" level, the program/erase completion detecting signal for all columns/Vall becomes "L" (equivalent to FIG. 30B), and program completion of all selected memory cells is judged.

On the other hand, if only one data is "1", that is, if any one N2 node is at "H" level in the flip-flop FF, the program/erase completion detecting signal for a plurality of columns Vcoli corresponding to this flip-flop FF becomes "L" (equivalent to signal Vcol2 in FIGS. 30A, 30B), and at this time the /Vall is "H" and it is judged that program is insufficient in at least one of all selected memory cells. The program and program verification operations are repeated until the /Vall becomes "L", and the result of detection is sent out from the data IO pin or READ/BUSY pin.

So far is explained the embodiment of the circuit operation in the vicinity of program completion detecting operation in program verification (program verify read operation), and the circuit operation is similarly realized in the vicinity of erase completion detecting operation (the operation around change of signal/φDV or signal AECON in FIG. 17: the portion indicated as "FIG. 31A and FIG. 31B" in FIG. 17) in erase verification (erase verify read operation). However, the operation timing of the signal relating to the erase completion detecting operation should be referred to FIGS. 31A and 31B, and the operation of other signals in FIGS. 27 and 28 during erase and erase verify read operation should be referred to FIG. 17 (however, as for the signals shown in FIGS. 31A and 31B, priority reference should be made to the operation timing in FIGS. 31A and 31B). The operation is briefly described below by reference to FIGS. 31A and 31B.

Prior to erase completion detecting operation, the program/erase completion detecting signal for a plurality of columns Vcoli and program/erase completion detecting signal for all columns /Vall are at the potential level in a range of 0 V to VCC. The program/erase completion detecting signal for a plurality of columns/φDV becomes "L" to precharge the Vcoli (i=1 to k) node to VCC and the program/erase completion detecting signal for a plurality of columns φDV returns to "H". So that the Vcoli is set in floating state, being kept at the VCC potential.

The program/erase completion detected signal for all columns φDV becomes "H" to precharge the /Vall node to 0 V, and the program/erase completion detecting signal for all columns φDV returns to "L" so that the /Vall is set in floating state, being kept at the 0 V potential. In succession, the erase verify data detecting signal AECON becomes "H". At this time, if all of n pieces of read data in erase verify read operation to which Vcoli is connected (see FIG. 17) are "1", that is, N1 nodes of corresponding n flip-flops FF are all at "L" level, the program/erase completion detecting signal for a plurality of columns Vcoli becomes "H". Furthermore, when the N1 nodes in all flip-flops FF are at "L" level, that is, when all pieces of Vcoli are at "H" level, the program/ erase completion detecting signal for all columns/Vall becomes "L" (corresponding to FIG. 31B), and erase completion of all memory cells undergoing erase verify read operation is judged.

On the other hand, if only one data is "0", that is, if any one N1 node is at "H" level in the flip-flop FF, the program/ erase completion detecting signal for a plurality of columns Vcoli corresponding to this flip-flop FF becomes "L" (equivalent to signal Vcol2 in FIG. 31A), and at this time the /Vall is "H" and it is judged that program is insufficient in at least one of all selected memory cells. The program and program verification operations are repeated until the /Vall becomes "L", and the result of detection is sent out from the data IO pin or READ/BUSY pin.

Figure 32A:
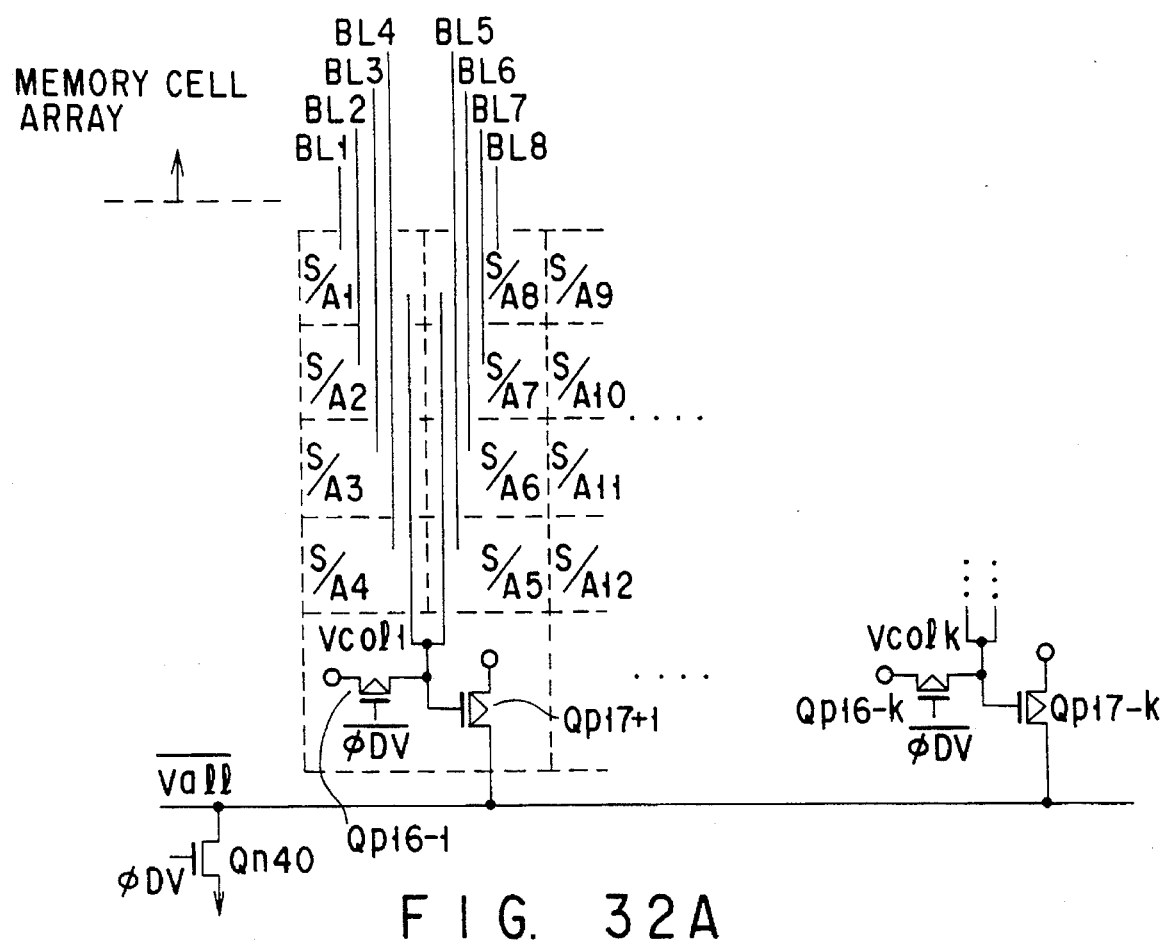
FIG. 32A and FIG. 32B are circuit pattern and wiring layout schematic diagram around sense amplifier/data latch circuit according to the third embodiment.
Figure 32B:
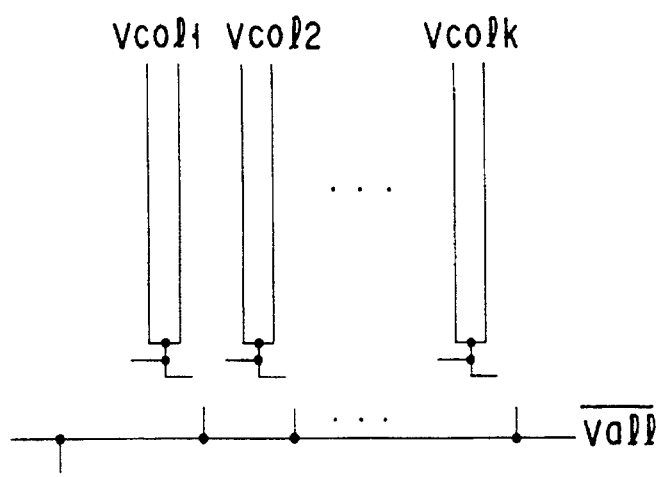

The invention is herein described by referring to the preferred embodiments, and the advantages of the invention over the prior art are described below. FIG. 32A shows a schematic layout diagram of circuit pattern and wiring in the peripheral section of amplifier/data latch circuit, to the embodiments of the invention, and FIG. 5A shows a schematic layout diagram of the conventional circuit pattern and wiring. FIG. 32B and FIG. 5B are respectively extracted diagrams of the program/erase completion detecting signal node wiring from FIG. 32A and FIG. 5A. In FIGS. 5A and 5B, it is assumed that the latch data detecting circuit shown in the second embodiment is used.

In the NAND cell type EEPROM, one sense amplifier/ data latch circuit shown in FIG. 27 is required for one bit line, and since the sense amplifier/data latch circuit contains many elements, the pattern area increases. Therefore, on the pattern, as shown in FIGS. 32A and 5A, in order to create the pattern diagram of sense amplifier/data latch circuit (one area of S/Ai (i=1, 2, . . . , in FIG. 32A or 5A corresponds to one sense amplifier/data latch circuit+one latch data detecting circuit), a pitch width of about four bit lines is needed, and the pattern diagram of the sense amplifier/data latch circuit may be stacked up in four layers. Moreover, the column decoder 3 and simultaneous detecting circuit section for a plurality of columns are provided beneath in FIG. 32A, or the column decoder 3 is provided in FIG. 5A. In FIG. 32A, however, it shows an example of schematic pattern diagram of n=8 flip-flops FF to which the program/erase completion detecting signal for a plurality of column Vcoli is connected.

In this case, the node of program/erase completion detecting signal is as shown in FIG. 32B and FIG. 5B in the case the invention and prior art, respectively. In the prior art, as known from FIG. 5B, the node of program/erase completion detecting signal is extended into the latch data detecting circuit area in S/Ai, and therefore the wiring length of the node of program/erase completion detecting signal is very long, and therefore the capacity of the node of program/erase completion detected signal is very large.

In the method in FIGS. 5A and 5B, the program/erase completion detecting operation is the operation for checking if the VDTC node is discharged or not through the series circuit of transistors Qn11, Qn12 or the series circuit of Qn13, Qn14, after once charging the node of program/erase completion detecting signal (equivalent to DVTC in FIGS. 5A and 5B) to VCC potential (see embodiments in FIGS. 14 to 17), and therefore when the capacity of the VDTC node is large, the required time for charging and discharging of potential is longer, and a longer time is needed for program/ erase completion detecting operation, and finally a longer time is required for program/erase verify read operation. Of the charging and discharging operation. The charging operation of the VDTC node can be increased in speed by increasing the size of the transistor Qp6 in FIGS. 5A and 5B, and since only one transistor Qp6 is used in the entire circuit, if the size of the Qp6 is increased the area is hardly increased in the entire chip, and high speed charging operation of VDTC node is realized easily.

However, as for the discharging operation of the VDTC node, to realize high speed, there is no other way than to increase the size of the transistors Qn11 to Qn14, but the transistors Qn11 to Qn14 are as many as the number of bit lines (usually thousands to tens of thousand), and when the size is increased, the pattern area increases significantly, which leads to a large increase in chip area. Still more, if there is only one memory cell insufficient in program or erase, the result of detection of program/erase completion is incomplete, and, in a worst case, the VDTC must be discharged to the node through the series circuit of transistors Qn11, Qn12, or the series circuit of transistors Qn13, Qn14, within the required time of VDTC node discharge.

Therefore, when the VDTC node capacity is large, in order to maintain the reliability of program/erase completion detecting operation, a longer VDTC node discharge time is needed in order to complete the discharge into "L" level within the specified VDTC node discharge time, if discharging the VDTC node through one circuit of series circuit of transistors Qn11, Qn12 and series circuit of Qn13, Qn14. It means a longer time in program/erase completion detecting operation, that is, program/erase verify read operation. Moreover, when the size of the discharge transistor is increased in order to shorten the VDTC node discharge time, the chip area is increased significantly.

In the invention, by contrast, as shown in FIG. 32, the program/erase completion detecting node VDTC in the prior art is divided into the program/erase completion detecting node for a plurality of columns Vcoli (i=1 to k), and program/erase completion detecting node for all columns/ Vall, and as compared with the capacity of the VDTC node in the prior art, the capacity of Vcoli and/Vall is about several times or several tens of times smaller. Therefore, when the size of the transistors being used is similar, the required time for charging and discharging of Vcoli node and charging and discharging of/Vall node as more than several times shorter than the required time for VDTC node charging and discharging in the prior art.

As for the increase in the number of transistors, only two types are added, Qp16-i, Qp17-i (i=1, 2, ..., k) for detecting action of plural columns (2k pieces: 1/(2×n) of number of elements (4×n×k) in the series circuit of Qn1, Qn12 or series circuit of Qn13, Qn14 in the prior art), and since the/Vall node capacity is small, the size of transistors of these two types can be suppressed small. Therefore, in the invention, the chip area is not increased significantly.

As described herein, according to the invention, while hardly increasing the chip size, the required time for program/erase completion detecting operation (corresponding to #-marked area In FIGS. 30A, 30B, 31B) can be shortened as compared with the prior art, and therefore high speed program/erase verify read operation is realized.

The invention is herein described by referring to embodiments, but the invention is not limited to the embodiments alone, and may be changed and modified in varied manners without changing the principle thereof.

Figures 34A, 34B:
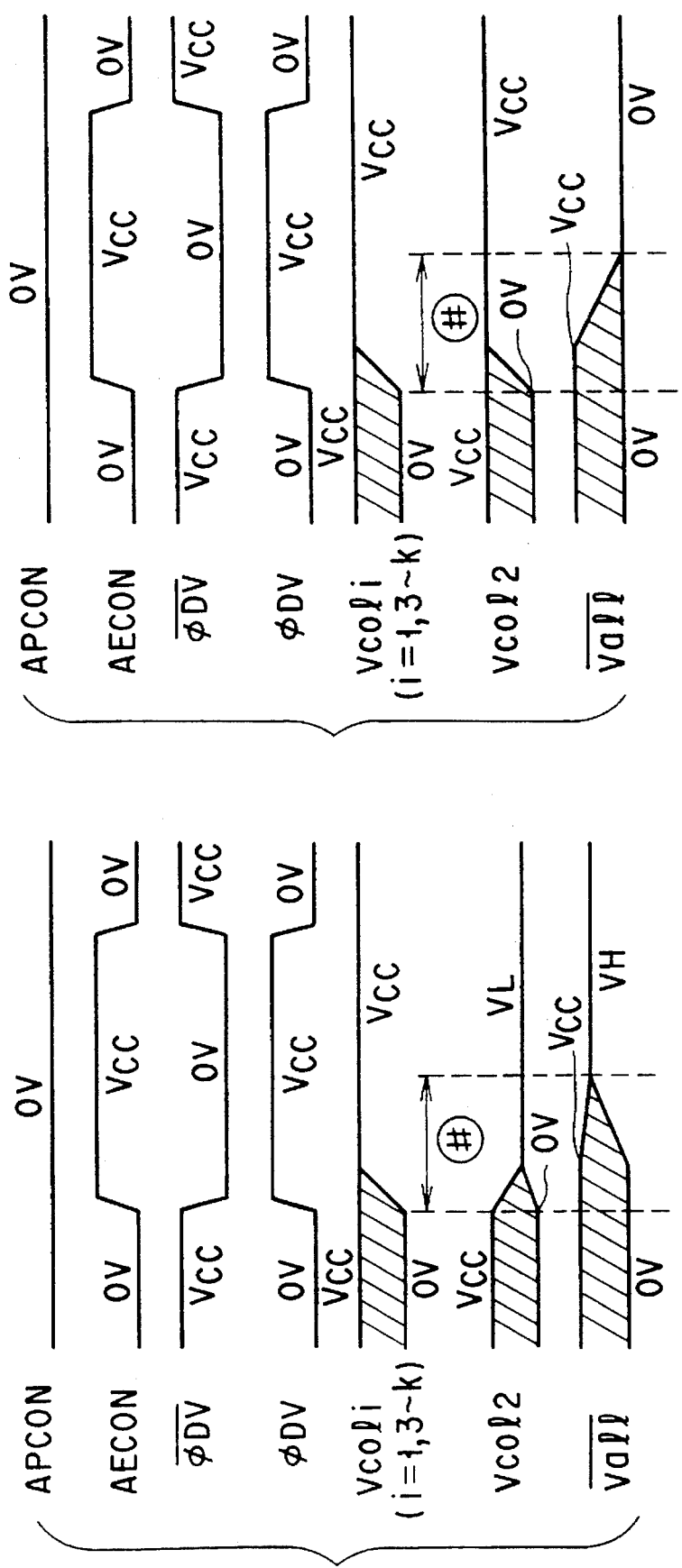
FIG. 34A and FIG. 34B are operation timing charts in a different embodiment of erase completion detecting operation during erase verify read.

For example, in the embodiments in FIGS. 30A, 30B, and 31B, before sensing the Vcoli node and/Vall node, they are respectively precharged to VCC and 0 V and set in floating state, then signals APCON and AECON are set to "H" and it is judged if the potential of the floating node changes or not. In the embodiments shown in FIGS. 33A and 33B or 34A and 34B,/φDV and φDV which are precharge signals of Vcoli node and/Vall node are changed simultaneously with signals/Vall node is detected, and program/erase completion is judged. In this case, when program or erase is sufficient in all memory cell, to be detected (equivalent to FIGS. 33B, 34B), the transistors Qn11 to Qn14, and Qp17 are in OFF state and hence Vcoli node and/Vall node settle at VCC and 0 V potential respectively, to be in the same state as in FIGS. 30A, 31B, so that sufficient program or erase is detected.

On the other hand, program or erase is insufficient in any one of the memory cells to be detected, one or more of the series circuit of transistors Qn11, Qn12 or series circuit of Qn13, Qn14 and one or more of Qp17-i are in ON state. Therefore, in the Vcoli node connected to either series circuit in ON state, the current is steadily flowing in the route of VCC potential, Qp16-i, Vcoli node either series circuit and 0 V potential. In this state, the Vcoli node can be set at VL potential or "L" level potential and at this time the result of detecting the program/erase completion of plural columns is insufficient in program/erase. In this case, the transistor Qp17-i in which the Vcoli node is fed in the gate is set in ON state. As a result, the current flows steadily in the route of VCC potential, Qp17-i, /Vall node, Qn40, and 0 V potential. In this state, the /Vall node can be set in the VH potential or "H" level potential, and at this time the result of detection of program/erase completion of all columns is insufficient in program/erase.

Figure 35:
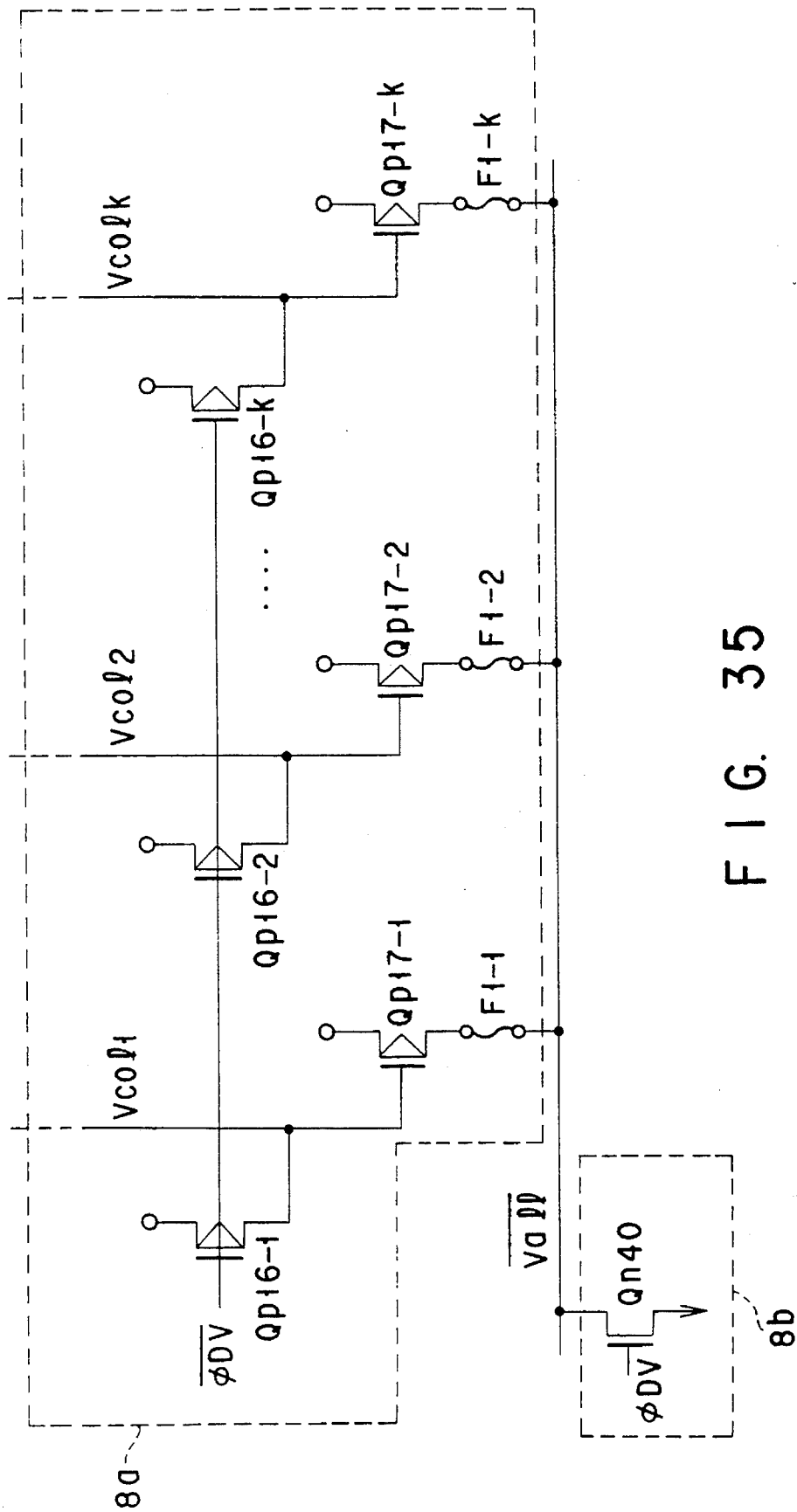
FIG. 35 is a diagram showing an embodiment in which a fuse is placed in program/erase completion detecting circuit 8 for a plurality of columns.

The invention is also valid in FIGS. 35 to 37, in which, particularly, a fuse is placed in the portion corresponding to the latch data detecting circuit A in FIG. 27, or in the program/erase completion detecting circuit for plurality of columns 8a. However, reference numeral 8a in FIGS. 35, 36 (the upper side of the portion enclosed by broken line) corresponds to the program/erase completion detecting circuit for a plurality of columns 8a and 8b in FIGS. 35, 36 (the lower side of the portion enclosed by broken line) correspond, to part of the program/erase completion detecting circuit for all columns 8b.

The manner of placing the fuse as shown in FIGS. 35, 36 is particularly effective when replacing the bit line having defect such as passing of leak current with redundancy, or replacing a group of flip-flops FF commonly sharing the Vcoli node, that is, the bit line group, in bitch, and since the latch data (program/erase verify read data) of the flip-flops FF connected with the defective bit line is ignored by cutting off the fuse corresponding to the defective bit line replaced with the redundancy, if read failure occurs in the defective bit lines error in program/erase completion detecting operation can be prevented. Besides, the manner of placing the fuse as shown in FIG. 37 is particularly effective when the replacement unit of the defective bit line with the redundancy is one flip-flop FF, that is, one bit line because the fuse is placed in each flip-flop.

Figure 38A:
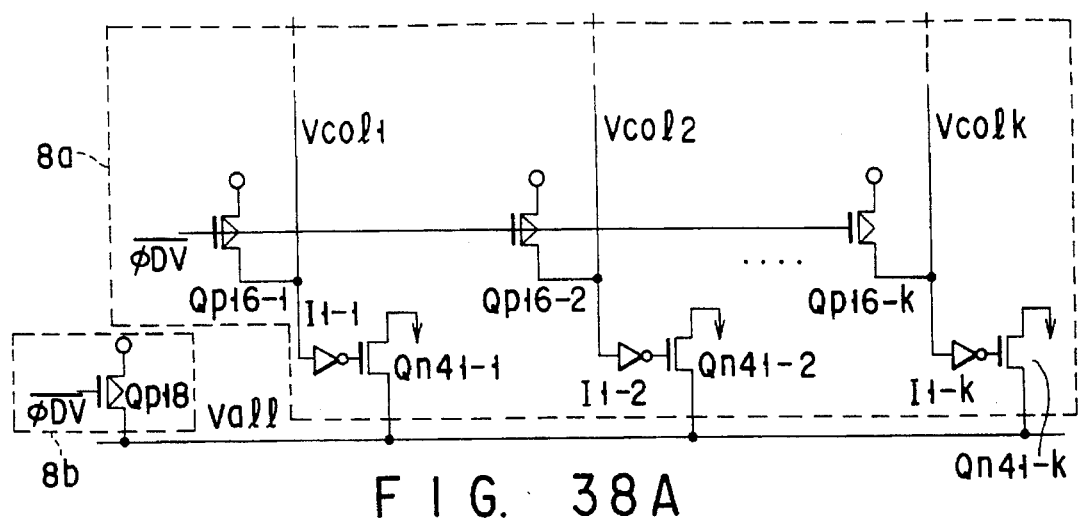
FIG. 38A to FIG. 38C are diagrams showing a modified example of circuit configuration in FIG. 29.
Figure 38B:
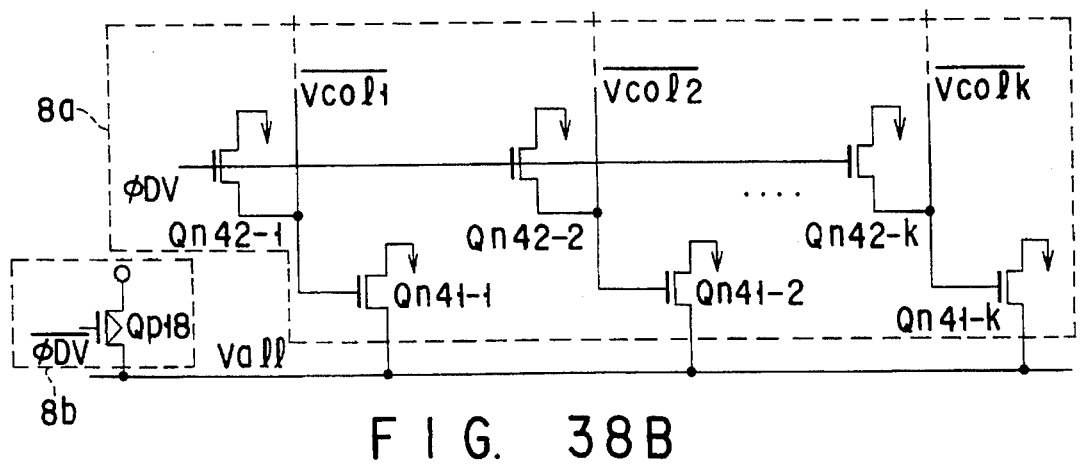
Figure 38C:
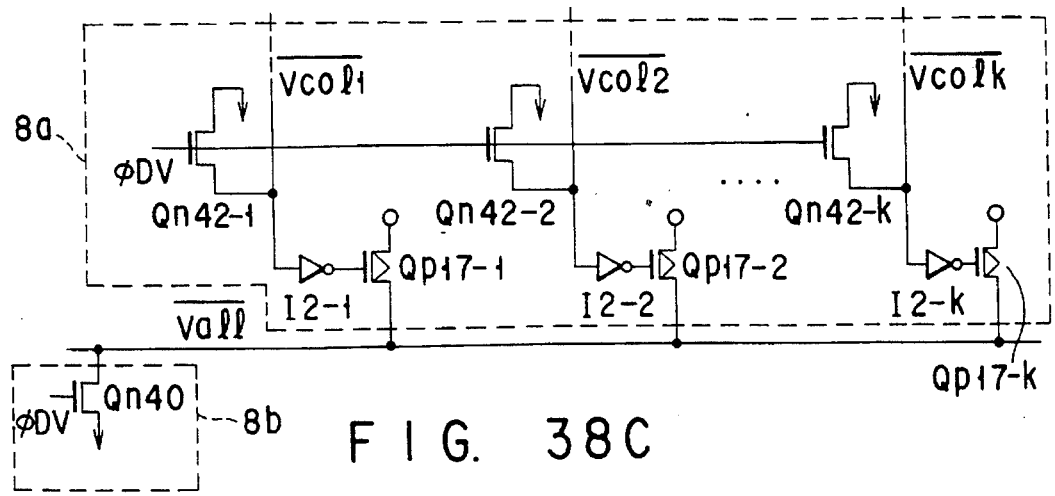

The invention is not limited to the circuit constitution shown in FIG. 29, but may be also valid in the circuit constitution as shown in, for example, FIGS. 38A, 38B, 38C. However, reference numeral 8a in FIGS. 38A to 38C (the upper side of the portion enclosed by broken line) corresponds to the program/erase completion detecting circuit for a plurality of columns 8a and 8b in FIGS. 38A to 38C (the lower side of the portion enclosed by broken line) corresponds to part of the program/erase completion detecting circuit for all columns 8b.

Figure 39A:
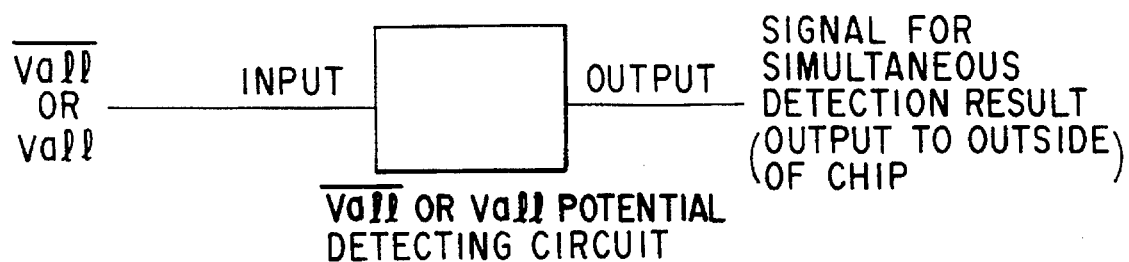
FIG. 39A to FIG. 39C are diagrams showing input and output relation of VDTC potential detecting circuit.
Figure 39B:
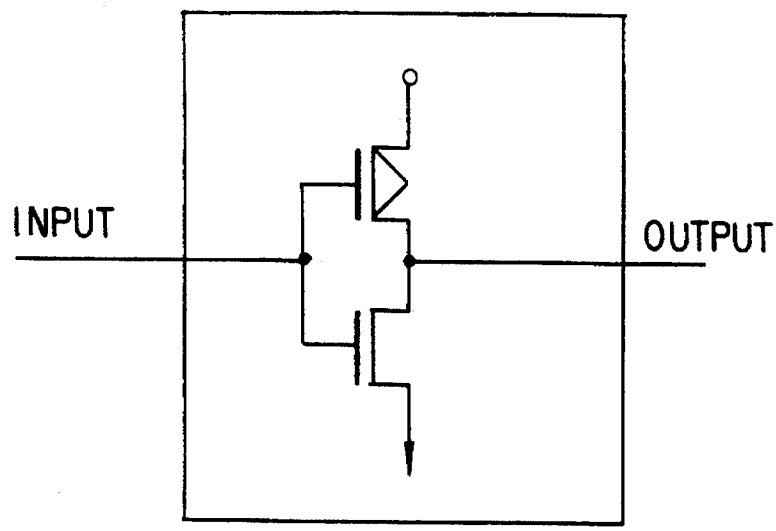
Figure 39C:
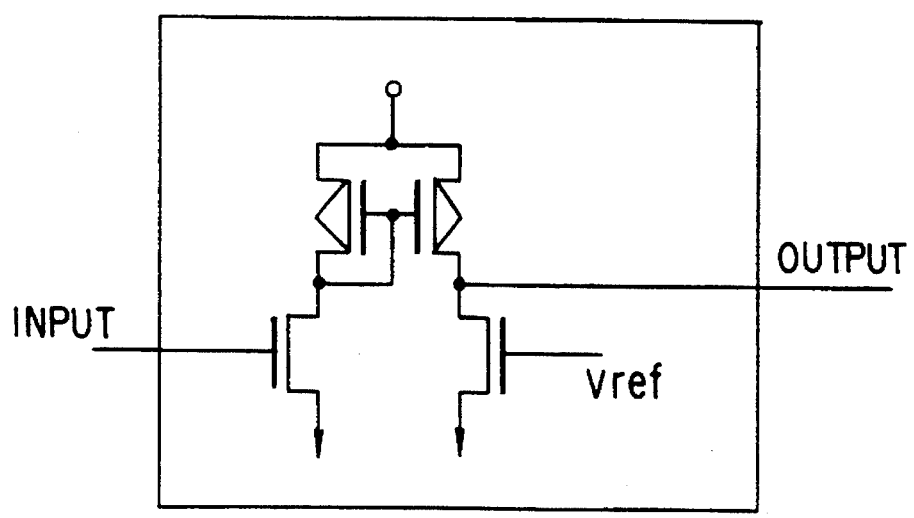

The invention is also valid if the circuit constitution is varied in part of the latch data detecting circuit A in FIG. 27. For example, it is also valid by using the circuit constitution in FIGS. 23A to 23C. In this case, the latch data detecting circuit A in FIG. 27 and the circuit to be combined with FIGS. 23A and 23B are respectively shown in FIGS. 29 and 38A, and the circuit to be combined with FIG. 23C is FIG. 38C. As a result, the same operation as in FIGS. 30A, 30B, FIGS. 31B, 33A, and FIGS. 33B, 34B may be realized. Nevertheless, Vall in FIG. 38A is the reverse phase signal of /Vall in FIGS. 29, 38A (the signal exchanged in the timing of "L" and "H"), and /Vcoli in FIG. 38A is the reverse phase signal of Vcoli node in FIGS. 29, 38A and it must be taken into consideration. At this time, the input and output relation of VDTC potential detecting circuit is shown in FIGS. 39A to 39C.

In the reverse phase signal, the voltage level for judging if program or erase of memory cell is sufficient or not is reverse. For example, in the signal /Vall in FIGS. 29, 38A, "L" and "H" levels respectively correspond to sufficient and insufficient program or erase, but in the signal Vall in FIG. 29, "L" and "H" levels respectively correspond to insufficient and sufficient program or erase.

Likewise, in the signal Vcoli in FIGS. 29 and 38A to 38C, "L" and "H" levels respectively correspond to insufficient and sufficient program or erase, whereas in the signal Vcoli in FIG. 29, "L" and "H" levels respectively correspond to sufficient and insufficient program or erase.

The invention is also valid in modifications from the foregoing embodiments without departing from the true spirit of the invention, for example, by combining the latch data detecting circuit A in FIG. 3 and Qn47, Qn48, Qp19, Qp20 in FIG. 4 with FIG. 29 or FIG. 38A.

In the foregoing embodiments, NAND cell type EEPROM is explained, but the invention may be also realized in the nonvolatile semiconductor memory devices of NOR cell type or others (AND, DINOR). Moreover, not limited to the nonvolatile semiconductor memory device, it may be also applied to dynamic type semiconductor memory device as far as including a circuit for judging if the plurality of data latched in a plurality of data latch/sense amplifier are identical or not.

An example of applying the invention in the NOR cell type is explained below.

Figure 40:
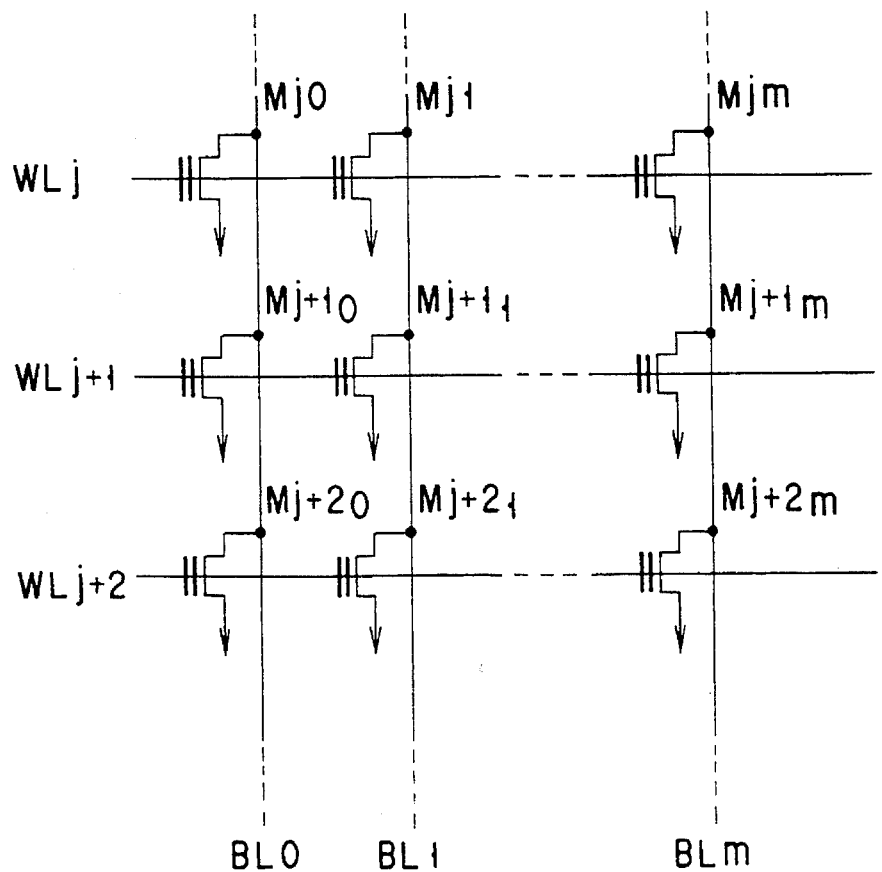
FIG. 40 is an equivalent circuit diagram of NOR type memory cell array in a fifth embodiment and a sixth embodiment.

FIG. 40 shows an equivalent circuit of NOR cell type memory cell array. Tables 4 and 5 show the relation of erase data, memory cell data, and re-erase data in the NOR type cell EEPROM using the description of fifth and sixth embodiments. In the NOR cell type EEPROM used in the embodiments in Tables 4 and 5, the memory cell of which threshold voltage is higher than VCC is supposed to be "1" data, and the memory cell of which threshold voltage is somewhere between 0 V and VCC is supposed to be "0" data and as the data reprogramming operation, first the threshold voltage of the memory cell to be reprogrammed as set higher than VCC ("1" state) (program operation), and the threshold voltage of each memory cell is selectively set somewhere between 0 V and VCC depending on the data (erase operation).

TABLE 4

| erase data | 1100 |
| data of memory cell | 0101 |
| re-erase data | 1110 |

TABLE 5

| | erase | | | | program | erase |
| | "0" | "1" | program | read | verify | verify |
| --- | --- | --- | --- | --- | --- | --- |
| BLm | 3V | 0V | 6V | 3V | 3V | 3V |
| WLj | −12V | −12V | 12V | 3V | 3.5V | 2.5V |
| SL | 0V | 0V | 0V | 0V | 0V | 0V |
| SB | 0V | 0V | 0V | 0V | 0V | 0V | where, WLj is a word line.

Figure 43:
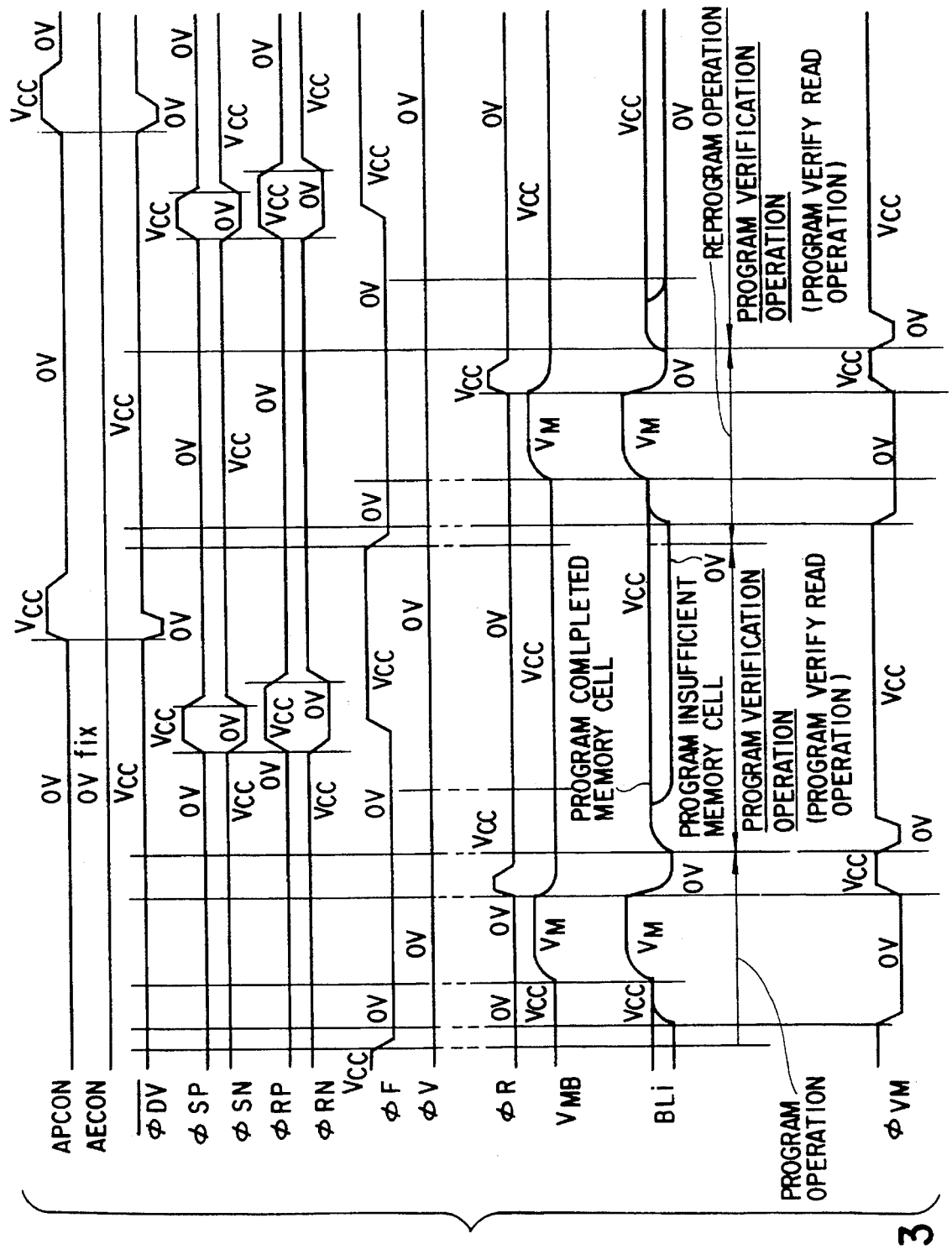
FIG. 43 is a timing chart showing data program/program-verification operation in the fifth embodiment.

The fifth embodiment of the invention using such NOR cell type EEPROM is described while referring to FIGS. 41 to 44. FIG. 41 shows the constitution of bit line control circuit and latch data detecting circuit in the fifth embodiment. FIG. 42 shows the connection of the bit line control circuit with other circuits in the fifth embodiment and FIG. 43 shows the timing of data erase/erase-verification operation in the fifth embodiment. In the fifth embodiment, the block diagram shown in FIG. 6 is directly applied.

As shown herein, in the NOR cell type EEPROM, program operations all memory cells selected for data reprogram are set in "1" data state (threshold voltage a 0 V) as shown in FIG. 43. By program verification operation, in all memory cells selected for data reprogram, it is judged if program is complete or not. That is, the latch data in the bit line control circuit is judged to be completely "1" or not after bit line potential sensing during program verification operation. At the time of judging, the latch data simultaneous detecting circuit as used in the first operation follows. After programming, erase operation is effected.

Figure 44:
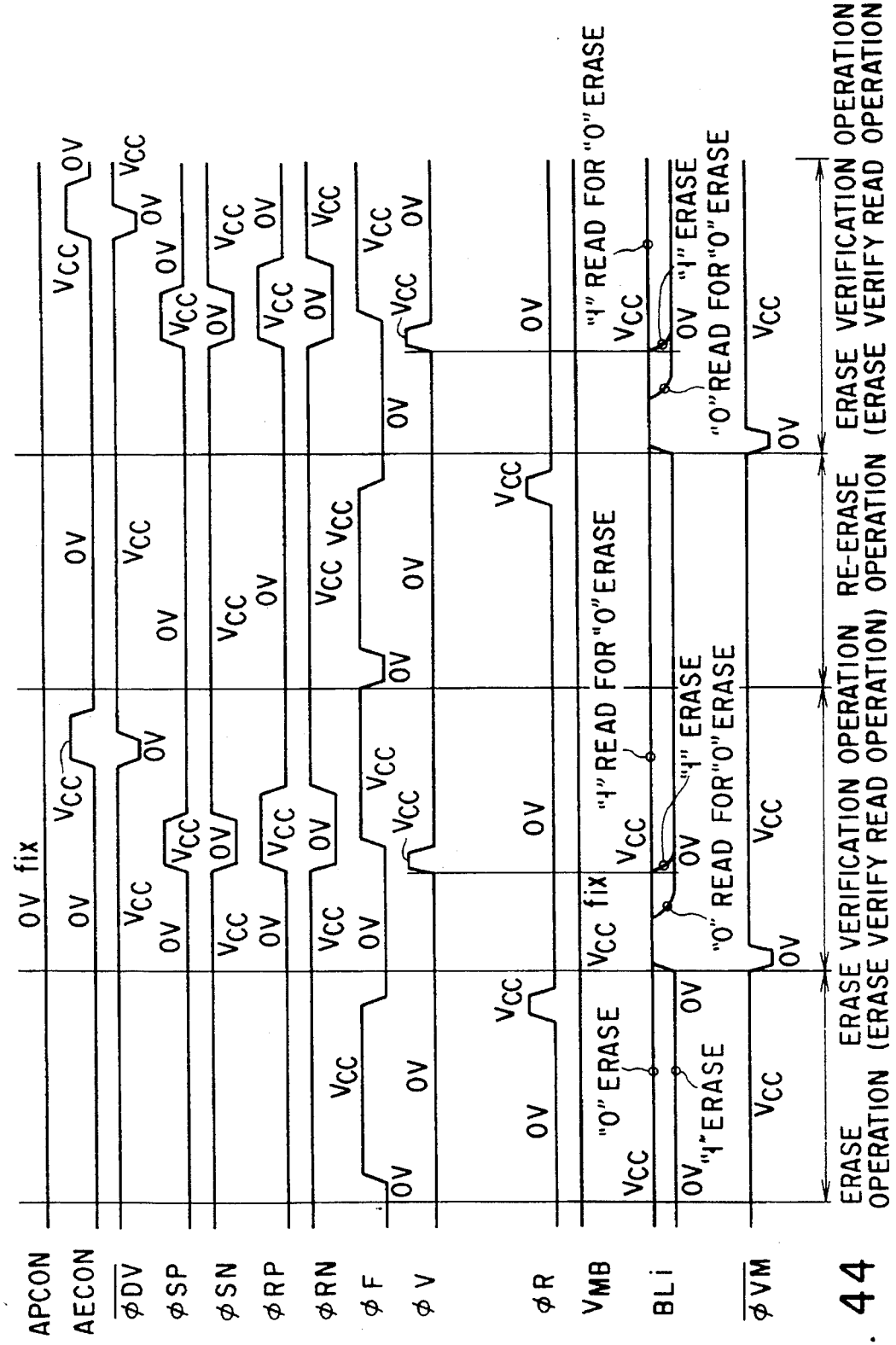
FIG. 44 is a timing chart showing data erase/erase-verification opera-Lion in the fifth embodiment.

In erase operation, the threshold voltage is selectively lowered in all memory cells selected for data reprogram as shown in FIG. 44. In this case, selection of memory cells is determined whether the threshold voltage is lowered ("0" erase) or not ("1" erase), depending on the latch data in the connected bit line control circuits in the memory cell through bit line (see signal BLi in FIG. 44).

Figure 45:
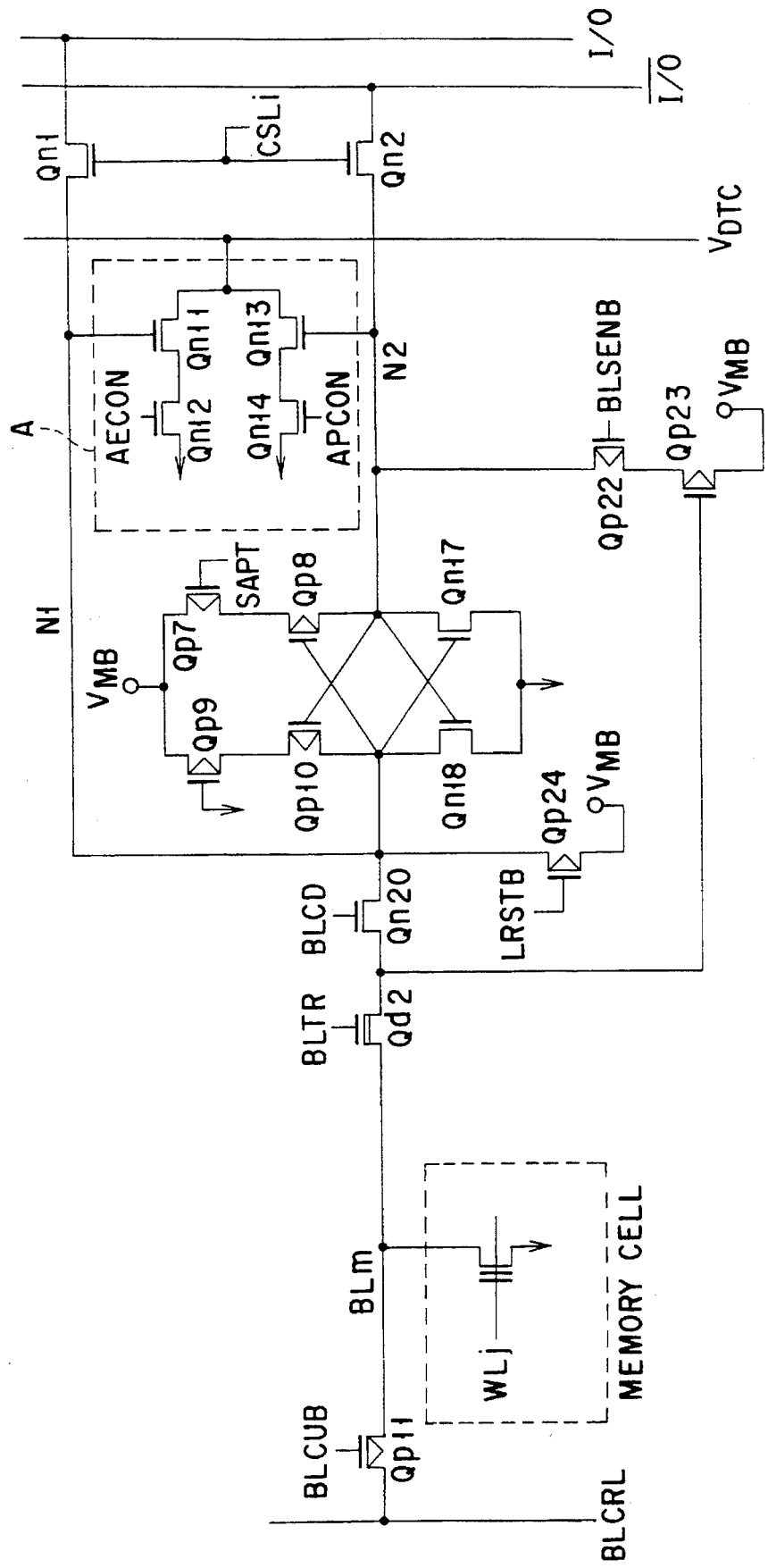
FIG. 45 is a diagram showing the constitution of bit line control circuit and latch data detecting circuit in the sixth embodiment.
Figure 47:
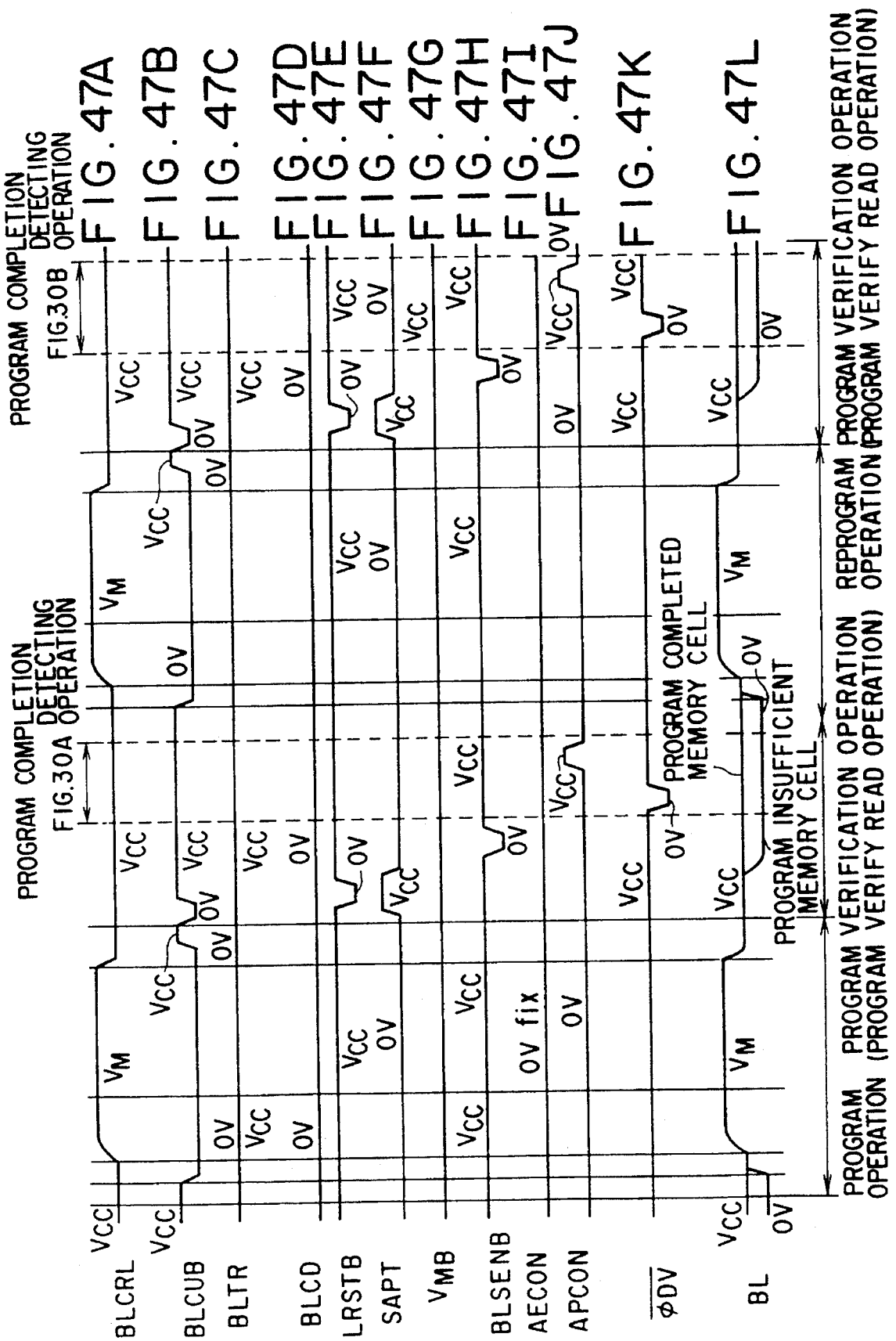
FIG. 47 is a timing chart showing data program/program-verification operation in the sixth embodiment.

The sixth embodiment of the invention using NOR cell type EEPROM is described while referring to FIGS. 45 to 48. FIG. 45 shows the constitution of bit line control circuit and latch data detecting circuit in the sixth embodiment, FIG. 46 shows the timing of data program/program-verification operation in the sixth embodiment, and FIG. 47 shows the timing of data erase/erase-verification operation in the sixth embodiment. In the sixth embodiment, too, the block diagram shown in FIG. 6 is directly applied.

Figure 48:
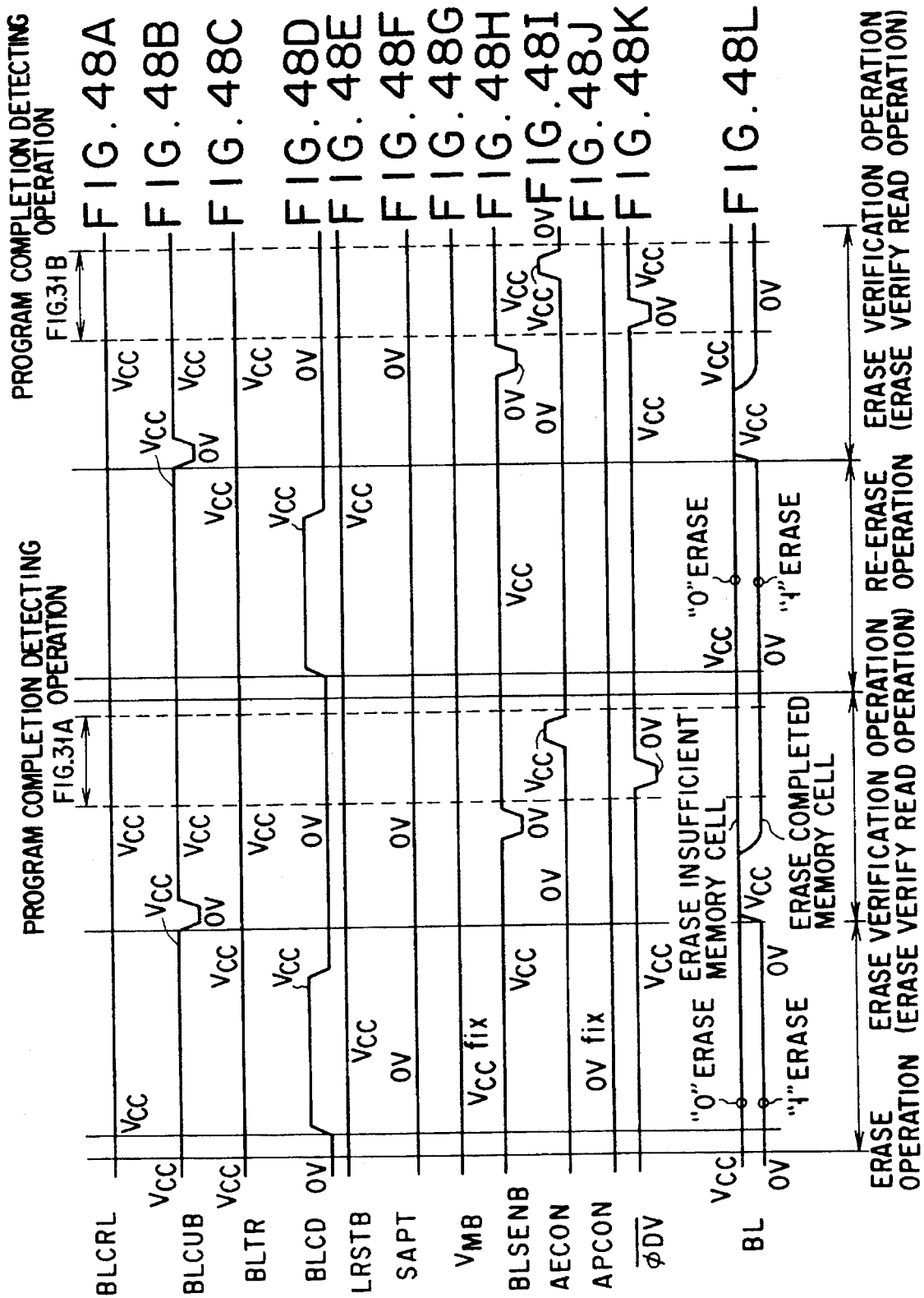
FIG. 48 is a timing chart showing data erase/erase-verification operation in the sixth embodiment.
Figure 49:
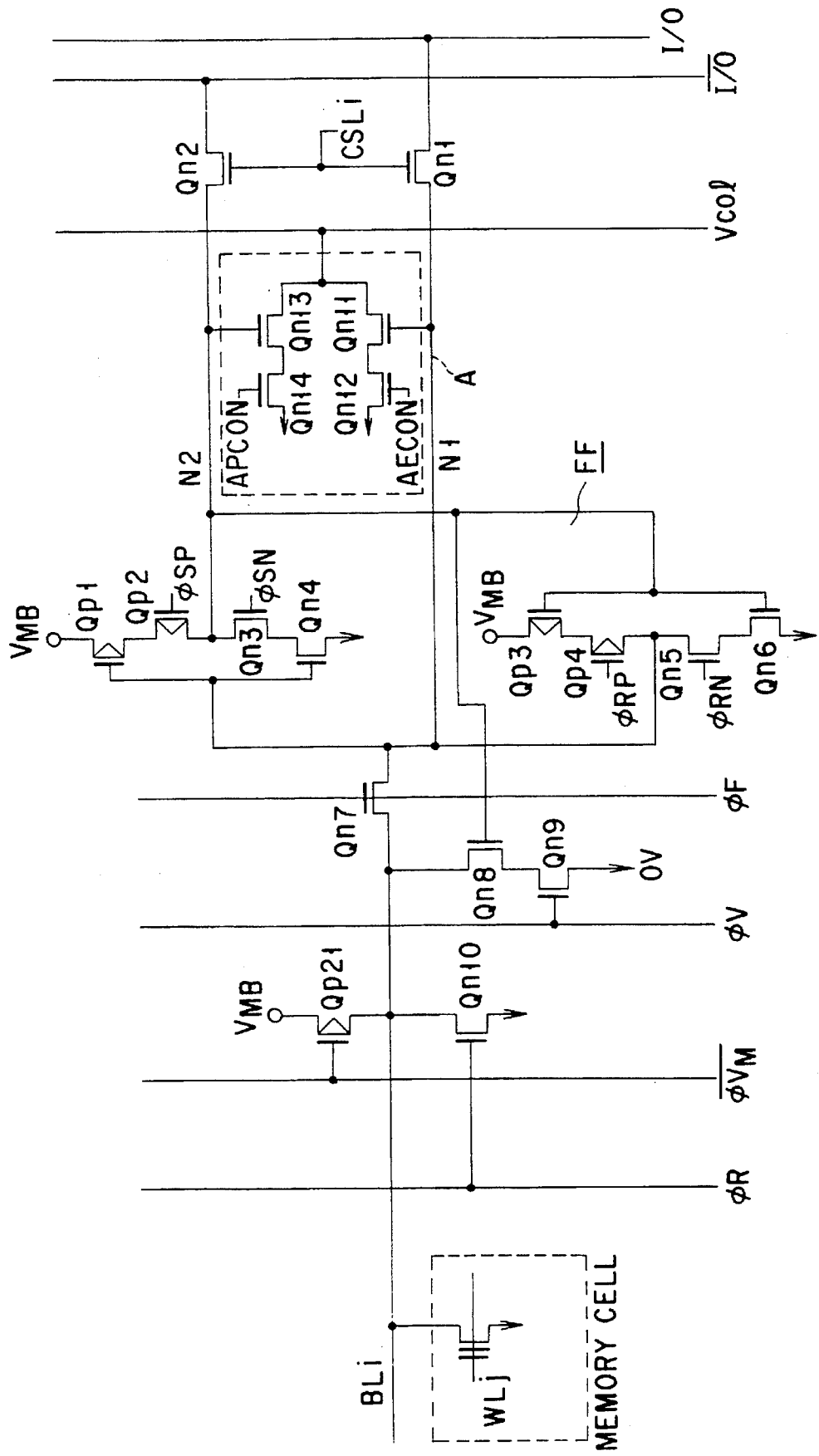
FIG. 49 is a diagram showing the constitution of bit line control circuit and latch data detecting circuit in a seventh embodiment.
Figure 50:
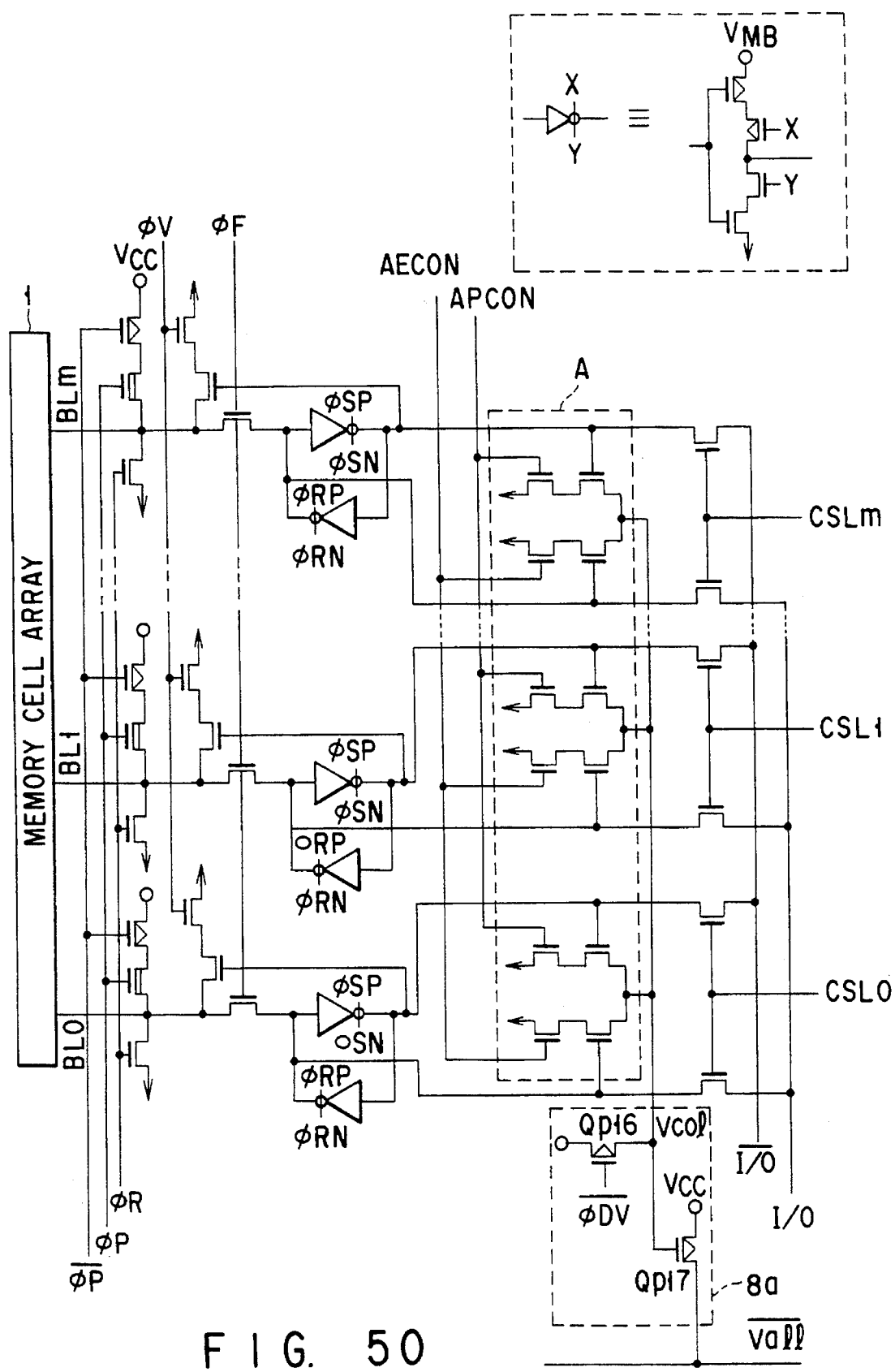
FIG. 50 is a diagram showing the connection relation of bit line control circuit, latch data detecting circuit, memory cell array and program/erase completion detecting circuit of a plurality of columns in the seventh embodiment.
Figure 51:
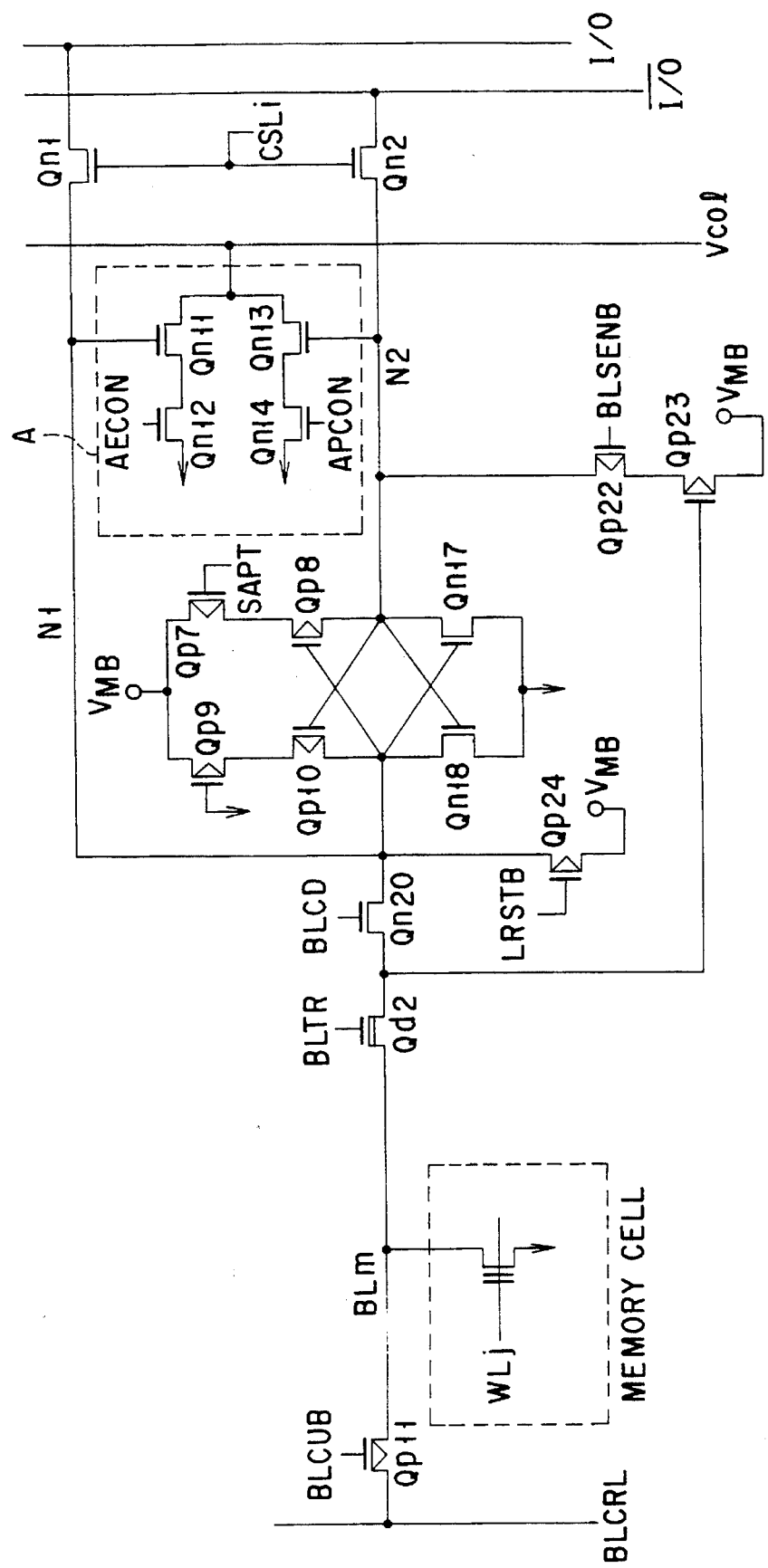
FIG. 51 is a diagram showing the constitution of bit line control circuit and latch data detecting circuit in an eighth embodiment.
Figure 52:
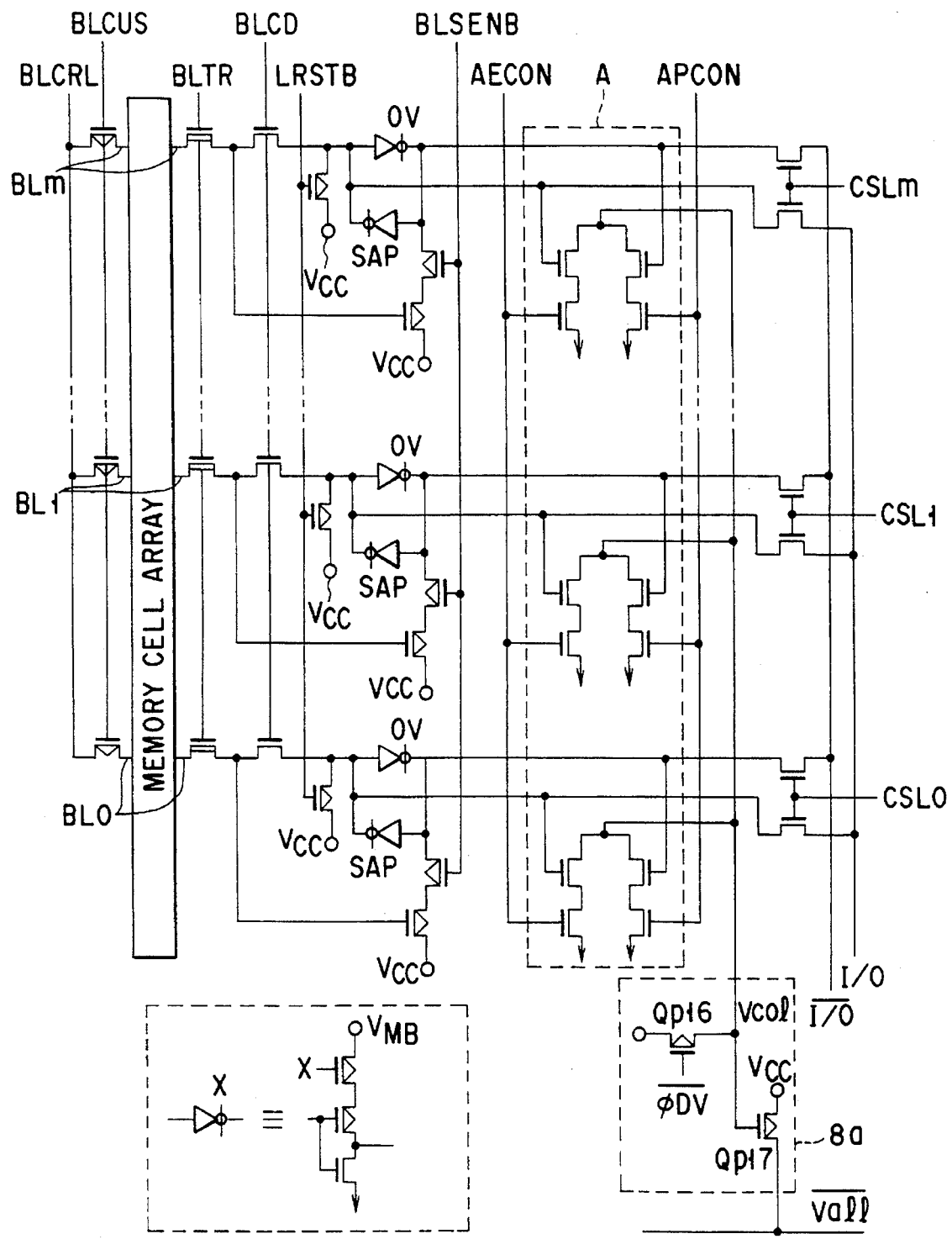
FIG. 52 is a diagram showing the connection relation of bit line control circuit, latch data detecting circuit, memory cell array and program/erase completion detecting circuit for a plurality of columns in the eighth embodiment.

As shown herein, in the NDR cell type EEPROM, in program operation, all memory cells selected for data reprogram are set in "1" data state (threshold voltage <0 V, as shown in FIG. 47. By program verification operation, in all memory complete or not. That is, the latch data in the bit line control circuit is judged to be completely "1" or not after bit line potential sensing during program verification operation. At the time of detecting the latch data, the latch data simultaneous detecting circuit as used in the second embodiment is employed. When programming is complete, erase operation follows. In erase operation, in all memory cells selected for data reprogram as shown in FIG. 48, the threshold voltage is selectively lowered ("0" erase) or not ("1" erase) (see signal BLi in FIG. 48).

Figure 53:
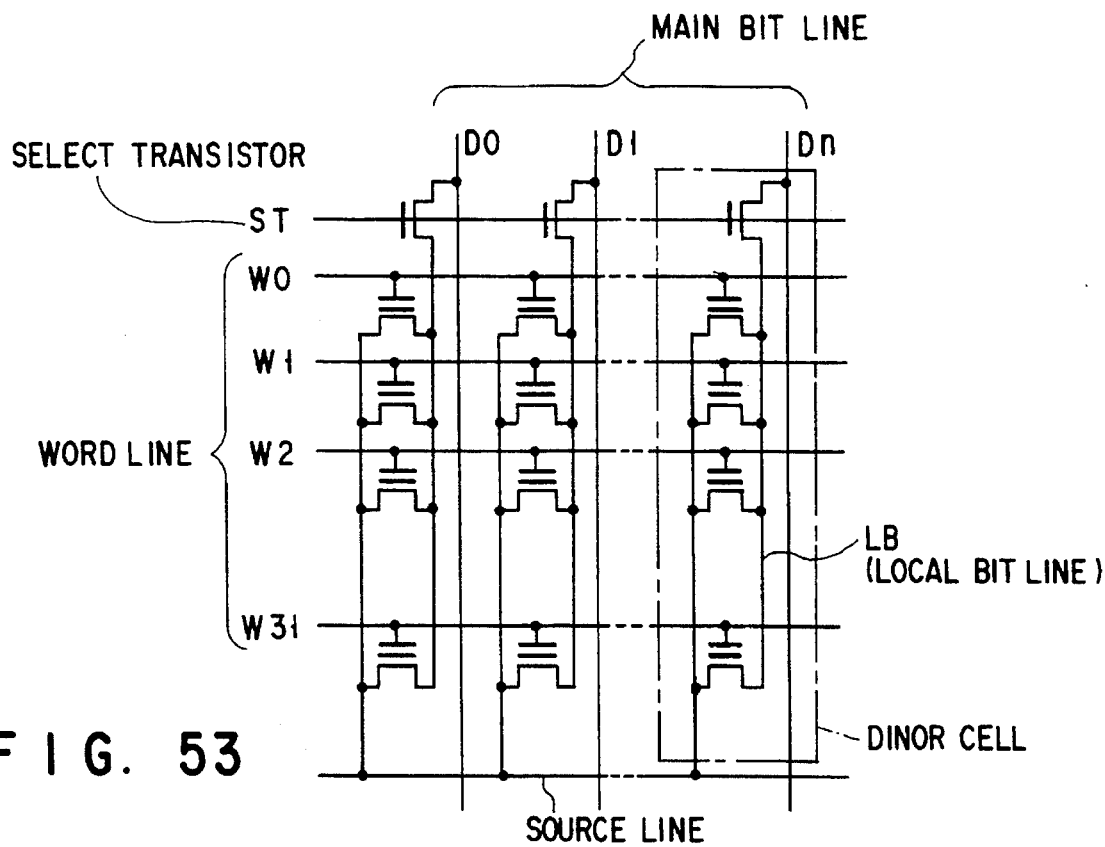
FIG. 53 is an equivalent circuit diagram of DINOR cell type memory cell array.
Figure 54:
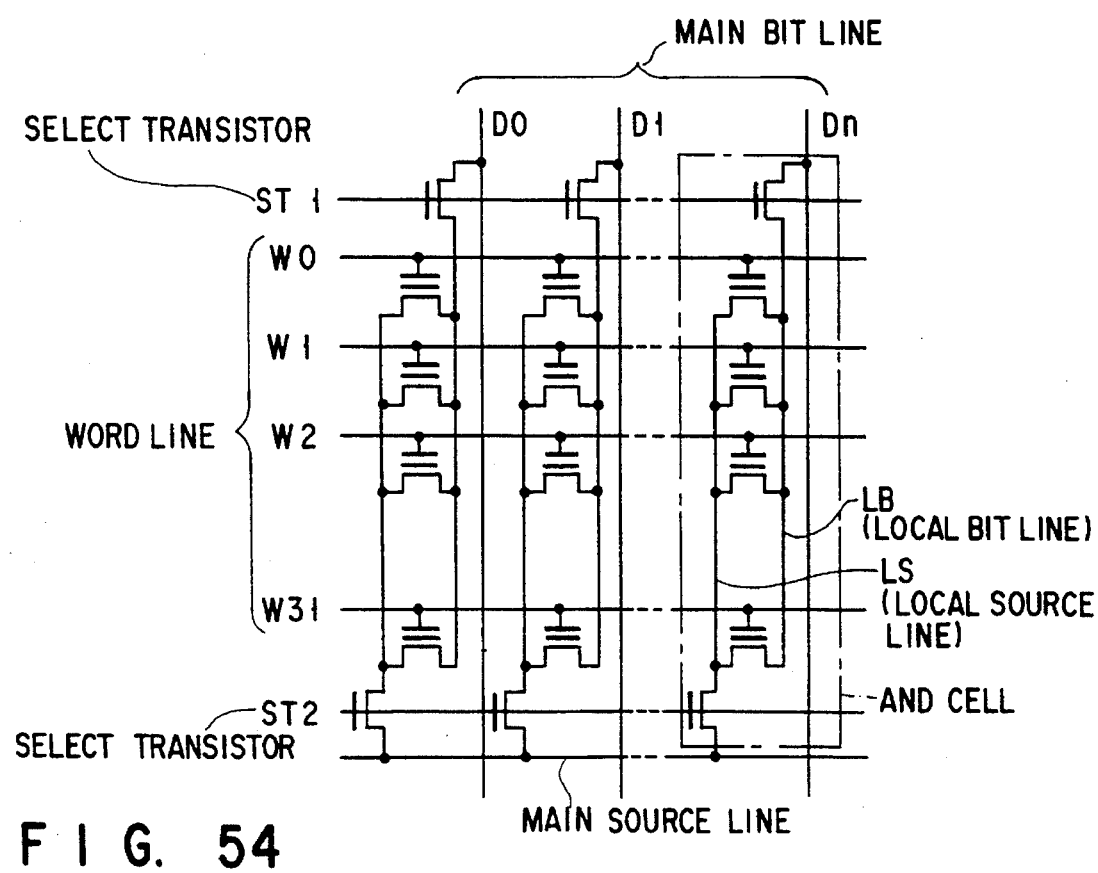
FIG. 54 is an equivalent circuit diagram of AND cell type memory cell array.

The fifth embodiment and sixth embodiments are embodiments corresponding to the block diagram in FIG. 6 and by replacing the VDC node in FIGS. 41 and 45 with Vcol, it is also possible to have the function corresponding to the block diagram in FIG. 21. Examples are shown in FIGS. 49 to 52. An application of the circuit in FIG. 41 corresponds to FIGS. 49, 50 (seventh embodiment), and an application of the circuit in FIG. 45, to FIGS. 50, 51 (eighth embodiment). By using the circuits in FIGS. 49 to 52, the block function in FIG. 21 is realized, and modification examples and timing in FIGS. 24 to 26, and FIGS. 28 to 33 may be realized. Thus, the invention may be also applied in the NOR cell type. Likewise, the invention may be also applied in the DINOR cell type and AND cell type. FIGS. 53 and 54 show equivalent circuit diagrams of DINOR cell type and AND cell type memory cell arrays.

In the preceding embodiments, the sense amplifier and read/program data latch circuit are explained to be identical circuit, but when the bit line potential sense circuit and read/program data latch circuit are composed of different circuits, it is also valid when detecting the content of the data latch circuit.

In the foregoing embodiments, simultaneous detecting method of data in the sense amplifier/data latch circuit is explained, but the invention is also valid in data simultaneous detecting operation in other plural circuits, for example, data simultaneous detection if the case of data stored in the row decoder. Besides, various modifications are possible without departing from the true spirit of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:

a semiconductor substrate;

a memory cell array having memory cells, each of which stores data, formed in a matrix on said semiconductor substrate, said memory cell array comprising, a plurality of first nodes, and one or more second nodes;

a plurality of data latch circuits, each of which is arranged at one end of at least one bit line connected to said memory cell array and configured to latch programming data in a plurality of data latch groups;

control means for judging whether all of the latched programming data included in each of said plurality of data latch groups are the same as a first data or not, and respectively changing a first potential of corresponding ones of the plurality of the first nodes according to a corresponding first judging result;

means for detecting potentials of said plurality of said first nodes, and for judging whether all data latched by said plurality of data latch circuits and included in said plurality of latch circuit groups are the same as said first data and for changing a second potential of one or more second nodes according to a corresponding second judging result; and means for detecting said second potential of said one or more second nodes and for outputting a corresponding third judging result indicative of whether or not all of said programming data latched by said plurality of data latch circuits are the same as said first data.

2. A device according to claim 1, wherein said memory cell array is constituted by forming one of a NAND cell, a NOR cell, an AND cell and a DINOR cell, which are constituted by connecting a plurality of memory cells, in matrix.

3. A device according to claim 1, wherein said data latch circuit is used as a sense amplifier for sensing data.

4. A device according to claim 1, wherein said data latch circuits are constituted by (n×k) elements, and further comprising judging means for judging whether all of (n×k) data latched by said (n×k) data latch circuits are the same data or not, said judging means judging whether the latched data latched by n data latch circuits are the same data or not, k output circuits for outputting a judging result judged by said judging means, and a plurality of detecting circuits for detecting whether the judging result indicating output signals output from said k output circuits is in a state of coincidence of data or not, and for outputting a detecting result, wherein nodes to be detected are divided into two sorts of nodes, which are k nodes to be detected connected to n data latch circuits, and nodes indicating detecting results of all data latch circuits by receiving the detecting results of said k nodes to be detected, and each of said nodes is detected by different said plurality of detecting circuits.

5. A device according to claim 1, wherein said control means has a circuit constituted by first and second transistors having the same polarity and connected in series, one of terminals of each of said plurality of data latch circuit, each of which has at least two terminals, is connected to one of gates of said first and said second transistors, and one end of said first and said second transistors connected in series are set in one of source potential and ground potential.

6. A device according to claim 1, further comprising:

verify control means for setting a unit program/erase time to a predetermined rage of said memory cell array, for reading data of said memory cells after programming/erasing memory cells, simultaneously, and for reprogramming/re-erasing memory cells of which program/erase are insufficient;

means for automatically setting reprogramming data of said data latch circuit for bit according to programming state by preforming a logic operation with respect to read data of memory cells with programming data latched by said data latch circuit at programming verify operation;

judging means for detecting one reprogramming data or re-erase data latched by said data latch circuit at one of program verify or erase verify operation, respectively, and for judging whether program/erase operation is completed or not; and judging means having a circuit constituted by first and second transistors having the same polarity and connected in series, one end of a node of said data latch circuit is connected to a gate of said first transistor, and one end of said first and said second transistors connected in series: are set in one of source potential and ground potential.

7. A device according to claim 1, further comprising:

verify control means for setting a unit program/erase time to a predetermined rage of said memory cell array, for reading data of said memory cells after programming/erasing memory cells, simultaneously, and for reprogramming/re-erasing memory cells of which program/erase are insufficient;

means for automatically setting reprogramming data of said data latch circuit for bit according to programming state by preforming a logic operation with respect to read data of memory cells and programming data latched by said data latch circuit at programming verify operation;

judging means for detecting one reprogramming data or re-erase data latched by said data latch circuits at one of program verify or erase verify operation, respectively, and for judging whether program/erase operation is completed or not;

means for judging whether memory cells, of which program/erase are insufficient, in a memory cell group including said plurality of memory cells exist or not, and for controlling to change a potential of a plurality of first nodes according to the judging result, where there is one first node corresponding to each memory cell group; and means for detecting potentials of a plurality of said first nodes corresponding to said plurality of memory cell groups, judging whether memory cells, of which program/erase are insufficient, in a memory cell group including said plurality of memory cells exist or not and for controlling to change a potential of a plurality of second nodes according to the judging result.

8. A device according to claim 1, wherein said plurality of data latch circuit are (n×k) data latch circuits which are arranged at one end of said plurality of bit lines, and further comprising judging means for judging whether all of (n×k) data latched by said (n×k) data latch circuits are the same data as said first data or not, said judging means judging whether the latched data latched by n data latch circuits are the same data as said first data or not;

k output circuits for outputting a judging result judged by said judging means; and a plurality of detecting circuits for detecting whether the judging result indicating output signals output from said k output circuits is in a state of coincidence of data and for outputting a detecting result, wherein nodes to be detected are divided into two sorts of nodes, which are k nodes to be detected connected to n data latch circuits, and nodes indicating detecting results of all data latch circuits by receiving the detecting results of said k nodes to be detected, and each of said k nodes is detected by different said plurality of detecting circuits.

* * * * *